US009679978B2

(12) United States Patent
Kim et al.

(10) Patent No.: US 9,679,978 B2
(45) Date of Patent: Jun. 13, 2017

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Ki Hwan Kim, Seoul (KR); Jung Gun You, Ansan-si (KR); Gi Gwan Park, Hwaseong-si (KR); Dong Suk Shin, Yongin-si (KR); Jin Wook Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/272,456

(22) Filed: Sep. 22, 2016

(65) Prior Publication Data

US 2017/0092728 A1    Mar. 30, 2017

Related U.S. Application Data

(60) Provisional application No. 62/232,188, filed on Sep. 24, 2015.

(30) Foreign Application Priority Data

| Nov. 9, 2015 | (KR) | 10-2015-0156857 |
| Jan. 22, 2016 | (KR) | 10-2016-0008273 |
| Jan. 22, 2016 | (KR) | 10-2016-0008279 |
| Feb. 2, 2016 | (KR) | 10-2016-0012955 |

(Continued)

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)
(Continued)

(52) U.S. Cl.
CPC .... *H01L 29/41791* (2013.01); *H01L 27/0886* (2013.01); *H01L 29/456* (2013.01); *H01L 29/785* (2013.01); *H01L 21/823418* (2013.01); *H01L 21/823431* (2013.01); *H01L 29/66545* (2013.01); *H01L 29/66795* (2013.01)

(58) Field of Classification Search
CPC ............. H01L 29/41791; H01L 29/785; H01L 29/456; H01L 27/0886
USPC ....................................................... 257/401
See application file for complete search history.

(56) References Cited

U.S. PATENT DOCUMENTS 8,278,179 B2   10/2012  Lin et al.
8,445,940 B2    5/2013  Tsai et al.
(Continued)

*Primary Examiner* — David S Blum
(74) *Attorney, Agent, or Firm* — Volentine & Whitt, PLLC

(57) ABSTRACT

A semiconductor device includes a substrate having first and second regions, a first fin-type pattern and a second fin-type pattern formed in the first region and extending in a first direction, and a third fin-type pattern and a fourth fin-type pattern formed in the second region and extending in a third direction. A first source/drain is formed on the first fin-type pattern and a second source/drain region is formed on the second fin-type pattern. Each of first and second source/drains have a cross section defining a same convex polygonal shape. A third source/drain is formed on the third fin-type pattern and a fourth source/drain region is formed on the fourth fin-type pattern. Cross-sections of the third and fourth source/drains define different convex polygonal shapes from one another.

20 Claims, 54 Drawing Sheets

(30) Foreign Application Priority Data

Mar. 9, 2016 (KR) .................. 10-2016-0028204
Mar. 9, 2016 (KR) .................. 10-2016-0028318

(51) Int. Cl.

| | |
|---|---|
| H01L 29/417 | (2006.01) |
| H01L 27/088 | (2006.01) |
| H01L 29/78 | (2006.01) |
| H01L 29/45 | (2006.01) |
| H01L 29/66 | (2006.01) |
| H01L 21/8234 | (2006.01) |

(56) References Cited

U.S. PATENT DOCUMENTS

| | | | |
|---|---|---|---|
| 8,574,995 | B2 | 11/2013 | Jeng |
| 8,603,893 | B1 | 12/2013 | Wei et al. |
| 8,633,070 | B2 | 1/2014 | Fung et al. |
| 8,679,925 | B2 | 3/2014 | Wang |
| 8,748,989 | B2 | 6/2014 | Lin et al. |
| 8,765,546 | B1 | 7/2014 | Hung et al. |
| 8,809,150 | B2 | 8/2014 | Zhang et al. |
| 8,809,990 | B2 | 8/2014 | Maeda et al. |
| 8,878,309 | B1 | 11/2014 | Hong et al. |
| 9,012,281 | B2 | 4/2015 | Suk et al. |
| 9,012,999 | B2 | 4/2015 | Liu et al. |
| 9,034,741 | B2 | 5/2015 | Adam et al. |
| 9,041,115 | B2 | 5/2015 | Liaw |
| 9,142,643 | B2 | 9/2015 | Cheng et al. |
| 9,190,407 | B2 | 11/2015 | Kwon et al. |
| 9,190,471 | B2 | 11/2015 | Adam et al. |
| 9,209,179 | B2 | 12/2015 | Lee et al. |
| 2009/0315120 | A1 | 12/2009 | Shifren et al. |
| 2012/0273896 | A1 | 11/2012 | Usujima et al. |
| 2013/0228862 | A1 | 9/2013 | Lee et al. |
| 2013/0285143 | A1 | 10/2013 | Oh et al. |
| 2014/0284726 | A1 | 9/2014 | Lee et al. |
| 2015/0021695 | A1 | 1/2015 | Hu et al. |
| 2015/0035061 | A1 | 2/2015 | Yoon et al. |
| 2015/0091059 | A1 | 4/2015 | Hung et al. |
| 2015/0102414 | A1 | 4/2015 | Yu et al. |
| 2015/0115373 | A1 | 4/2015 | Yu et al. |
| 2015/0155281 | A1 | 6/2015 | Chuang et al. |
| 2015/0171085 | A1 | 6/2015 | Fumitake et al. |
| 2015/0179768 | A1 | 6/2015 | Chen et al. |
| 2015/0187827 | A1 | 7/2015 | Tu et al. |
| 2015/0187943 | A1 | 7/2015 | Lee et al. |
| 2015/0194335 | A1 | 7/2015 | Tsai et al. |
| 2015/0194422 | A1 | 7/2015 | Liu et al. |
| 2015/0194485 | A1 | 7/2015 | Dhanyakumar et al. |
| 2015/0200267 | A1 | 7/2015 | Ching et al. |
| 2015/0200300 | A1 | 7/2015 | Ching et al. |
| 2015/0214223 | A1 | 7/2015 | Tsai et al. |
| 2015/0214341 | A1 | 7/2015 | Shin et al. |
| 2015/0214369 | A1 | 7/2015 | Fronheiser et al. |
| 2015/0221654 | A1 | 8/2015 | Kim et al. |
| 2015/0318212 | A1 | 11/2015 | Tsai et al. |
| 2015/0318282 | A1 | 11/2015 | Rodder et al. |
| 2015/0380488 | A1 | 12/2015 | Chou et al. |
| 2015/0380515 | A1 | 12/2015 | Peng et al. |
| 2016/0013104 | A1 | 1/2016 | Hung et al. |
| 2016/0111536 | A1* | 4/2016 | Chen .................. H01L 29/7848 257/401 |

\* cited by examiner

FIG. 62
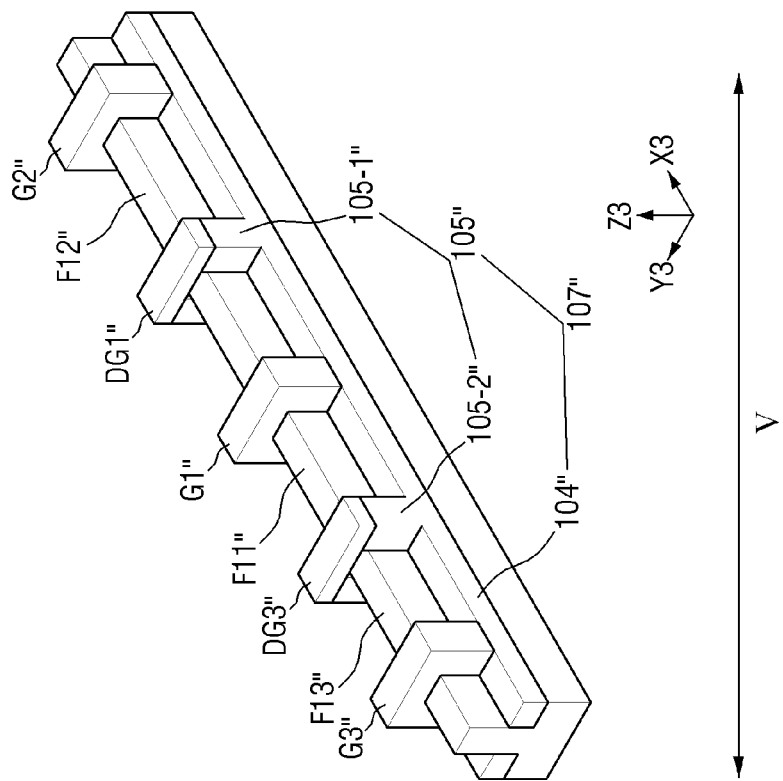
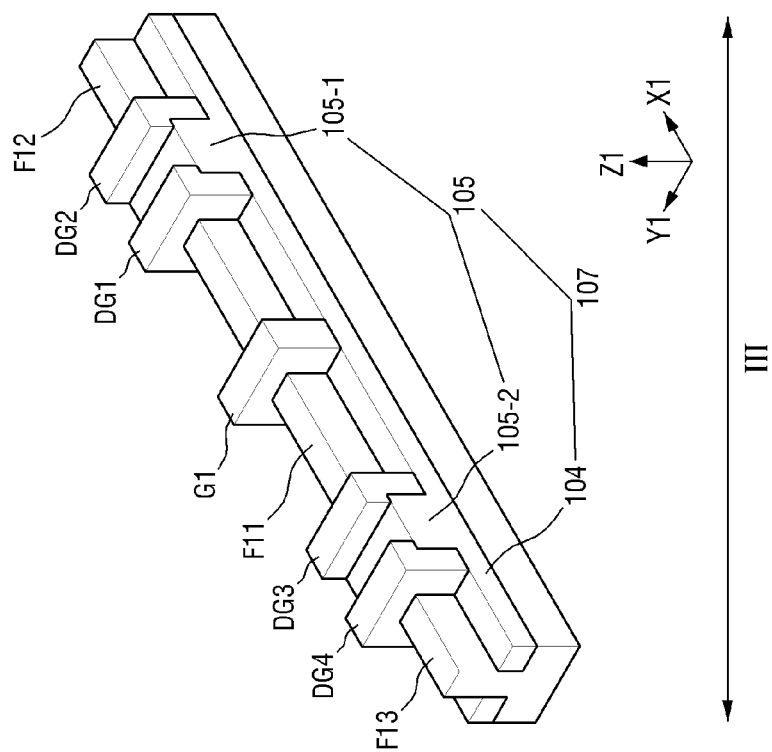

SEMICONDUCTOR DEVICE AND METHOD FOR FABRICATING THE SAME

CROSS-REFERENCE TO RELATED APPLICATION

A claim of priority under 35 U.S.C. §119 is made to U.S. Provisional Patent Application No. 62/232,188 filed Sep. 24, 2015, in the U.S. Patent and Trademark Office, Korean Patent Application No. 10-2015-0156857 filed Nov. 9, 2015, in the Korean Intellectual Property Office, Korean Patent Application No. 10-2015-0012955 filed Feb. 2, 2016, in the Korean Intellectual Property Office, Korean Patent Application No. 10-2016-0008273 filed Jan. 22, 2016, in the Korean Intellectual Property Office, Korean Patent Application No. 10-2016-0028318 filed Mar. 9, 2016, in the Korean Intellectual Property Office, Korean Patent Application No. 10-2016-0008279 filed Jan. 22, 2016, in the Korean Intellectual Property Office, and Korean Patent Application No. 10-2016-0028204 filed Mar. 9, 2016, in the Korean Intellectual Property Office, the disclosures of which are incorporated herein by reference in their entireties.

BACKGROUND

The present disclosure relates to semiconductor devices and to methods of fabricating semiconductor devices.

A multigate transistor has been suggested as a scaling technology for increasing the density of semiconductor devices. Generally, a multigate transistor is characterized by a silicon body in the shape of a fin or nanowire being formed on a substrate, and a gate then being formed on a surface of the silicon body.

The multigate transistor allows for relatively easing scaling, as it employs a three-dimensional channel. Further, current control capability can be enhanced without with need for increased gate length of the multigate transistor. Furthermore, it is possible to effectively suppress a short channel effect (SCE) in which the electric potential of the channel region is influenced by the drain voltage.

SUMMARY

According to an aspect of the present inventive concept, a semiconductor device is provided which includes a substrate having first and second regions, a first fin-type pattern and a second fin-type pattern formed in the first region, protruding from the substrate, and extending in a first direction, a first source/drain on the first fin-type pattern, the first source/drain having a cross section in a second direction intersecting the first direction that defines a first convex polygonal shape, and a second source/drain on the second fin-type pattern, the second source/drain having a cross section in the second direction that defines a second convex polygonal shape that is the same as the first convex polygonal shape. The semiconductor device further includes a third fin-type pattern and a fourth fin-type pattern formed in the second region, protruding from the substrate, and extending in a third direction, a third source/drain on the third fin-type pattern, the third source/drain having a cross section in a fourth direction intersecting the third direction that defines a third convex polygonal shape, and a fourth source/drain on the fourth fin-type pattern, the fourth source/drain having a cross section in the fourth direction that defines a fourth convex polygonal shape that is different than the third convex polygonal shape.

According to another aspect of the present inventive concept, a semiconductor device is provided which includes a substrate including first and second regions, a first fin-type pattern and a second fin-type pattern in the first region, each protruding from the substrate and extending in a first direction, and a third fin-type pattern and a fourth fin-type pattern in the second region, each protruding from the substrate and extending in a second direction. The semiconductor device further includes a first gate electrode on the first and second fin-type patterns, the first gate electrode extending in a third direction intersecting the first direction, a second gate electrode on the third and the fourth fin-type patterns, the second gate electrode extending in a fourth direction intersecting the second direction, first source/drains formed on both sides of the first gate electrode and spaced apart from each other by a first distance, second source/drains formed on both sides of the second gate electrode and spaced apart from each other by the first distance, third source/drains formed on both sides of the third gate electrode and spaced apart from each other by a second distance that is different from the first distance, and fourth source/drains formed on both sides of the fourth gate electrode and spaced apart from each other by the second distance. Cross sections in the second direction of the first and second source/drains define regular shapes, and cross sections in the fourth direction of the third and fourth source/drains define irregular shapes.

According to still another aspect of the present inventive concept, a semiconductor device is provided which includes a first fin-type pattern protruding from a substrate, and comprising a first short side and a second short side in opposite directions, a first gate electrode on the first fin-type pattern, the first gate electrode intersecting the first fin-type pattern, and including first and second side surfaces that are opposite each other, a first recess formed in the first side surface of the first gate electrode, and located adjacent to the first short side of the first fin-type pattern, a second recess formed in the second side surface of the first gate electrode, located adjacent to the second short side of the first fin-type pattern, and having a different shape than a shape of the first recess, a first source/drain filling the first recess, and a second source/drain filling the second recess. The first fin-type pattern, and the upper surfaces of the first and second source/drains all have the same heights as each other or different heights from each other.

BRIEF DESCRIPTION OF THE DRAWINGS

The above and other objects, features and advantages of the inventive concepts will become readily apparent to those of ordinary skill in the art from the detailed description that follows, with reference to the accompanying drawings, in which:

FIG. 62 is a perspective view for reference in describing a semiconductor device according to one or more exemplary embodiments;

DETAILED DESCRIPTION

Hereinbelow, a semiconductor device according to an exemplary embodiment will be explained with reference to FIGS. 1 to 6.

Figure 1:
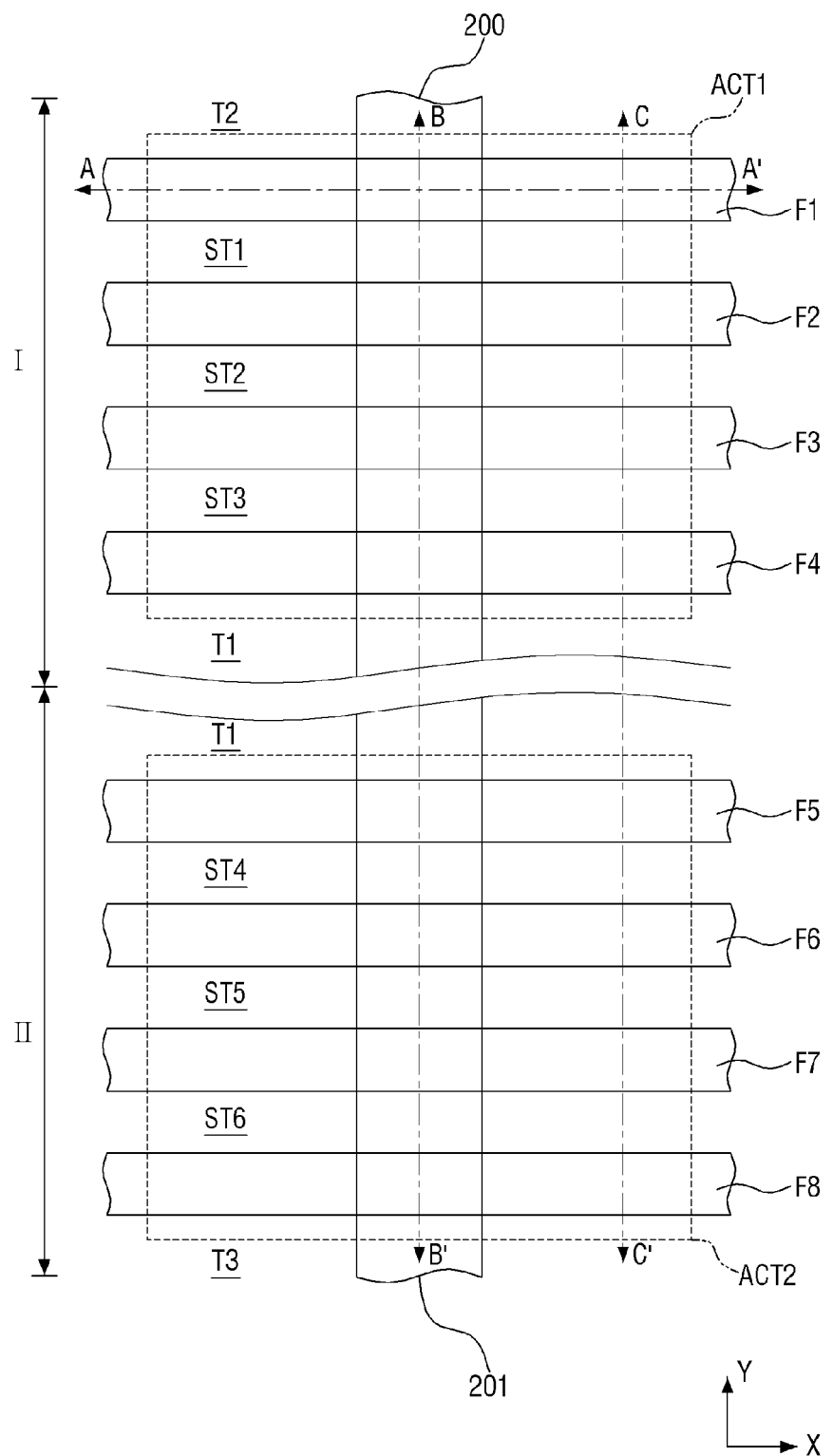
FIG. 1 is a layout diagram for reference in describing a semiconductor device according to one or more exemplary embodiments.
Figure 2:
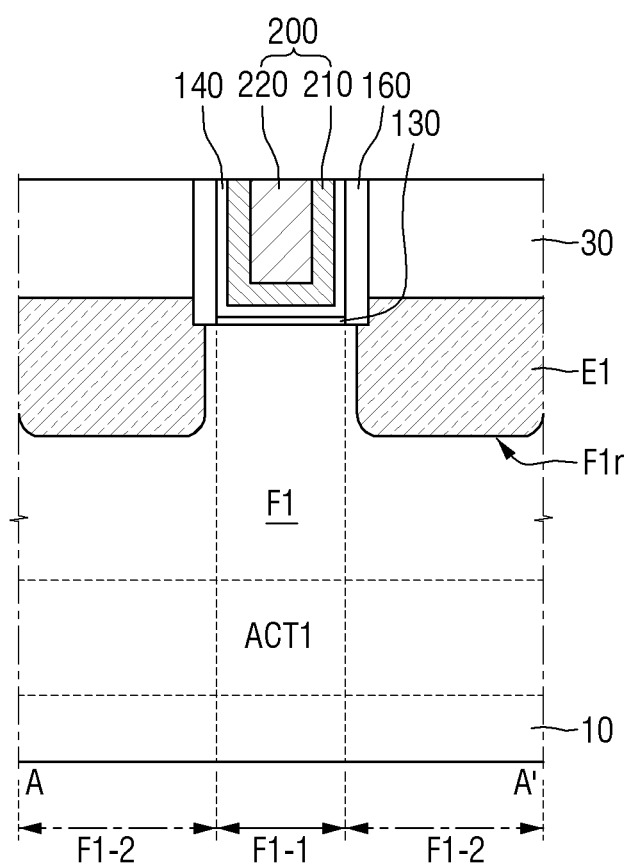
FIG. 2 is a cross sectional view taken on line A-A' of FIG. 1.
Figure 3:
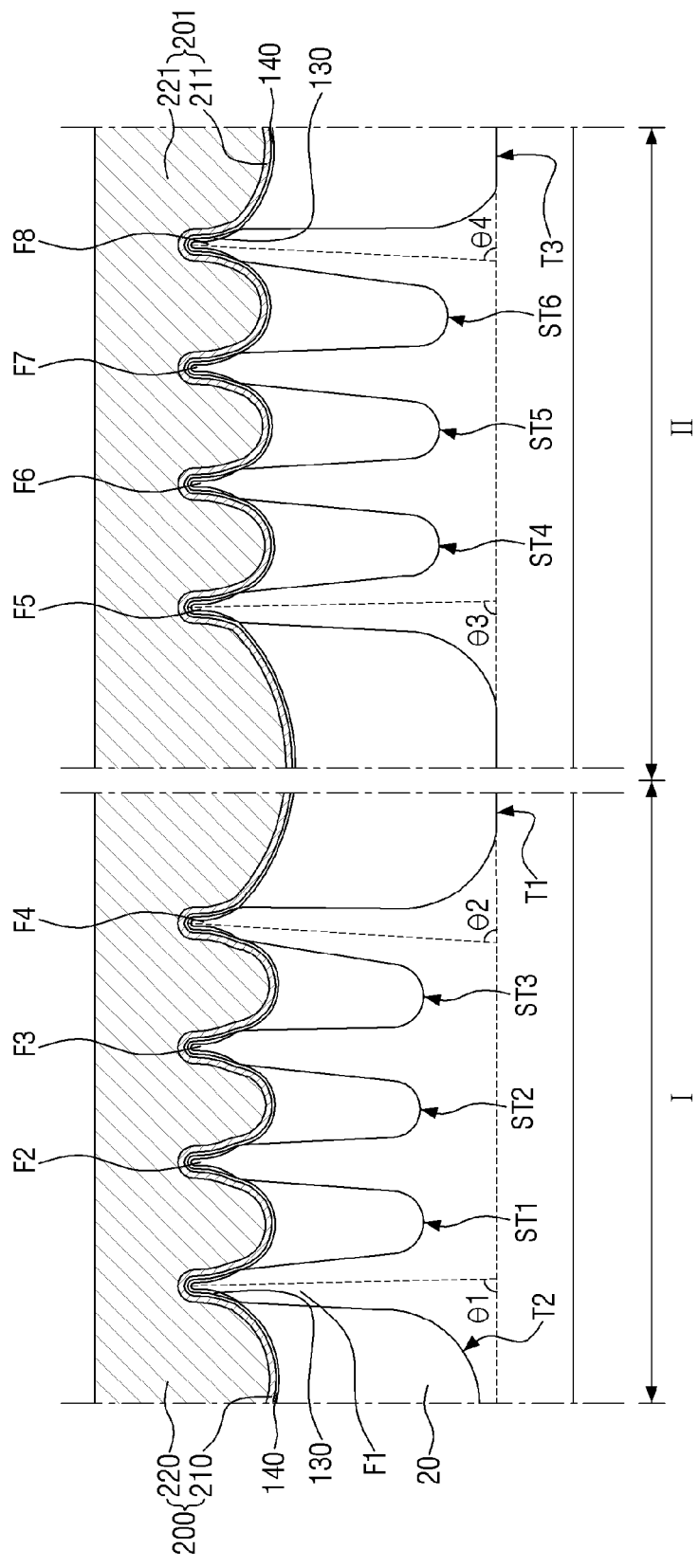
FIG. 3 is a cross sectional view taken on line B-B' of FIG. 1.
Figure 4:
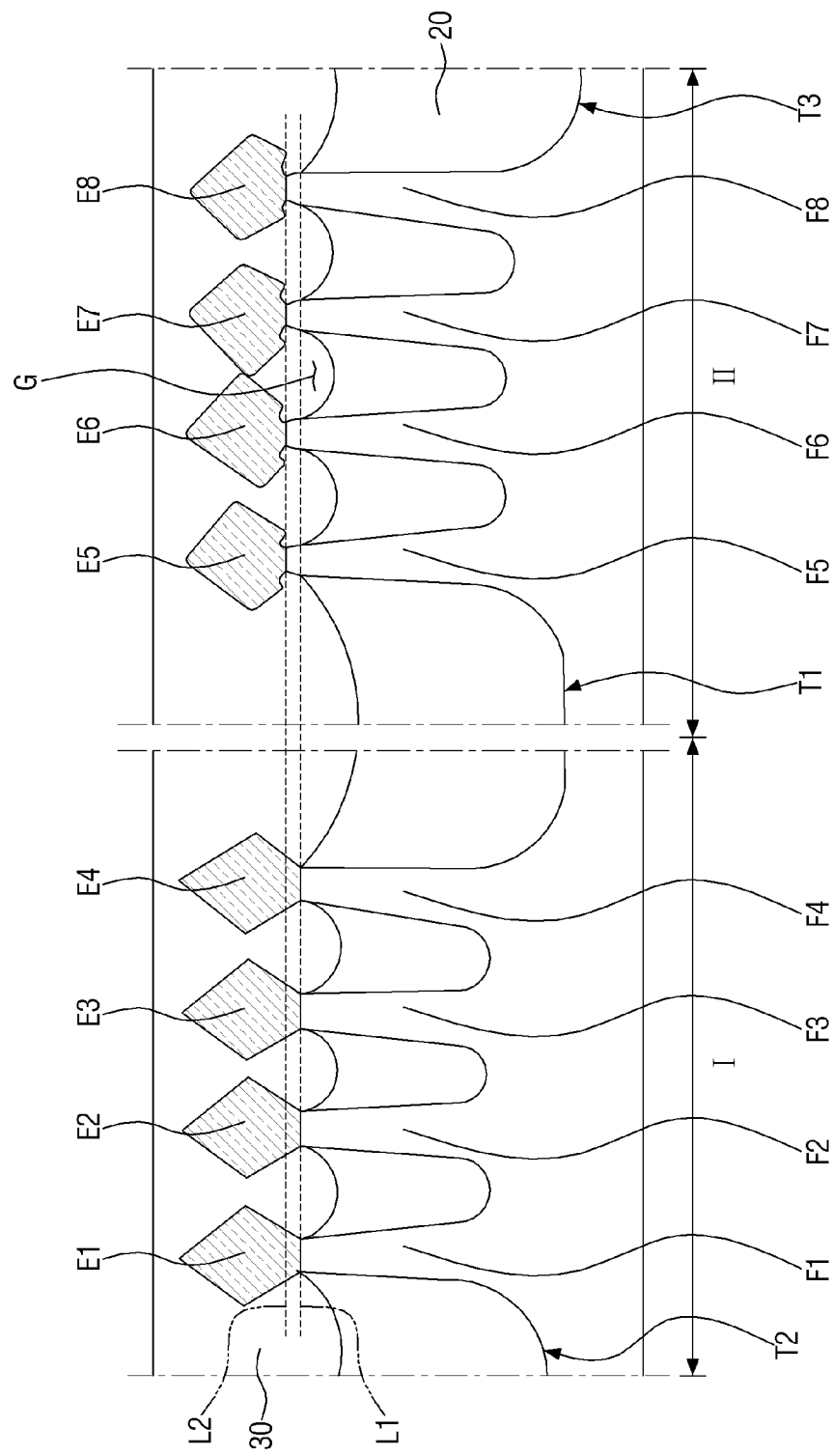
FIG. 4 is a cross sectional view taken on line C-C' of FIG. 1.
Figure 5:
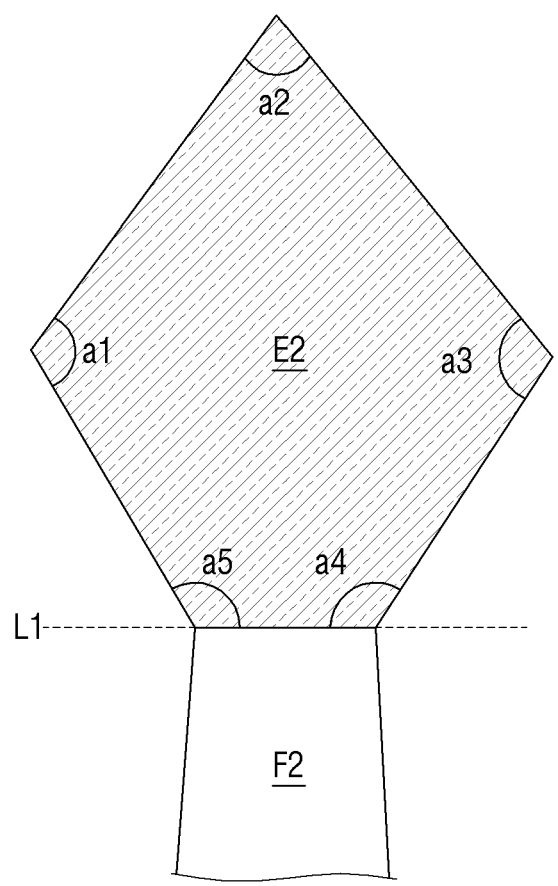
FIG. 5 is an enlarged view of a second fin-type pattern and a second epitaxial pattern in FIG. 4.
Figure 6:
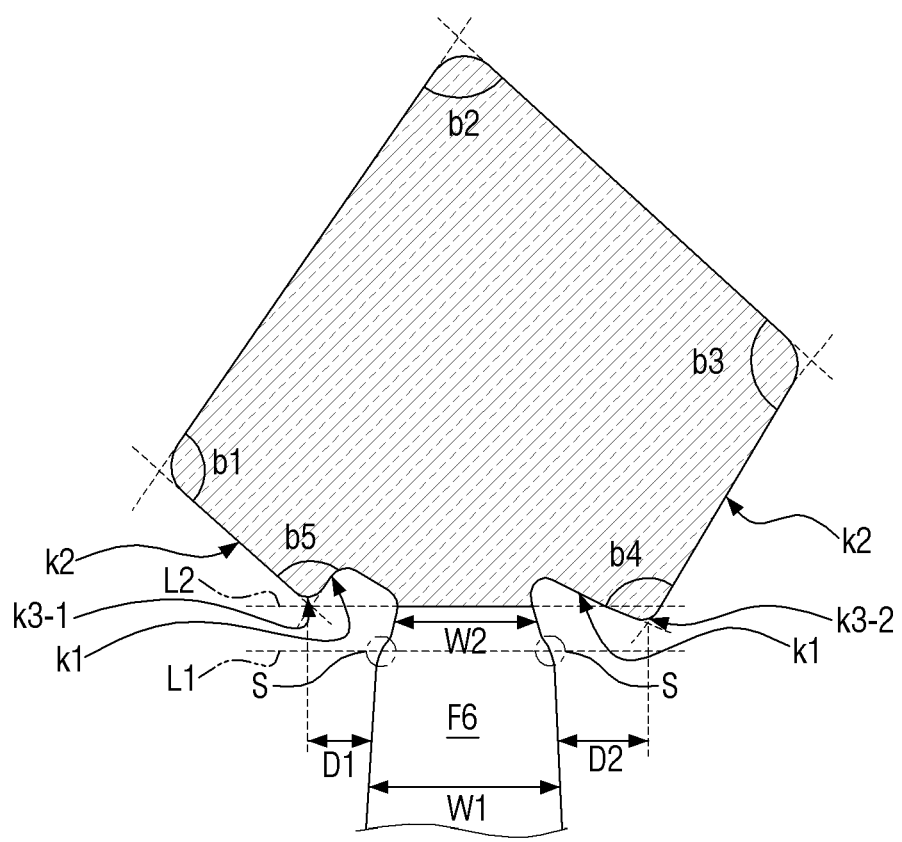
FIG. 6 is an enlarged view of a sixth fin-type pattern and a sixth epitaxial pattern in FIG. 4.

FIG. 1 is a layout diagram for reference in describing a semiconductor device according to one or more exemplary embodiments. FIG. 2 is a cross sectional view taken on line A-A' of FIG. 1, FIG. 3 is a cross sectional view taken on line B-B' of FIG. 1, and FIG. 4 is a cross sectional view taken on line C-C' of FIG. 1. FIG. 5 is an enlarged view of a second fin-type pattern and a second epitaxial pattern in FIG. 4, and FIG. 6 is an enlarged view of a sixth fin-type pattern and a sixth epitaxial pattern in FIG. 4. However, for convenience of explanation, it is noted that FIGS. 5 and 6 omit illustrations of a first interlayer insulating film 20 and a second interlayer insulating film 30.

Referring to FIGS. 1 to 6, a semiconductor device according to one or more exemplary embodiments may include a substrate 10, first to eighth fin-type patterns F1-F8, first to sixth shallow trenches ST1-ST6, a first interlayer insulating film 20, a second interlayer insulating film 30, a first gate electrode 200, a second gate electrode 201, gate insulating films 130, 140, a gate spacer 160, and first to eighth epitaxial patterns E1-E8.

As examples, the substrate 10 may be a bulk silicon substrate or a silicon-on-insulator (SOI) substrate. Alternatively, the substrate 10 may be a silicon substrate, or may include other materials such as silicon germanium, indium antimonide, lead telluride compound, indium arsenide, indium phosphide, gallium arsenide, or gallium antimonide. Alternatively, the substrate 10 may be a base substrate having an epitaxial layer formed thereon.

For purposes of explanation, the substrate 10 includes a first region I and a second region II. The first region I and the second region II may be the regions adjacent to each other, or spaced apart from each other. Accordingly, the first to fourth fin-type patterns F1-F4 in the first region I and the fifth to eighth fin-type patterns F5-F8 in the second region II may extend in different directions from one another. However, for convenience of explanation, the case in which the first to fourth fin-type patterns F1-F4 in the first region I and the fifth to eighth fin-type patterns F5-F8 in the second region II extend in the same directions as one another will be explained.

Different conductivity types of transistors may be formed in the first region I and the second region II. For example, the first region I may be a region where a PMOS is formed, and the second region II may be a region where an NMOS is formed, although exemplary embodiments are not limited thereto.

The first region I and the second region II may be defined by a first trench T1, a second trench T2 and a third trench T3. The first trench T1 may have first and second side surfaces opposite of each other. The first trench T1 may be in contact with the first region I at the first side surface, and may be in contact with the second region II at the second side surface.

The first region I may include a first active region ACT1, and the second region II may include a second active region ACT2. The first active region ACT1 and the second active region ACT2 may be adjacent to each other, or spaced apart from each other.

The second trench T2 may be in contact with the first region I. That is, the first region I may be positioned between the first trench T1 and the second trench T2. The third trench T3 may be in contact with the second region II. That is, the second region II may be positioned between the first trench T1 and the third trench T3.

Referring to FIG. 1, the first to eighth fin-type patterns F1-F8 may extend longitudinally in a first direction X. As illustrated in FIG. 1, the first to eighth fin-type patterns F1-F8 may have a rectangular shape, although exemplary embodiments are not limited thereto. If the first to eighth fin-type patterns F1-F8 are in rectangular shape, the first to eighth fin-type patterns F1-F8 may include long sides extending in the first direction X and short sides extending in a second direction Y perpendicular to the first direction X. In this case, the eighth fin-type patterns F1-F8 may be said to extend lengthwise in the first direction X and widthwise in the second direction Y.

The first to eighth fin-type patterns F1-F8 may be spaced apart from one another in the second direction Y. In this case, the first to eighth fin-type patterns F1-F8 may be spaced apart from one another in the second direction Y.

The first to fourth fin-type patterns F1-F4 may be defined by the first to third shallow trenches ST1-ST3. Further, the fifth to eighth fin-type patterns F5-F8 may be defined by the fourth to sixth shallow trenches ST4-ST6. That is, in the first region I, the first to fourth fin-type patterns F1-F4 are defined by the first trench T1, the second trench T2 and the first to third shallow trenches ST1-ST3, and in the second region II, the fifth to eighth fin-type patterns F5-F8 are defined by the first trench T1, the third trench T3 and the fourth to sixth shallow trenches ST4-ST6.

Depths of the first to sixth shallow trenches ST1-ST6 may be equal to or less than depths of the first to third trenches T1-T3. On the other hand, widths of the first to sixth shallow trenches ST1-ST6 may be less than widths of the first to third trenches T1-T3. Accordingly, a volume of the first interlayer insulating film 20 formed in the first to third trenches T1-T3 may be greater than a volume of the first interlayer insulating film 20 formed in the first to sixth shallow trenches ST1-ST6.

Specifically, the first fin-type pattern F1 and the second fin-type pattern F2 may be spaced apart from each other by the first shallow trench ST1. The second fin-type pattern F2 and the third fin-type pattern F3 may be spaced apart from each other by the second shallow trench ST2. The third fin-type pattern F3 and the fourth fin-type pattern F4 may be spaced apart from each other by the third shallow trench ST3.

The first shallow trench ST1 may be formed on a side surface of the first fin-type pattern F1 facing the second fin-type pattern F2. The second trench T2 may be formed on a side surface not facing the first shallow trench ST1 with reference to the first fin-type pattern F1. The third shallow trench ST3 may be formed on a side surface of the third fin-type pattern F3 facing the fourth fin-type pattern F4. The first trench T1 may be formed on a side surface of the fourth fin-type pattern F4 not in contact with the third shallow trench ST3.

The fifth fin-type pattern F5 and the sixth fin-type pattern F6 may be spaced apart from each other by the fourth shallow trench ST4. The sixth fin-type pattern F6 and the seventh fin-type pattern F7 may be spaced apart from each other by the fifth shallow trench ST5. The seventh fin-type pattern F7 and the eighth fin-type pattern F8 may be spaced apart from each other by the sixth shallow trench ST6.

The fourth shallow trench ST4 may be formed on a side surface of the fifth fin-type pattern F5 facing the sixth fin-type pattern F6. The first trench T1 may be formed on a side surface not facing the fourth shallow trench ST4 with reference to the fifth fin-type pattern F5. The sixth shallow trench ST6 may be formed on a side surface of the seventh fin-type pattern F7 facing the eighth fin-type pattern F8. The third trench T3 may be formed on a side surface of the eighth fin-type pattern F8 not in contact with the sixth shallow trench ST6.

The first to eighth fin-type patterns F1-F8 may be formed by partially etching the substrate 10, and may include an epitaxial layer grown from the substrate 10. The first to eighth fin-type patterns F1-F8 may include, for example, an elemental semiconductor material such as silicon or germanium. Further, the first to eighth fin-type patterns F1-F8 may include a compound semiconductor such as IV-IV group compound semiconductor or III-V group compound semiconductor, for example.

For example, take the IV-IV group compound semiconductor for example, the first to eighth fin-type patterns F1-F8 may be a binary compound or a ternary compound comprising at least two or more of carbon (C), silicon (Si), germanium (Ge) or tin (Sn), or these compounds doped with IV group element.

Take the III-V group compound semiconductor for instance, the first to eighth fin-type patterns F1-F8 may be a binary compound, a ternary compound or a quaternary compound formed by a combination of a III group element which may be at least one of aluminum (Al), gallium (Ga), or indium (In), with a V group element which may be one of phosphorus (P), arsenic (As) or antimony (Sb).

In the semiconductor device according to exemplary embodiments, it is assumed that the first to eighth fin-type patterns F1-F8 include silicon.

The first interlayer insulating film 20 may partially fill the first to sixth shallow trenches ST1-ST6 and the first to third trenches T1-T3. The first interlayer insulating film 20 may partially surround side surfaces of the first to eighth fin-type patterns F1-F8.

For example, the first interlayer insulating film 20 may include at least one of silicon oxide, silicon nitride, silicon oxynitride, or a low-k dielectric material with a smaller dielectric constant than silicon oxide. For example, the low-k dielectric material may include flowable oxide (FOX), Tonen silazen (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The first interlayer insulating film 20 may have a specific stress characteristic. That is, the first interlayer insulating film 20 may have a tensile stress characteristic as its volume is shrunken by a heat process after being deposited. A slope of the first to eighth fin-type patterns F1-F8 may be determined by the tensile stress characteristic of the first interlayer insulating film 20, depending on a volume of the first interlayer insulating film 20. That is, when the volume of the first interlayer insulating film 20 on both side surfaces is different from the other, the slope of the fin-type pattern may increase as the difference of the volume increases. This is because the shrink rate of the first interlayer insulating film 20 of larger volume is smaller than the shrink rate of the first interlayer insulating film 20 of smaller volume.

Specifically, an external fin-type pattern such as the first fin-type pattern F1, the fourth fin-type pattern F4, the fifth fin-type pattern F5 and the eighth fin-type pattern F8 may be inclined to the directions of the first trench T1, the second trench T2 and the third trench T3, respectively.

That is, the first fin-type pattern F1 may be inclined in the second trench T2 direction, the fourth fin-type pattern F4 and the fifth fin-type pattern F5 may be inclined in the first trench T1 direction, and the eighth fin-type pattern F8 may be inclined in the third trench T3 direction.

That is, a rising angle of the first fin-type pattern F1 in the second trench T2 direction is a first angle θ1, rising angles of the fourth fin-type pattern F4 and the fifth fin-type pattern F5 in the first trench T1 direction are a second angle θ2 and a third angle θ3 respectively, and a rising angle of the eighth fin-type pattern F8 in the third trench T3 direction is a fourth angle θ4. The first to fourth angles θ1-θ4 may be acute angles. That is, the first fin-type pattern F1, the fourth fin-type pattern F4, the fifth fin-type pattern F5 and the eighth fin-type pattern F8 may be inclined.

The first gate electrode 200 and the second gate electrode 201 may extend in the second direction. The first gate electrode 200 may intersect the first to fourth fin-type patterns F1-F4, respectively. That is, the gate electrode 200 may include a portion overlapping with each of the first to fourth fin-type patterns F1-F4 spaced apart from each other. The first to fourth fin-type patterns F1-F4 may include portions overlapping and portions non-overlapping with the first gate electrode 200, respectively.

The second gate electrode 201 may intersect the fifth to eighth fin-type patterns F5-F8, respectively. That is, the second gate electrode 201 may include a portion overlapping with each of the fifth to eighth fin-type patterns F5-F8 spaced apart from each other. The fifth to eighth fin-type patterns F5-F8 may include portions overlapping and portions non-overlapping with the second gate electrode 201, respectively.

Specifically, the first fin-type pattern F1 may include a first portion F1-1 overlapping with the first gate electrode 200, and a second portion F1-2 non-overlapping with the first gate electrode 200. The second portion F1-2 of the first fin-type pattern F1 may be disposed on both sides in the first direction X with reference to the first portion F1-1 of the first fin-type pattern F1 as a center. The second to fourth fin-type patterns F2-F4 may overlap with the first gate electrode 200, like a first fin-type pattern F1. The fifth to eighth fin-type patterns F5-F8 also may overlap with the second gate electrode 201, like a relationship between the first fin-type pattern F1 and the first gate electrode 200.

Referring to FIGS. 2 and 3, the first gate electrode 200 may include a first work function metal 210 and a first fill metal 220. The first work function metal 210 plays a role of adjusting a work function, and the first fill metal 220 plays a role of filling the space formed by the first work function metal 210. The first work function metal 210 may be, for example, an N-type work function metal, a P-type work function metal, or a combination thereof.

In some exemplary embodiments, the first region I may be a PMOS region, and therefore the first work function metal 210 may be a combination of an N-type work function metal and a P-type work function metal. For example, the first work function metal 210 may include at least one of, for example, TiN, WN, TiAl, TiAlN, TaN, TiC, TaC, TaCN, TaSiN, or a combination thereof, but not limited thereto.

Further, the first fill metal 220 may include at least one of, for example, W, Al, Cu, Co, Ti, Ta, poly-Si, SiGe, or a metal alloy, but not limited thereto.

The second gate electrode 201 may include a second work function metal 211 and a second fill metal 221. The second work function metal 211 plays a role of adjusting a work function, and the second fill metal 221 plays a role of filling the space formed by the second work function metal 211. The second work function metal 211 may be, for example, an N-type work function metal, a P-type work function metal, or a combination thereof.

In some exemplary embodiments, the second region II may be an NMOS region, and therefore the second work function metal 211 may be an N-type work function metal. For example, the second work function metal 211 may include at least one of, for example, TiN, WN, TiAl, TiAlN, TaN, TiC, TaC, TaCN, TaSiN, or a combination thereof, but not limited thereto. Further, the second fill metal 221 may include at least one of, for example, W, Al, Cu, Co, Ti, Ta, poly-Si, SiGe, or a metal alloy, but not limited thereto.

For example, the first gate electrode 200 and the second gate electrode 201 may be formed by a replacement process (or gate last process), but not limited thereto.

The gate insulating films 130, 140 may be formed between the first to eighth fin-type patterns F1-F8 and the first and second gate electrodes 200, 201, and between the first interlayer insulating film 20 and the first and second gate electrodes 200, 201. The gate insulating films 130, 140 may include an interfacial film 130 and a high-k dielectric film 140.

The interfacial film 130 may be formed by partially oxidizing the first to eighth fin-type patterns F1-F8. The interfacial film 130 may be formed along the profile of the first to eighth fin-type patterns F1-F8 protruding upward further than the upper surface of the first interlayer insulating film 20. When the first to eighth fin-type patterns F1-F8 are silicon fin-type patterns including silicon, the interfacial film 130 may include a silicon oxide film.

As illustrated in FIG. 3, the interfacial film 130 may not be formed along the upper surface of the first interlayer insulating film 20, but exemplary embodiments are not limited thereto. Depending on methods of forming the interfacial film 130, the interfacial film 130 may be formed along the upper surface of the first interlayer insulating film 20.

Alternatively, even when the first interlayer insulating film 20 includes silicon oxide, when the silicon oxide included in the first interlayer insulating film 20 has different properties from the silicon oxide film included in the interfacial film 130, the interfacial film 130 may be formed along the upper surface of the first interlayer insulating film 20.

The high-k dielectric film 140 may be formed between the interfacial film 130 and the first and second gate electrodes 200, 201. It may be formed along the profile of the first to eighth fin-type patterns F1-F8 protruding upward further than the upper surface of the first interlayer insulating film 20. Further, the high-k dielectric film 140 may be formed between the first and second gate electrodes 200, 201 and the first interlayer insulating film 20.

The high-k dielectric film 140 may include a high-k dielectric material having a higher dielectric constant than silicon oxide film. For example, the high-k dielectric film 140 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

A gate spacer 160 may be disposed on a sidewall of the first and second gate electrodes 200, 201 extending in the second direction Y. The gate spacer 160 may include, for example, at least one of silicon nitride (SiN), silicon oxynitride (SiON), silicon oxide (SiO2), silicon oxycarbonitride (SiOCN), or a combination thereof.

As illustrated in the drawings, the gate spacer 160 may be a single film as an example, but it may be multiple spacers in which a plurality of films are stacked. A shape of the gate spacer 160 and respective shapes of the multiple spacers forming the gate spacer 160 may be I or L shape, or a combination thereof depending on the fabrication process and use.

Referring to FIGS. 2 to 4, the first to fourth epitaxial patterns E1-E4 may be formed on both sides of the first gate electrode 200 in the first direction X, and on the first to fourth fin-type patterns F1-F4, respectively. The first to fourth epitaxial patterns E1-E4 may be source/drain regions of respective transistors on the first to fourth fin-type patterns F1-F4.

The fifth to eighth epitaxial patterns E5-E8 may be formed on both sides of the second gate electrode 201 in the first direction X, and on the fifth and eighth fin-type patterns F5-F8, respectively. The fifth to eighth epitaxial patterns E5-E8 may be source/drain regions of respective transistors on the fifth to eighth fin-type patterns F5-F8.

For example, the first epitaxial pattern E1 may be formed on the second portion F1-2 of the first fin-type pattern F1. Likewise, the second to eighth epitaxial patterns E2-E8 may be formed on the second to eighth fin-type patterns F2-F8, respectively.

The first to eighth epitaxial patterns E1-E8 may include an epitaxial layer formed by an epitaxy process. Further, the first to eighth epitaxial patterns E1-E8 may be a raised source/drain. The first region I may be a PMOS region and the second region II may be an NMOS region, and therefore the first to fourth epitaxial patterns E1-E4 may be a SiGe epitaxial layer, for example. The fifth to eighth epitaxial patterns E5-E8 may be a S1 epitaxial layer, for example. That is, the first to fourth epitaxial patterns E1-E4 in the first region I may be a SiGe epitaxial layer, and the fifth and eighth fin-type patterns F5-F8 in the second region II may be a S1 epitaxial layer. However, exemplary embodiments are not limited to the example given above.

The first epitaxial pattern E1 may fill a recess F1r formed in the second portion F1-2 of the first fin-type pattern F1. Likewise, the second to eighth epitaxial patterns E2-E8 may fill recesses of the second to eighth fin-type patterns F2-F8, respectively.

An outer circumference of the first to eighth epitaxial patterns E1-E8 may have a variety of shapes. For example, the outer circumference of the first to eighth epitaxial patterns E1-E8 may be at least one of diamond, circle, or rectangle shapes. FIG. 4 illustrates a diamond shape (or pentagon or hexagon shape) for example.

As the semiconductor device according to an exemplary embodiment is a PMOS transistor in the first region I, the first to fourth epitaxial patterns E1-E4 may include a compressive stress material. For example, the compressive stress material may be a material such as SiGe which has a greater lattice constant compared to Si. For example, the compressive stress material can enhance carrier mobility in the channel region by exerting a compressive stress on the first to fourth fin-type patterns F1-F4.

When the semiconductor device according to an exemplary embodiment is an NMOS transistor in the second region II, the fifth to eighth epitaxial patterns E5-E8 may include a tensile stress material. For example, when the fifth to eighth fin-type patterns F5-F8 are silicon, the fifth to eighth epitaxial patterns E5-E8 may include a material such as SiC which has a smaller lattice constant than the silicon. For example, the tensile stress material can enhance carrier mobility in the channel region by exerting a tensile stress on the fifth to eighth fin-type patterns F5-F8.

Referring to FIGS. 4 and 5, the first to fourth fin-type epitaxial patterns E1-E4 in the first region I may have a cross-sectionals shape defining a convex polygon. In the specific example of FIGS. 4 and 5, the convex polygon is a pentagon having five sides and five internal angles each of less than 180°.

The first to fourth epitaxial patterns E1-E4 may define first to fourth convex polygons, respectively. In this case, the first to fourth convex polygons may have the same shape as one another. The phrase 'same shape' as used herein encompasses polygons that are the same in both configuration and dimension, as well as polygons configured with the same internal angles but with different overall dimensions.

Further, the first to fourth epitaxial patterns E1-E4 may be in bilateral symmetry with each other, respectively. Further, the first to fourth epitaxial patterns E1-E4 may include a lower region and an upper region formed on the lower region, and the lower region may have an increasing width as a height increases, and the upper region may have a decreasing width as a height increases.

The upper region may include a first outer surface and a second outer surface in symmetry with each other, and the normal directions of the first and second outer surfaces may be same in the first to fourth epitaxial patterns E1-E4.

Referring to FIG. 5, the first to fourth epitaxial patterns E1-E4 may include five first internal angles a1-a5. In this case, for convenience of explanation, the second epitaxial pattern E2 will be explained below as an example.

The first to fourth epitaxial patterns E1-E4 may have same first internal angles a1-a5 as one another. In some exemplary embodiments, the first internal angles a1-a5 may indicate only the three first internal angles a1-a3 not in contact with the second fin-type pattern F2. That is, while the three first internal angles a1-a3 of the second epitaxial pattern E2 should have a constant value according to the crystal orientation, the other two first internal angles a4, a5 may vary in angles according to the recessed surface of the second fin-type pattern F2.

As the first region I is a PMOS region, the first to fourth epitaxial patterns E1-E4 may include SiGe, and its epitaxial growth may be carried out straightly in crystal orientation. Accordingly, the first to fourth epitaxial patterns E1-E4 may have a shape same as one another.

Referring to FIGS. 4 and 6, the fifth to eighth epitaxial patterns E5-E8 in the second region II may have a cross-sectional shape defining a convex polygon. In the specific example of FIGS. 4 and 6, the convex polygon is a pentagon having five sides and five internal angles each of less than 180°.

The cross-sections illustrated in FIGS. 5 and 6 are referred to as having a convex polygonal shape. As previously explained, in the case of FIG. 5, the convex polygonal shape is a regular shape having a plurality of flat sides extending between internal angles. Herein, 'regular shape' means a cross section having a shape that is bilaterally symmetrical on both sides of a line extending perpendicular to a substrate. For example, in FIG. 5, angles a1 and a3 may be the same, and angles a4 and a5 may be the same.

It will be apparent from FIG. 6, however, that the 'convex polygonal shape' is not limited herein to a shape having exclusively flat surfaces extending between internal angles. That is, FIG. 6 shows an example of an irregularly shaped convex polygonal in which other internal angular features and surfaces are included. In particular, as illustrated in FIG. 6, while 'convex polygonal shape' as used herein may be characterized to have large-defined second internal angles b1-b5, it may also have other internal angles, and a surface connecting each of the second internal angles b1-b5 may not be a plane. In addition, shape of the example of FIG. 6 is irregular in that it is not bilaterally symmetrical on both sides of a line extending perpendicular to a substrate. For example, in FIG. 6, angles b5 and b4 may be different from each other, and angles b1 and b3 may be different from each other.

The fifth to eighth epitaxial patterns E5-E8 may be different shapes from each other. Specifically, the second internal angles b1-b5 of the fifth to eighth epitaxial patterns E5-E8 may be different from each other.

Because the second region II is an NMOS region, the fifth to eighth epitaxial patterns E5-E8 may include Si:P highly doped with P, and its epitaxial growth may not be carried out straightly in crystal orientation, unlike the first region I. Accordingly, the fifth to eighth epitaxial patterns E5-E8 may have different shapes from one another.

A height of a lowermost portion of the sixth epitaxial pattern E6 may be less than a height of the upper surface of the sixth fin-type pattern F6. That is, the height of the lowermost portion of the sixth epitaxial pattern E6 may be less than a second level L2.

The lower surface of the sixth epitaxial pattern E6 may include a lowered portion k1 having a decreasing height with increasing distance from the upper surface of the sixth fin-type pattern E6, and a raised portion k2 which is connected with the lowered portion k1 has an increasing height with increasing distance from the upper surface of the sixth fin-type pattern F6. The lowered portion k1 and the raised portion k2 may meet each other at a first protruded point k3-1 and a second protruded point k3-2. A distance D1 from the first protruded point k3-1 to the sixth fin-type pattern F6 and a distance D2 from the second protruded point k3-2 to the sixth fin-type pattern F6 may be different from each other.

The fifth to eighth epitaxial patterns E5-E8 may include a lower region and an upper region formed on the lower region, the lower region may have an increasing as a height increases, and the upper region may have a decreasing width as a height increases.

In the fifth to eighth epitaxial patterns E5-E8, the upper region may include a third outer surface and a fourth outer surface in symmetry with each other, and the normal directions of the third and fourth outer surfaces may be different in the third and fourth epitaxial patterns.

Referring to FIGS. 4 to 6, a first level L1 of an interface where the first to fourth epitaxial patterns E1-E4 in the first region I and the first to fourth fin-type patterns F1-F4 meet may be less than the second level L2 of an interface where the fifth to eighth epitaxial patterns E5-E8 in the second region II and the fifth to eighth fin-type patterns F5 to F8 meet. That is, a lower surface of the first to fourth epitaxial patterns E1-E4 may be less than that of the fifth to eighth fin-type patterns F5-F8.

This is because a recessed depth of the first to fourth fin-type patterns F1-F4 in the first region I is greater. The total volume of the first to fourth epitaxial patterns E1-E4 may be determined according to the degree of a recess (F1r in FIG. 2) of the first to third fin-type patterns F1-F3, because the shapes of the first to fourth epitaxial patterns E1-E4 are formed regularly in the first region I. That is, it may be narrower with increasing distance from the substrate 10 of the fin-type pattern. Accordingly, the width of the upper surface of the recessed fin-type pattern may be greater with increasing depth of the recess (F1r in FIG. 2). The total volume of the first to fourth epitaxial patterns E1-E4 may be determined according to the width of the upper surface of the exposed fin-type pattern, since the total volume is formed along the crystal orientation.

In contrast, because shapes of the fifth to eighth epitaxial patterns E5-E8 are irregular in the second region II, the width of the upper surface of the exposed fin-type pattern can not influence the volume of the fifth to eighth epitaxial patterns E5-E8. Simply, how long the fifth to eighth epitaxial patterns E5-E8 have been grown may determine the volume of the fifth and eighth epitaxial patterns E5-E8. Thus, unlike in the first region I, it is not necessary to form a recess of the fin-type pattern deeply in the second region II. Accordingly, the height of the interface of the fin-type pattern and the epitaxial pattern in the first region I, i.e., the first level L1 may be less than the height of interface of the fin-type pattern and the epitaxial pattern in the second region II, i.e., the second level L2.

Since the upper surfaces of the fifth to eighth fin-type patterns F5-F8 in the second region II is formed at the second level L2, these may be higher than the upper surfaces of the first to fourth fin-type patterns F1-F4 in the first region I formed at the first level L1. As such, the width W2 of the upper surfaces of the fifth to eighth fin-type patterns F5-F8 in the second region II may be less than the width of the upper surfaces of the first to fourth fin-type patterns F1-F4 in the first region I.

Further, the fifth to eighth fin-type patterns F5-F8 in the second region II may include a stepped portion S on the side surface. Referring to FIG. 6, the sixth fin-type pattern F6 will be described as an example for convenience of explanation to explain the stepped portion S of the fifth to eighth fin-type patterns F5-F8. The sixth fin-type pattern F6, and also the fifth fin-type pattern F5, the seventh fin-type pattern F7 and the eighth fin-type pattern F8 may include the identical stepped portion S.

The sixth fin-type pattern F6 may include a lower portion, an upper portion and stepped portion S. Specifically, the sixth fin-type pattern F6 may be separated into the lower portion and the upper portion by the stepped portion S. That is, the lower portion of the sixth fin-type pattern F6 may be defined to be the stepped portion S that protrudes from the substrate 10 to the stepped portion S of the sixth fin-type pattern F6. Likewise, the upper portion of the sixth fin-type pattern F6 may be defined to be the portion spanning from the stepped portion S to the uppermost portion of the sixth fin-type pattern F6. The width W1 of the lower portion of the sixth fin-type pattern F6 may be greater than the width W2 of the upper portion of the sixth fin-type pattern F6.

The expression 'stepped portion' as used herein refers to a point or area at which a decreasing slope of the surface turns into an increasing slope, or a point or area at which an increasing slope of the surface turns into a decreasing slope. That is, the 'stepped portion' as used herein may refer to a point of inflection of the profile of the surface. In other words, the 'stepped portion' as used herein may refer to a point or area at which the profile of the surface turns from concave upwards into concave downwards, or a point or area at which the profile of the surface turns from the concave downwards into concave upwards. That is, the 'stepped portion' refers to a point or area at which the sign of changes of the slope of the profile is changed.

Accordingly, the stepped portion S may be a point or area at which the sign of changes of the slope of the side surface profile of the sixth fin-type pattern F6 is changed. That is, the stepped portion S may be a point or area at which the side surface profile of the sixth fin-type pattern F6 changes from concave upwards into concave downwards, or from concave downwards into concave upwards.

While the first to fourth fin-type patterns F1-F4 in the first region I also include the stepped portion as illustrated in FIG. 3, the stepped portion is hidden from view in FIG. 4 which shows a cross section in which the first to fourth epitaxial patterns E1-E4 are formed. The stepped portion may be hidden from view because the recess (F1r in FIG. 2) of the first to fourth fin-type patterns F1-F4 in the first region I is formed more deeply.

Referring again to FIG. 4, the sixth epitaxial pattern E6 and the seventh epitaxial pattern E7 in the second region II may contact each other. That is, the sixth epitaxial pattern E6 and the seventh epitaxial pattern E7 may be merged with each other.

The first to fourth epitaxial patterns E1-E4 in the first region I may not be in contact with each other, but spaced apart from each other, respectively. In contrast, at least one of the fifth to eighth epitaxial patterns E5-E8 may be in contact with each other. This is because the width of the epitaxial pattern in the second region II is grown greater than that of the epitaxial pattern in the first region I.

As described above, the fifth fin-type pattern F5 and the eighth fin-type pattern F8 may be inclined to directions of the first trench T1 and the third trench T3, respectively. Accordingly, a distance between the fifth fin-type pattern F5 and the sixth fin-type pattern F6, and a distance between the seventh fin-type pattern F7 and the eighth fin-type pattern F8 may be farther than a distance between the sixth fin-type pattern F6 and the seventh fin-type pattern F7. As such, the probability with which the sixth epitaxial pattern E6 and the seventh epitaxial pattern E7 contact each other may be higher than the probability with which the fifth epitaxial pattern E5 and the sixth epitaxial pattern E6 contact each other, and the probability with which the seventh epitaxial pattern E7 and the eighth epitaxial pattern E8 contact each other. However, exemplary embodiments are not limited to the example given above. In a semiconductor device according to one or more exemplary embodiments, the fifth epitaxial pattern E5 and the sixth epitaxial pattern E6 or the seventh epitaxial pattern E7 and the eighth epitaxial pattern E8 may also contact each other.

In a semiconductor device according to one or more exemplary embodiments, as the sixth epitaxial pattern E6 and the seventh epitaxial pattern E7 contact each other in the second region II, an air gap G may be formed.

The air gap G may be formed between the sixth fin-type pattern F6 and the seventh fin-type pattern F7. The air gap G may be formed on the first interlayer insulating film 20. The air gap G may be covered by the sixth epitaxial pattern E6 and the seventh epitaxial pattern E7.

A semiconductor device according to one or more exemplary embodiments may have an epitaxial pattern grown on a very small-scale element and thus can have enhanced integration density. Furthermore, a semiconductor device according to one or more exemplary embodiments may selectively cause source/drain to merge only in an NMOS region except PMOS region to decrease the contact resistance of the NMOS region and maintain the high integration density of the PMOS region. Further, such formation of the two regions can be completed at once, and simplification of the process can thus be achieved.

Hereinbelow, a semiconductor device according to one or more exemplary embodiments will be described with reference to FIGS. 1 to 3 and 7. Meanwhile, elements or operations overlapping with those described above with reference to FIGS. 1 to 6 will be mentioned as briefly as possible or omitted for the sake of brevity.

Figure 7:
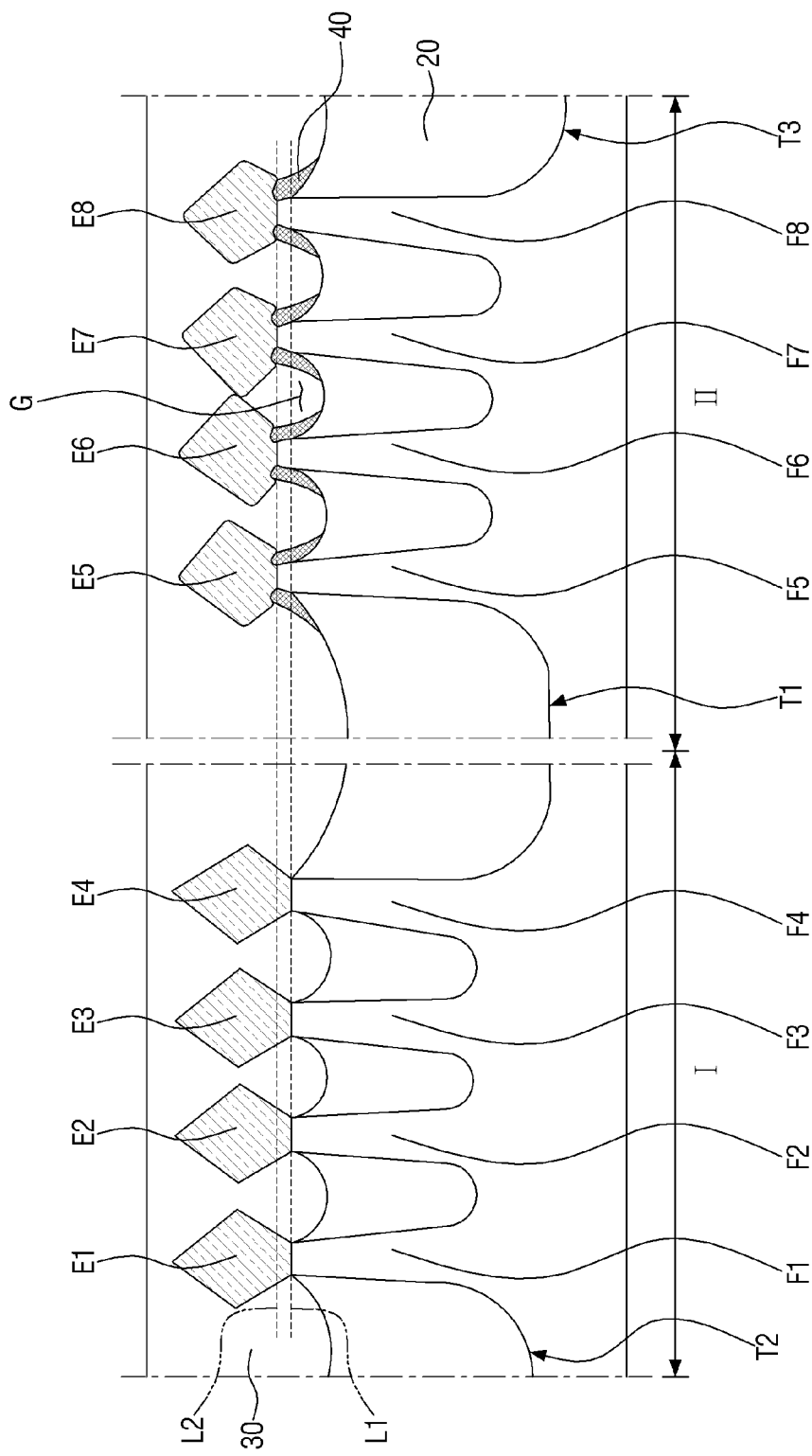
FIG. 7 is a cross sectional view for reference in describing a semiconductor device according to one or more exemplary embodiments.

FIG. 7 is a cross sectional view for reference in describing a semiconductor device according to one or more exemplary embodiments.

Referring to FIGS. 1 to 3 and 7, the semiconductor device according to one or more exemplary embodiments additionally includes a first residual film 40.

The first residual film 40 may not be formed in the first region I but formed in the second region II. The first residual film 40 may be formed on both sides of the fifth to eighth fin-type patterns F5-F8. The first residual film 40 may be formed on the first interlayer insulating film 20.

The first residual film 40 may be formed along a portion of the upper surface of the first interlayer insulating film 20. The first residual film 40 may expose the rest of the upper surface of the first interlayer insulating film 20. For example, the first residual film 40 may include a silicon nitride film. However, exemplary embodiments are not limited to the example given above. In the formation process of a semiconductor device according to one or more exemplary embodiments of the present disclosure, the first residual film 40 may be a film that is not removed completely by the removal process, but remained since it is formed.

Hereinbelow, a semiconductor device according to one or more exemplary embodiments will be described with reference to FIGS. 1 to 3 and 8. Meanwhile, elements or operations overlapping with those described above with reference to FIGS. 1 to 7 will be mentioned as briefly as possible or omitted for the sake of brevity.

Figure 8:
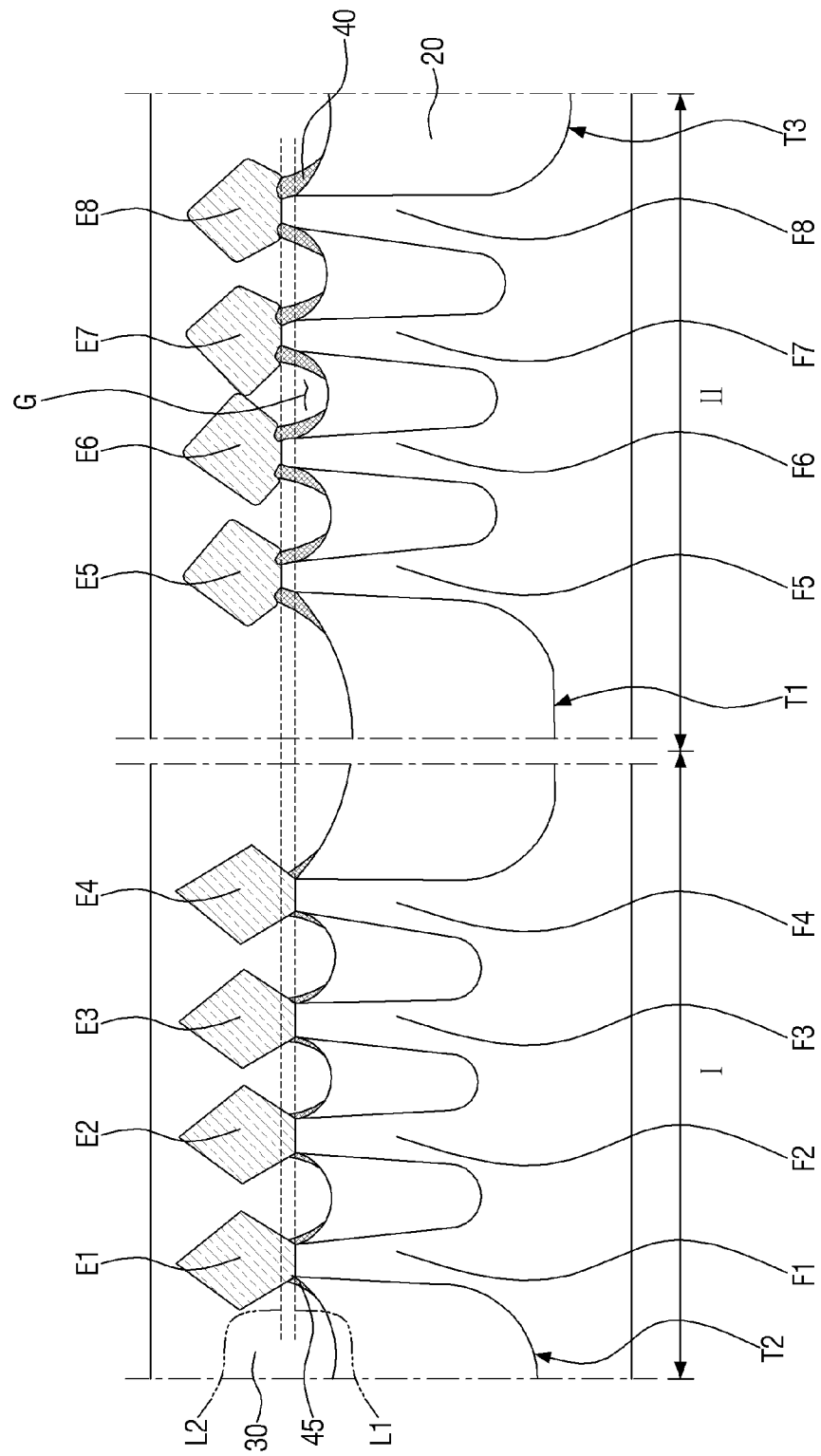
FIG. 8 is a cross sectional view for reference in describing a semiconductor device according to one or more exemplary embodiments.

FIG. 8 is a cross sectional view for reference in describing a semiconductor device according to one or more exemplary embodiments.

Referring to FIGS. 1 to 3 and 8, the semiconductor device according to one or more exemplary embodiments additionally includes a second residual film 45.

The second residual film 45 may be formed in the first region I. The second residual film 45 may be formed on both sides of the first to fourth fin-type patterns F1-F4. The second residual film 45 may be formed on the first interlayer insulating film 20.

The second residual film 45 may be formed along a portion of the upper surface of the second interlayer insulating film 30. The second residual film 45 may expose the rest of the upper surface of the first interlayer insulating film 20. The second residual film 45 may include a same material as the first residual film 40. For example, the second residual film 45 may include a silicon nitride film. However, exemplary embodiments are not limited to the example given above. In the formation process of a semiconductor device according to one or more exemplary embodiments of the present disclosure, the second residual film 45 may be a film that is not removed completely by the removal process, but remained since it is formed.

A thickness of the second residual film 45 may be less than a thickness of the first residual film 40. A length of the second residual film 45 may be shorter than a length of the first residual film 40. This is because the upper surfaces of the first to fourth patterns F1-F4 in the first region I are more deeply recessed than the upper surfaces of the fifth to eighth fin-type patterns F5-F8 in the second region II.

Hereinbelow, a semiconductor device according to one or more exemplary embodiments will be described with reference to FIGS. 1 to 3 and 9. Meanwhile, elements or operations overlapping with those described above with reference to FIGS. 1 to 8 will be mentioned as briefly as possible or omitted for the sake of brevity.

Figure 9:
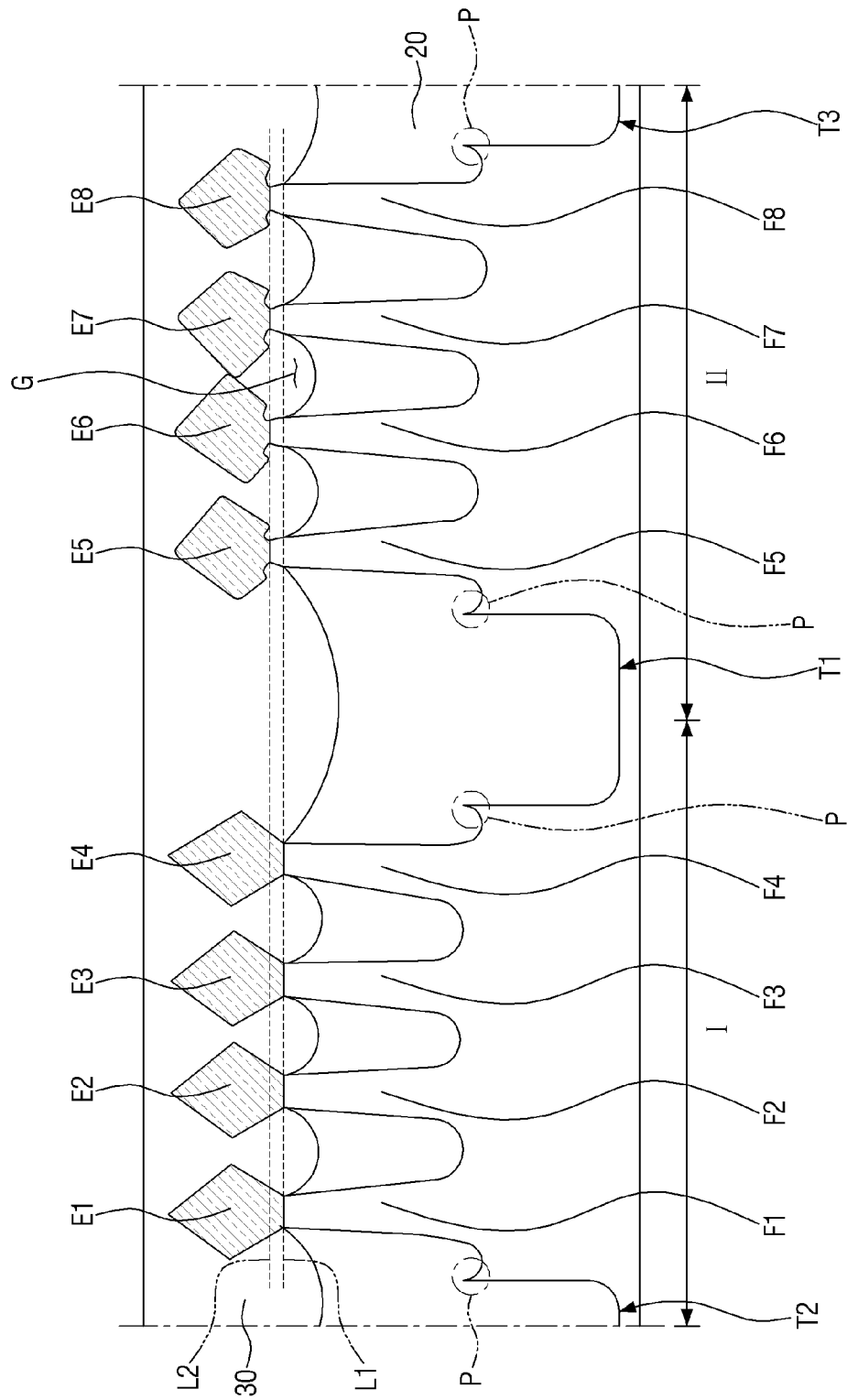
FIG. 9 is a cross sectional view for reference in describing a semiconductor device according to one or more exemplary embodiments.

FIG. 9 is a cross sectional view for reference in describing a semiconductor device according to one or more exemplary embodiments.

Referring to FIGS. 1 to 3 and 9, the first to third trenches T1-T3 of the semiconductor device according to one or more exemplary embodiments includes a protrusion P.

The lower surfaces of the first to third trenches T1-T3 of a semiconductor device according to one or more exemplary embodiments of the present disclosure may be formed deeper than the lower surfaces of the first to sixth shallow trenches ST1-ST6. That is, the first to third trenches T1-T3 may be deep trenches.

The protrusion P may be formed within the first to third trenches T1-T3 by the etching process for forming the deep trench. The first trench T1 may include trenches of different depths from the other on the both sides with reference to the protrusion P. In the first trench T1, the side closer to the fourth fin-type pattern F4 or the fifth fin-type pattern F5 with reference to the protrusion P may have a similar depth with the first to sixth shallow trenches ST1-ST6, and in the first trench T1, the side farther from the fourth fin-type pattern F4 or the fifth fin-type pattern F5 with reference to the protrusion P may have a greater depth than the first to the sixth shallow trenches ST1-ST6.

Likewise, in the second trench T2 and the third trench T3, the side closer to the first fin-type pattern F1 and the eighth fin-type pattern F8 may each have a similar depth as the first to sixth shallow trenches ST1-ST6, and the side farther from the first fin-type pattern F1 and the eighth fin-type pattern F8 may each have a greater depth than the first to sixth shallow trenches ST1-ST6.

Hereinbelow, a semiconductor device according to one or more exemplary embodiments will be described with reference to FIGS. 1 to 3 and 10. Meanwhile, elements or operations overlapping with those described above with reference to FIGS. 1 to 9 will be mentioned as briefly as possible or omitted for the sake of brevity.

Figure 10:
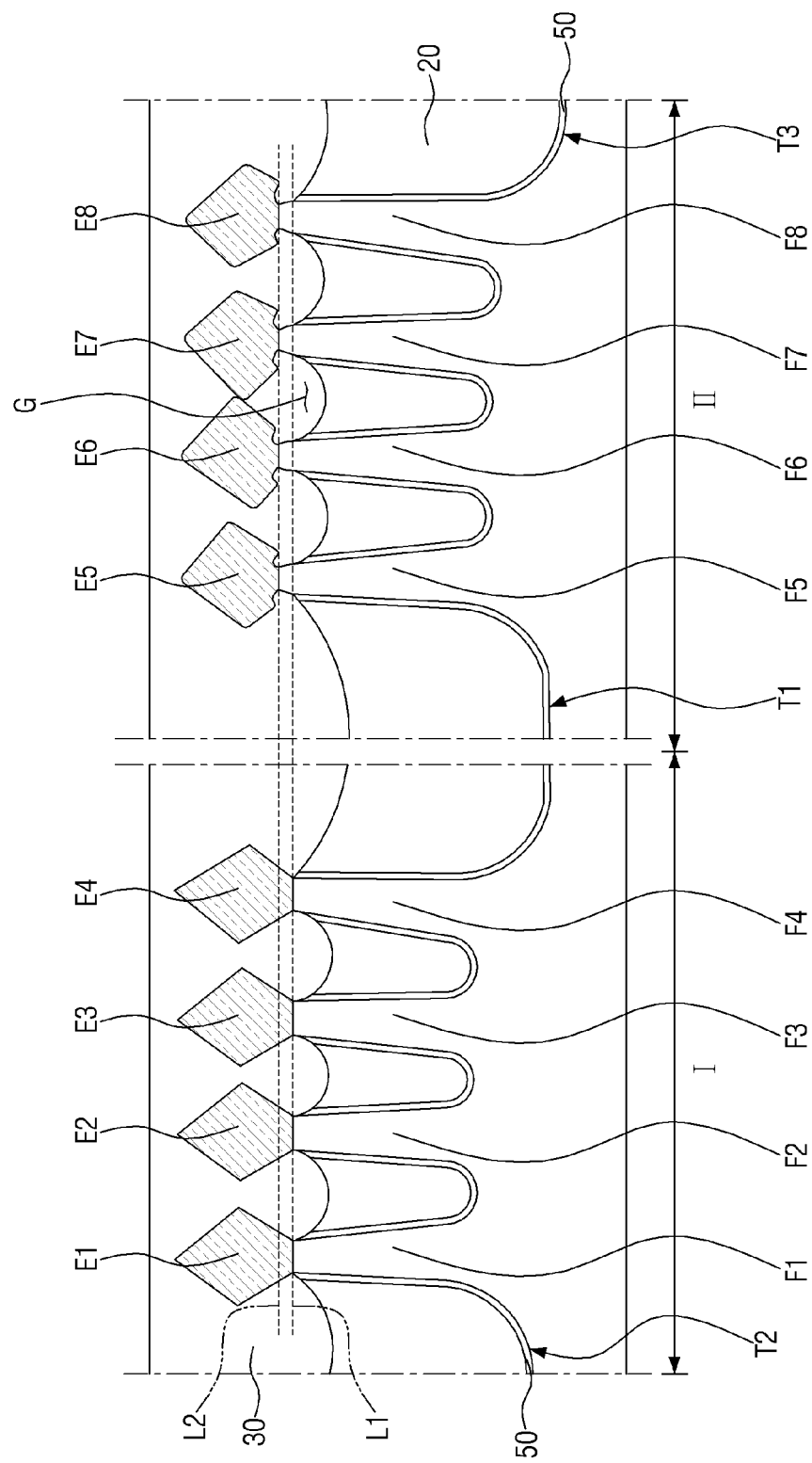
FIG. 10 is a cross sectional view for reference in describing a semiconductor device according to one or more exemplary embodiments.

FIG. 10 is a cross sectional view for reference in describing a semiconductor device according to one or more exemplary embodiments.

Referring to FIGS. 1 to 3 and 10, the semiconductor device according to one or more exemplary embodiments includes a liner 50.

The liner 50 may be formed on a side surface of the first to eighth fin-type patterns F1-F8. The liner 50 may be formed conformally along the profile of the surface of the side surface of the first to eighth fin-type patterns F1-F8. The liner 50 may be formed between the first to eighth fin-type patterns F1-F8 and the first interlayer insulating film 20. Depending on materials and the manufacturing process, the liner 50 may be formed on not only the surface of the first to eighth fin-type patterns F1-F8, but also the upper surface of the substrate 10.

The liner 50 may be formed from a material that applies a first stress to the channel regions of the first to eighth fin-type patterns F1-F8. The liner 50 may play a role of enhancing carrier mobility in the channel region, by introducing the first stress to the channel regions of the first to eighth fin-type patterns F1-F8. In some exemplary embodiments of the present disclosure, in the case of the fifth to eighth fin-type patterns F5-F8 in which the channel region is an N-type channel region, the liner 50 may be formed from a material that applies a tensile stress to the channel region. For example, the liner 50 may be formed from silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), silicon dioxide (SiO2), polysilicon, or a combination thereof. In some exemplary embodiments, the liner 50 may have a thickness of approximately 10-100 Å In contrast, in the case of the first to fourth fin-type patterns F1-F4 in which the channel region is a P type channel region, the liner 50 may be formed from a material that applies a compressive stress to the channel region.

Hereinbelow, a semiconductor device according to one or more exemplary embodiments will be described with reference to FIGS. 1 to 3 and 11. Meanwhile, elements or operations overlapping with those described above with reference to FIGS. 1 to 10 will be mentioned as briefly as possible or omitted for the sake of brevity.

Figure 11:
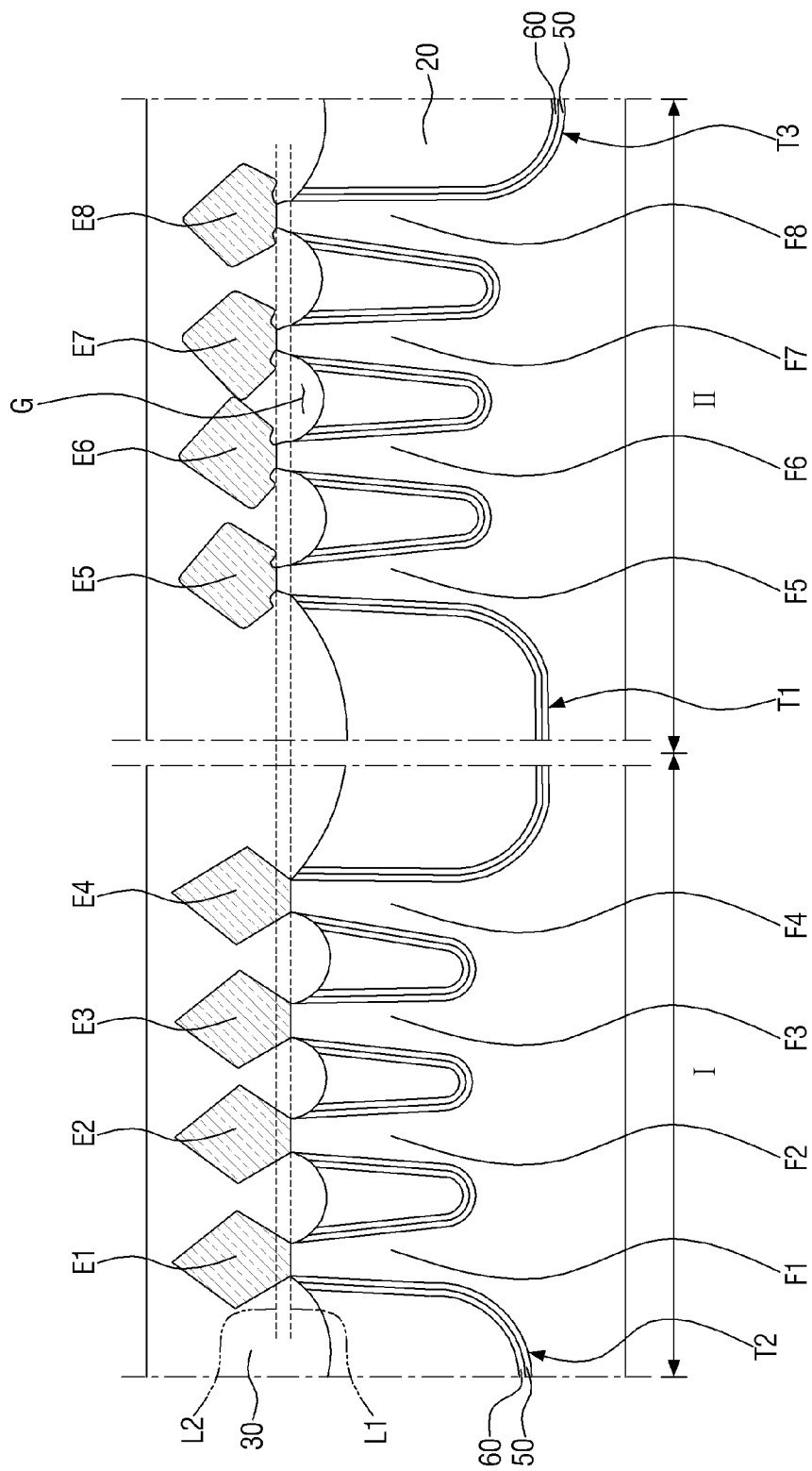
FIG. 11 is a cross sectional view for reference in describing a semiconductor device according to one or more exemplary embodiments.

FIG. 11 is a cross sectional view for reference in describing a semiconductor device according to one or more exemplary embodiments.

Referring to FIGS. 1 to 3 and 11, the semiconductor device according to one or more exemplary embodiments additionally includes an insulating liner 60.

The insulating liner 60 may be formed between the liner 50 and the first to eighth fin-type patterns F1-F8.

The insulating liner 60 may be formed from oxide film. For example, the insulating liner 60 may be formed from natural oxide film. In some exemplary embodiments, the oxide film constituting the insulating liner 60 may be obtained by performing a process of thermally oxidizing the surfaces of the first to eighth fin-type patterns F1-F8. In some exemplary embodiments, the insulating liner 60 may have a thickness of approximately 10-100 Å.

Hereinbelow, a semiconductor device according to one or more exemplary embodiments will be described with reference to FIGS. 1 to 3 and 12. Meanwhile, elements or operations overlapping with those described above with reference to FIGS. 1 to 11 will be mentioned as briefly as possible or omitted for the sake of brevity.

Figure 12:
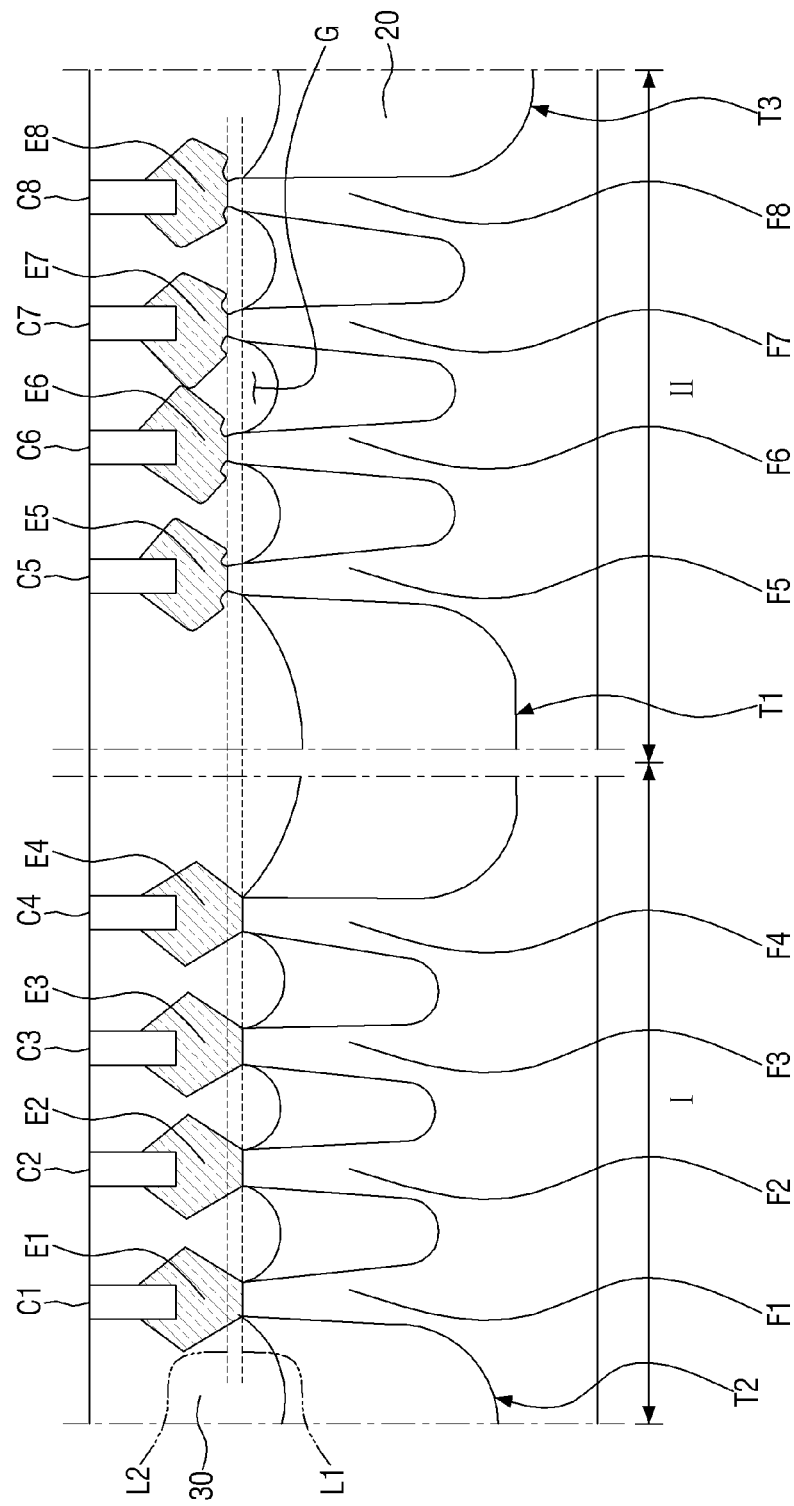
FIG. 12 is a cross sectional view for reference in describing a semiconductor device according to one or more exemplary embodiments.

FIG. 12 is a cross sectional view for reference in describing a semiconductor device according to one or more exemplary embodiments.

Referring to FIGS. 1 to 3 and 12, the semiconductor device according to one or more exemplary embodiments additionally includes the first to seventh contacts C1-C7.

In the first region I, the first to fourth contacts C1-C4 may be formed on the first to fourth epitaxial patterns E1-E4, respectively. The first to fourth contacts C1 to C4 may be connected with the first to fourth epitaxial patterns E1-E4 electrically and physically.

In the second region II, the fifth contact C5 and the seventh contact C7 may be formed on the fifth epitaxial pattern E5 and the eighth epitaxial pattern E8, respectively. The fifth contact C5 and the seventh contact C7 each may be connected with the fifth epitaxial pattern E5 and the eighth epitaxial pattern E8 electrically and physically.

The sixth contact C6 may be formed on the sixth epitaxial pattern E6 and the seventh epitaxial pattern E7. The sixth contact C6 may have a width greater than that of the first to fifth contacts C1-C5 and the seventh contact C7. However, exemplary embodiments are not limited to the example given above.

The sixth contact C6 may be formed together on the sixth epitaxial pattern E6 and the seventh epitaxial pattern E7 as the sixth epitaxial pattern E6 and the seventh epitaxial pattern E7 are merged to each other. The sixth epitaxial pattern E6 and the seventh epitaxial pattern E7 may be connected with the seventh contact C7 electrically and physically.

Hereinbelow, a semiconductor device according to one or more exemplary embodiments will be described with reference to FIGS. 13 to 16. Meanwhile, elements or operations overlapping with those described above with reference to FIGS. 1 to 12 will be mentioned as briefly as possible or omitted for the sake of brevity.

Figure 13:
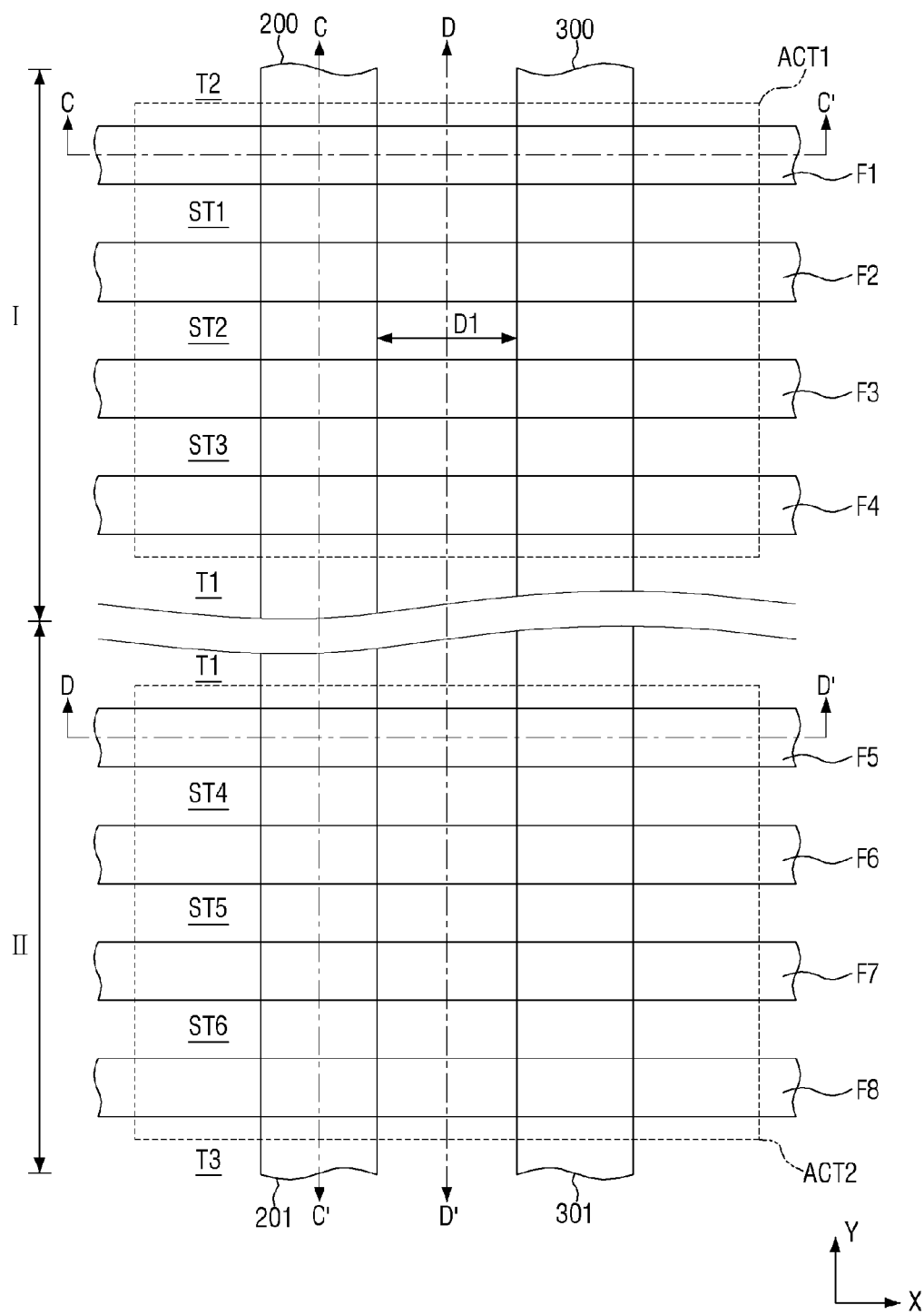
FIG. 13 is a layout diagram for reference in describing a semiconductor device according to one or more exemplary embodiments.
Figure 14:
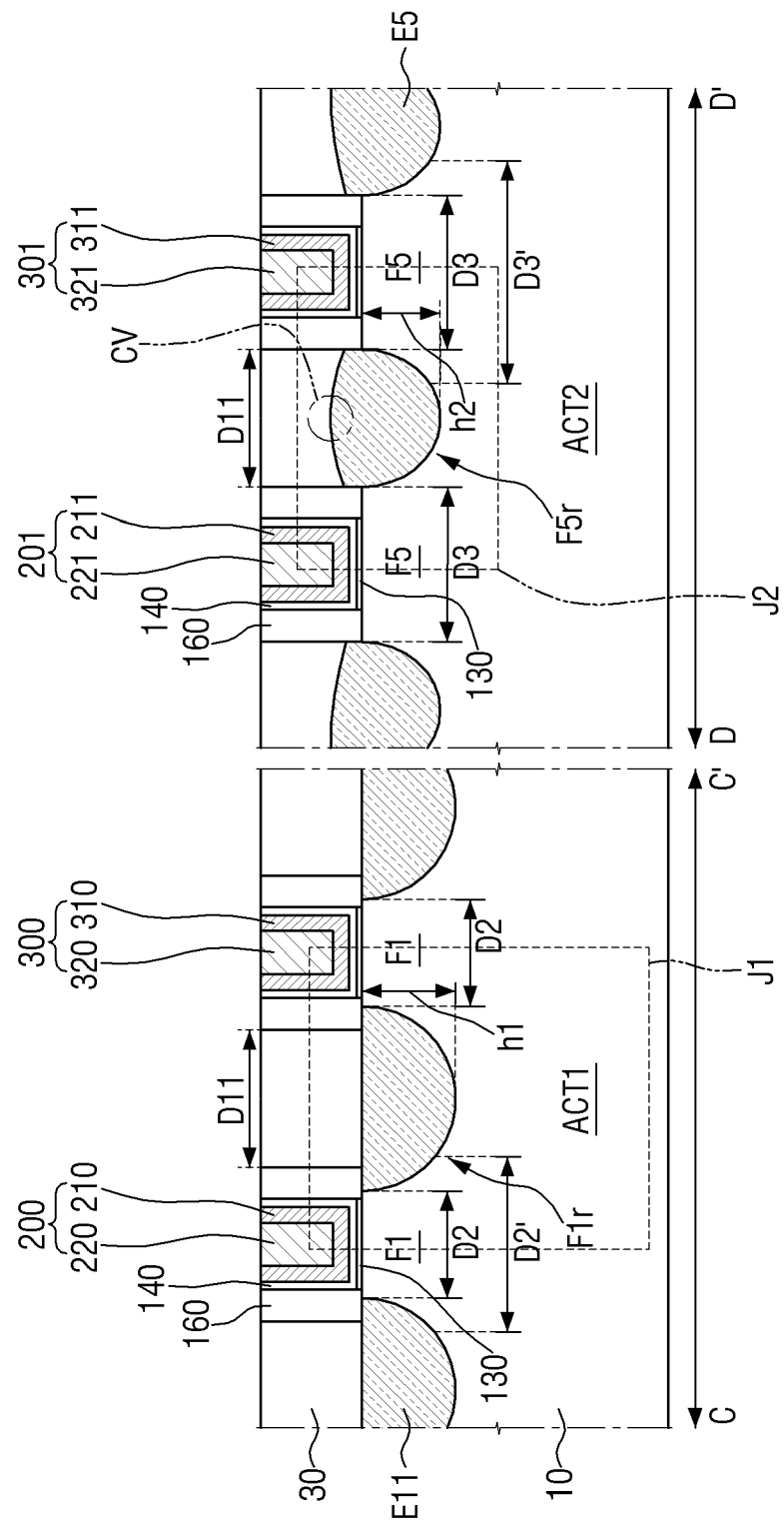
FIG. 14 shows cross sectional views taken on lines C-C' and D-D' of FIG. 13.
Figure 15:
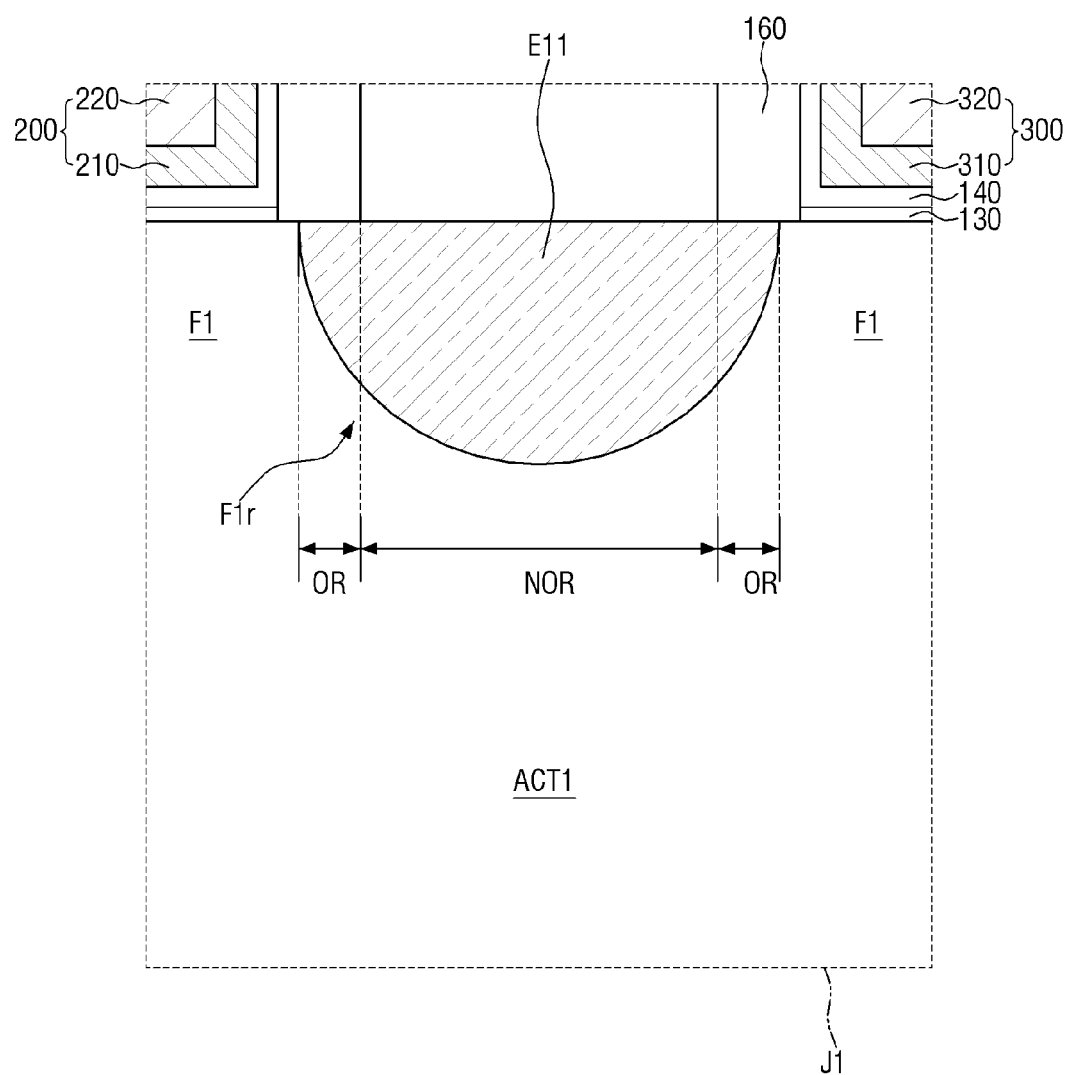
FIG. 15 is an enlarged cross sectional view for reference in describing in detail the dashed area J1 of FIG. 14.
Figure 16:
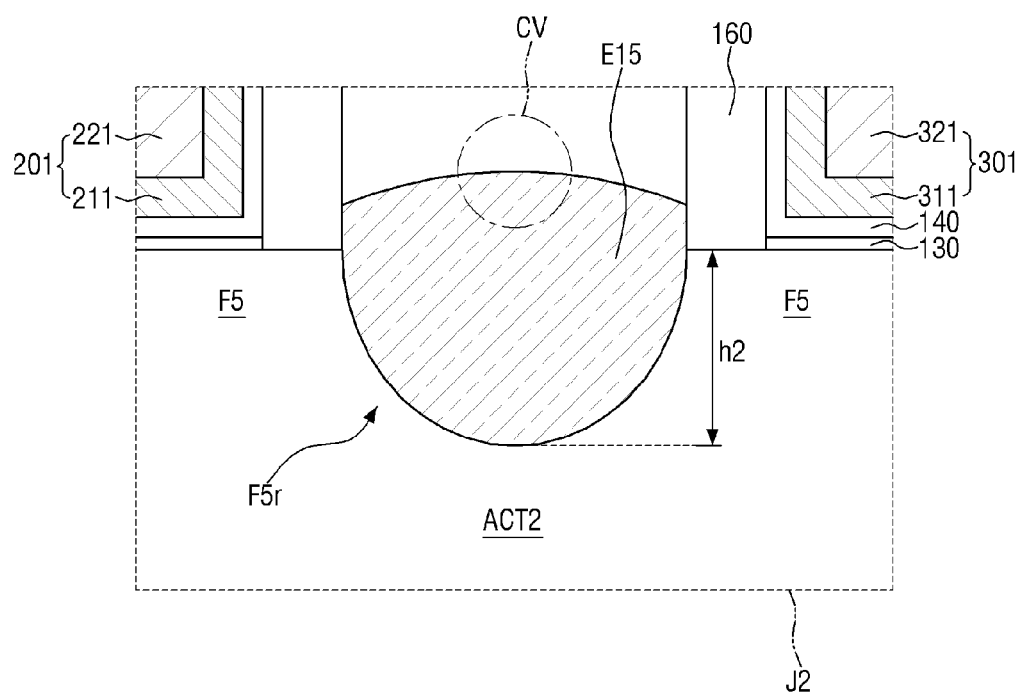
FIG. 16 is an enlarged cross sectional view for reference in describing in detail the dashed area J2 of FIG. 14.

FIG. 13 is a layout diagram for reference in describing a semiconductor device according to one or more exemplary embodiments, and FIG. 14 shows cross sectional views taken on lines C-C' and D-D' of FIG. 13. FIG. 15 is an enlarged cross sectional view for reference in describing in detail the dashed area J1 of FIG. 14, and FIG. 16 is an enlarged cross sectional view for reference in describing in detail the dashed area J2 of FIG. 14.

Referring to FIGS. 13 to 16, a semiconductor device according to one or more exemplary embodiments may additionally include a third gate electrode 300 and a fourth gate electrode 301.

The first gate electrode 200 and the third gate electrode 300 may extend in parallel with each other. The first gate electrode 200 and the third gate electrode 300 may extend in the second direction Y. The first gate electrode 200 and the third gate electrode 300 may be spaced apart from each other in the first direction X. The first gate electrode 200 may be spaced apart from the third gate electrode 300 by a first distance D11.

The second gate electrode 201 and the fourth gate electrode 301 may extend in parallel with each other. The second gate electrode 201 and the fourth gate electrode 301 may extend in the second direction Y. The second gate electrode 201 and the fourth gate electrode 301 may be spaced apart from each other in the second direction Y. The second gate electrode 201 may be spaced apart from the fourth gate electrode 301 by the first distance D11. That is, the spacing distances between two gate electrodes may be identical in the first region I and the second region II.

The third gate electrode 300 and the fourth gate electrode 301 may extend in the second direction. The third gate electrode 300 may intersect the first to fourth fin-type patterns F1 to F4, respectively. The first to fourth fin-type patterns F1 to F4 may include a portion overlapping and a portion non-overlapping with the third gate electrode 300, respectively.

The fourth gate electrode 301 may intersect the fifth to eighth fin-type patterns F5 to F8, respectively. The fifth to eighth fin-type patterns F5 to F8 may include a portion overlapping and a portion non-overlapping with the fourth gate electrode 301, respectively.

The third gate electrode 300 and the fourth gate electrode 301 may or may not be connected with each other. The third gate electrode 300 may include a third work function metal 310 and a third fill metal 320. The third work function metal 310 plays a role of adjusting a work function, and the third fill metal 320 plays a role of filling the space formed by the third work function metal 310. The third work function metal 310 may be, for example, an N-type work function metal, a P-type work function metal, or a combination thereof.

The fourth electrode 301 may include a fourth work function metal 311 and a fourth fill metal 321. The fourth work function metal 311 plays a role of adjusting a work function, and the fourth fill metal 321 plays a role of filling the space formed by the fourth work function metal 311. The fourth work function metal 311 may be, for example, an N-type work function metal, a P-type work function metal, or a combination thereof.

A gate spacer 160 may be disposed on a sidewall of the third and fourth gate electrodes 200, 201, 300, 301 extending in the second direction Y.

Referring to FIGS. 14 to 16, the first source/drain E11 may be formed on both sides of the first gate electrode 200 and third gate electrode 300 in the first direction X, and on the first to fourth fin-type patterns F1 to F4, respectively. The first source/drain E11 may be source/drain regions of respective transistors on the first to fourth fin-type patterns F1 to F4. Hereinbelow, the first fin-type pattern F1 and the fifth fin-type pattern F5 will be explained for convenience. The second to fourth fin-type patterns F2 to F4 may be identical to fin-type pattern F1, and the sixth to eighth fin-type patterns F6 to F8 may be identical to the fifth fin-type pattern F5.

Referring first to FIG. 14, the first source/drain E11 in the first region I may be formed so as to fill a first recess F1r formed on an upper surface of the first fin-type pattern F1. At this time, since the first gate electrode 200 and the third gate electrode 300 are formed in the portion in which the first recess F1r is not formed on the upper surface of the first fin-type pattern F1, the first source/drain E11 may be formed between the first gate electrode 200 and the third gate electrode 300.

The first source/drain E11 may have a same upper surface as the first fin-type pattern F1. That is, a height of an upper surface of the first source/drain E11 may be equal to a height of the upper surface of the first fin-type pattern F1. The upper surface of the first source/drain E11 may be flat. A portion of the upper surface of the first source/drain E11 may be overlapped with a portion of the lower surface of the gate spacer 160.

A second source/drain E15 in the second region II may be formed so as to fill a second recess F5r formed on an upper surface of the fifth fin-type pattern F5. At this time, since the second gate electrode 201 and the fourth gate electrode 301 are formed in the portion in which the second recess F5r is not formed on the upper surface of the fifth fin-type pattern F5, the second source/drain E15 may be formed between the second gate electrode 201 and the fourth gate electrode 301.

The second source/drain E15 may have a higher upper surface than the fifth fin-type pattern F5. That is, a height of an upper surface of the second source/drain E15 may be greater than a height of the upper surface of the fifth fin-type pattern F5. The upper surface of the second source/drain E15 may have a convex portion CV.

The convex portion CV of the upper surface of the second source/drain E15 may be formed convexly from the upper surface of the fifth fin-type pattern F5. The upper surface of the second source/drain E15 may be formed higher than the upper surface of the first source/drain E11.

The second source/drain E15 may be formed on both sides of the second gate electrode 201 and fourth gate electrode 301 in the first direction X, and on the second fin-type pattern F2, respectively. The second source/drain E15 may be source/drain regions of respective transistors on the fifth fin-type pattern F5.

The first source/drain E11 and the second source/drain E15 may include an epitaxial layer formed by epitaxy. Further, the first source/drain E11 and the second source/drain E15 may be a raised source/drain. The first region I may be a PMOS region and the second region II may be an NMOS region, and therefore the first source/drain E11 may be a SiGe epitaxial layer, for example. The second source/drain E15 may be a S1 epitaxial layer, for example. At this time, the second source/drain E15 may include Si:P highly doped with P.

The first source/drain E11 may fill the first recess F1r of the first fin-type pattern F1. Likewise, the second source/drain E15 may fill the second recess F5r of the second fin-type pattern F2. Accordingly, the first source/drain E11 and the second source/drain E15 may have a lower portion in U-shape along a bottom surface of the recesses F1r and F5r.

The first recess F1r and the second recess F5r may have a lower surface in U-shape such that their widths may gradually decrease to a depthwise direction, respectively. At this time, the decreasing degrees of widths according to the depths of the first recess F1r and the second recess F5r may be different from each other. Specifically, the decreasing degree of width according to the depth of the first recess F1r may be less than the decreasing degree of width according to the depth of the second recess F5r. Accordingly, a curved surface of the lower surface of the first recess F1r may be gentler than a curved surface of the lower surface of the second recess F5r, and the curved surface of the lower surface of the second recess F5r may be sharper than the curved surface of the lower surface of the first recess F1r.

Likewise, the first source/drain E11 and the second source/drain E15 may have a lower portion in U-shape along the bottom surface of the recesses F1r and F5r, in which case the first source/drain E11 and the second source/drain E15 may have a narrower width to a depthwise direction. Further, the decreasing degree of width according to the depth of the first source/drain E11 may be less than the decreasing degree of width according to the depth of the second source/drain E15. Accordingly, a curved surface of the lower surface of the first source/drain E11 may be gentler than a curved surface of the lower surface of the second source/drain E15, and the curved surface of the lower surface of the second source/drain E15 may be sharper than the curved surface of the lower surface of the first source/drain E11.

The first source/drain E11 may be formed on both sides of the first gate electrode 200 and the third gate electrode 300, and the regions between the first source/drains E11 on both sides with reference to the gate electrodes may be used as first channel regions. The lengths D12 of such first channel region, i.e., the distances D12 between the first source/drains E11 may be equal to one another in the first region I. However, since the lower surface of the first source/drain E11 may be formed in U-shape, the distance between the first source/drains E11 may increase in a depthwise direction. For example, in FIG. 14, the distance D12 increases to the distance D12' in a depthwise direction from the surface of the substrate 10.

The second source/drain E15 may be formed on both sides of the second gate electrode 201 and the fourth gate electrode 301, and the regions between the second source/drains E15 on both sides with reference to the gate electrodes may be used as second channel regions. The length D13 of such second channel region, i.e., the distances D13 between the second source/drains E15 may be equal to one another in the second region II. However, since the lower surface of the second source/drain E15 may be formed in U-shape, the distance between the second source/drains E15 may increase in a depthwise direction. For example, in FIG. 14, the distance D13 increases to distance D13' in a depthwise direction from the surface of the substrate 10.

A width of the first recess F1r may be greater than a width of the second width F5r. The "width" as used herein may refer to the width in the first direction X. That is, a width of the first recess F1r in the first direction X may be greater than a width of the second recess F5r in the first direction X. Accordingly, the first recess F1r may be deeper than the second recess F5r, and the first recess F1r may be wider than the second recess F5r in the first direction X. Accordingly, the first source/drain E11 may have a greater volume than the second source/drain E15. Further, a lowermost portion of the lower surface of the first source/drain E11 may be lower than a lowermost portion of the lower surface of the second source/drain E15. Further, a width of the first source/drain E11 in the first direction X may be greater than a width of the second source/drain E15 in the first direction X.

Distances between the source/drains in the first region I and the second region II, i.e., a distance D12 between the first source/drains E11 and a distance D13 between the second source/drains E15 may be different from each other. That is, the distance D12 between the first source/drains E11 may be greater than the distance D13 between the second source/drains E15. This is because the widths of the first recess F1r and the second recess F5r in the first direction X are different from each other, while the distance D1l between the first gate electrode 200 and the third gate electrode 300 and the distance D1l between the second gate electrode 201 and the fourth gate electrode 301 are equal to each other in the first direction X. That is, since a width of the first recess F1r in the first direction X may be greater than a width of the second recess F5r in the first direction X, distances between the source/drains may be different from each other in the first region I and the second region II.

Referring to FIG. 15, the first source/drain E11 may be overlapped with the gate spacer 160. Specifically, the first source/drain E11 may include an overlap region OR that overlaps with a gate spacer 160 relative to a depthwise direction of the substrate 10, and a non-overlap region NOR that does not overlap with the gate spacer 160 relative to a depthwise direction of the substrate 10.

The overlap region OR may include a region overlapping with the gate spacer 160 formed on the side surface of the first gate electrode 200, and a region overlapping with the gate spacer 160 formed on the side surface of the third gate electrode 300. That is, the overlap region OR may be separated into two regions. However, exemplary embodiments are not limited to the example given above. The overlap region OR may be present only in at least one of the two regions.

The non-overlap region NOR may be located between two overlap regions OR. The non-overlap region NOR may be formed more deeply than the overlap region OR. This is because a shape of the lower surface of the first source/drain E11 may be a U-shape.

Referring to FIG. 16, the second source/drain E15 may not be overlapped with the gate spacer 160. Specifically, the second source/drain E15 may not be overlapped with the gate spacer 160, but may be formed to be in contact with the side surface of the gate spacer 160. Accordingly, the gate spacer 160 and the second source/drain E15 may not be overlapped vertically.

That is, the first source/drain E11 in the first region I may be overlapped with the gate spacer 160, but the second source/drain E15 in the second region II may not be overlapped with the gate spacer 160.

Hereinbelow, another region of the semiconductor device according to one or more exemplary embodiments will be described with reference to FIG. 17. In the following description, description overlapped with the exemplary embodiments already provided above will not be described or described as brief as possible for the sake of brevity.

Figure 17:
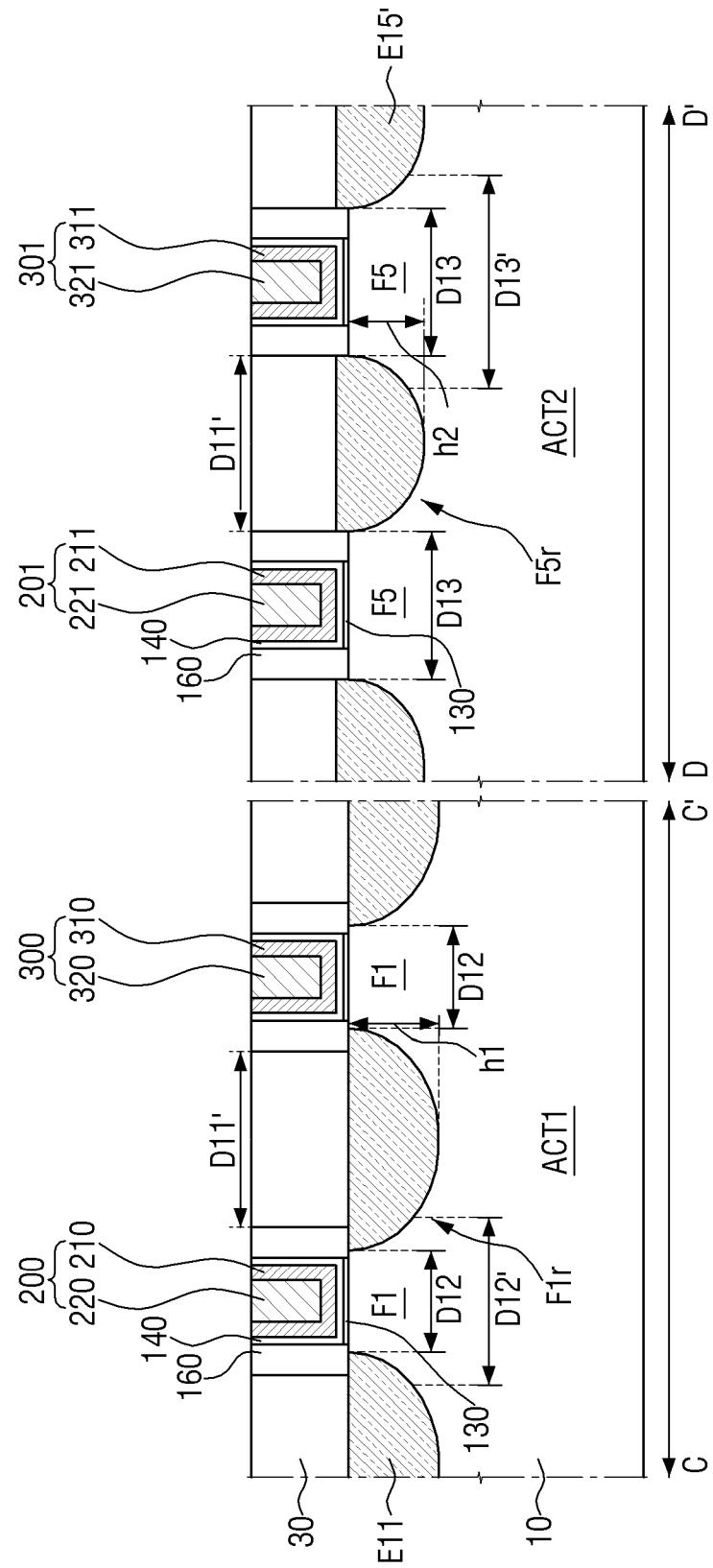
FIG. 17 is a cross sectional view for reference in describing a semiconductor device according to one or more exemplary embodiments.

FIG. 17 is a cross sectional view for reference in describing a semiconductor device according to one or more exemplary embodiments. FIG. 17 is a corresponding cross sectional view to a cross sectional view taken on lines C-C' and D-D' of FIG. 13.

Referring to FIG. 17, the upper surface of the second source/drain E15 in the second region II may be flat. That is, shape of the upper surface of the second source/drain E15 in the second region II may vary according to the distance between the gate electrodes in the first region I and the second region II, i.e., the distance between the first gate electrode 200 and the third gate electrode 300, and the distance between the second gate electrode 201 and the fourth gate electrode 301.

At this time, the distance between the gate electrodes in the first region I and the second region II, i.e., the distance D11' between the first gate electrode 200 and the third gate electrode 300, and the distance D11' between the second gate electrode 201 and the fourth gate electrode 301 may be equal to one another. The distance between the gate electrodes in the first region I and the second region II, i.e., the distance D11' between the first gate electrode 200 and the third gate electrode 300, and the distance D11' between the second gate electrode 201 and the fourth gate electrode 301 may be greater than the distance (D11 in FIG. 14) of FIG. 14 described above.

Hereinbelow, another region of the semiconductor device according to one or more exemplary embodiments will be described with reference to FIG. 18. In the following description, description overlapped with the exemplary embodiments already provided above will not be described or described as brief as possible for the sake of brevity.

Figure 18:
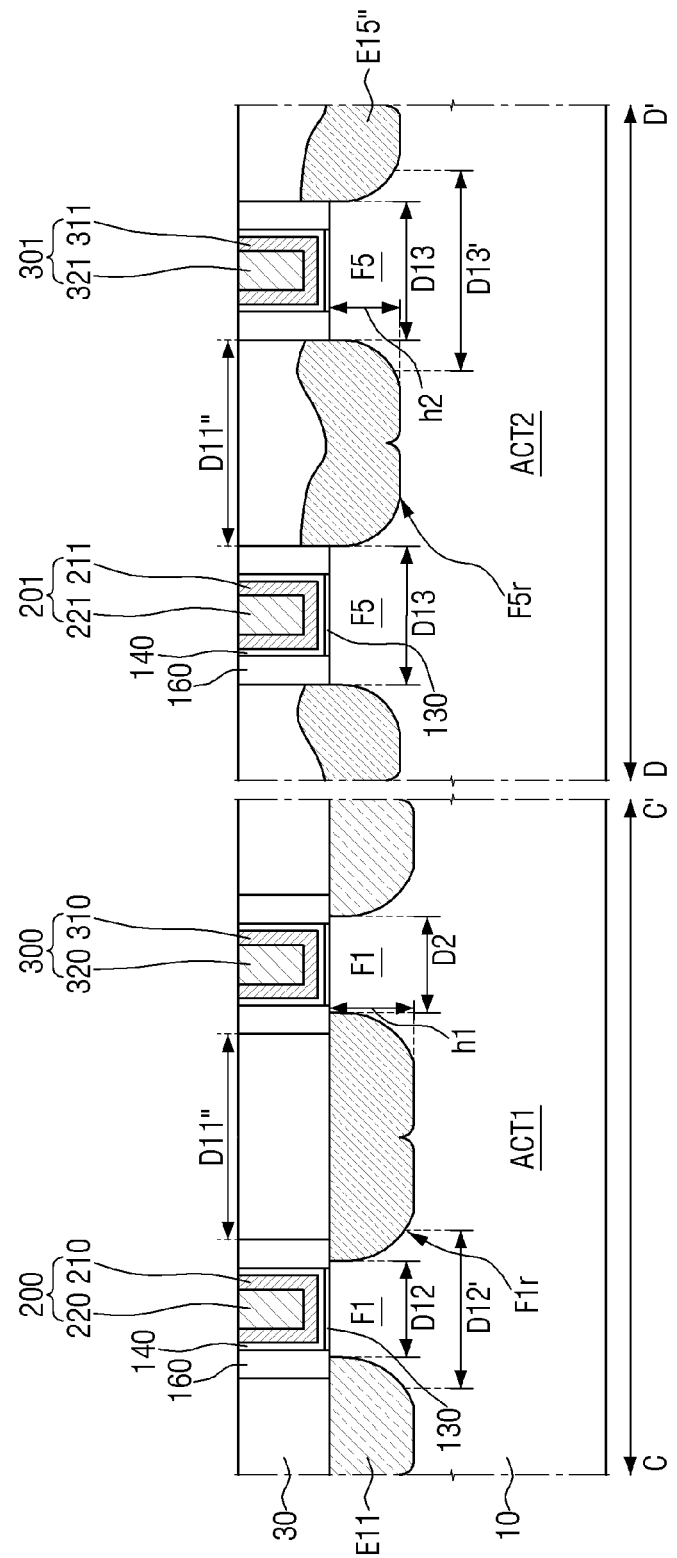
FIG. 18 is a cross sectional view for reference in describing a semiconductor device according to one or more exemplary embodiments.

FIG. 18 is a cross sectional view for reference in describing a semiconductor device according to one or more exemplary embodiments. FIG. 18 is a corresponding cross sectional view to a cross sectional view taken on lines C-C' and D-D' of FIG. 13.

Referring to FIG. 18, the upper surface of the second source/drain E15 in the second region II may have a concave portion which is depressed. That is, shape of the upper surface of the second source/drain E15 in the second region II may vary according to the distance between the gate electrodes in the first region I and the second region II, i.e., the distance between the first gate electrode 200 and the third gate electrode 300, and the distance between the second gate electrode 201 and the fourth gate electrode 301.

At this time, the distance between the gate electrodes in the first region I and the second region II, i.e., the distance D11" between the first gate electrode 200 and the third gate electrode 300, and the distance D11" between the second gate electrode 201 and the fourth gate electrode 301 may be equal to each other. The distance between the gate electrodes in the first region I and the second region II, i.e., the distance D11" between the first gate electrode 200 and the third gate electrode 300, and the distance D11" between the second gate electrode 201 and the fourth gate electrode 301 may be greater than a distance (D11 in FIG. 2) of FIG. 2 and a distance (D11' in FIG. 17) of FIG. 17 described above.

That is, as the distance between the gate electrodes gradually increases, the shape of the upper surface of the second source/drain E15 may be gradually changed from a shape including a convex portion into a flat shape and then to a shape including a concave portion. However, exemplary embodiments are not limited to the example given above.

Further, as the distance D11" between the gates increases, the shapes of the lower surface of the first recess F1r and the second recess F5r may vary. That is, instead of U-shape, the lower surface of the first recess F1r and the second recess F5r may have shapes of a W-shape or a "UU"-shape having a series of U-shapes.

Hereinbelow, another region of the semiconductor device according to one or more exemplary embodiments will be described with reference to FIGS. 19 to 21. In the following description, description overlapped with the exemplary embodiments already provided above will not be described or described as brief as possible for the sake of brevity.

Figure 19:
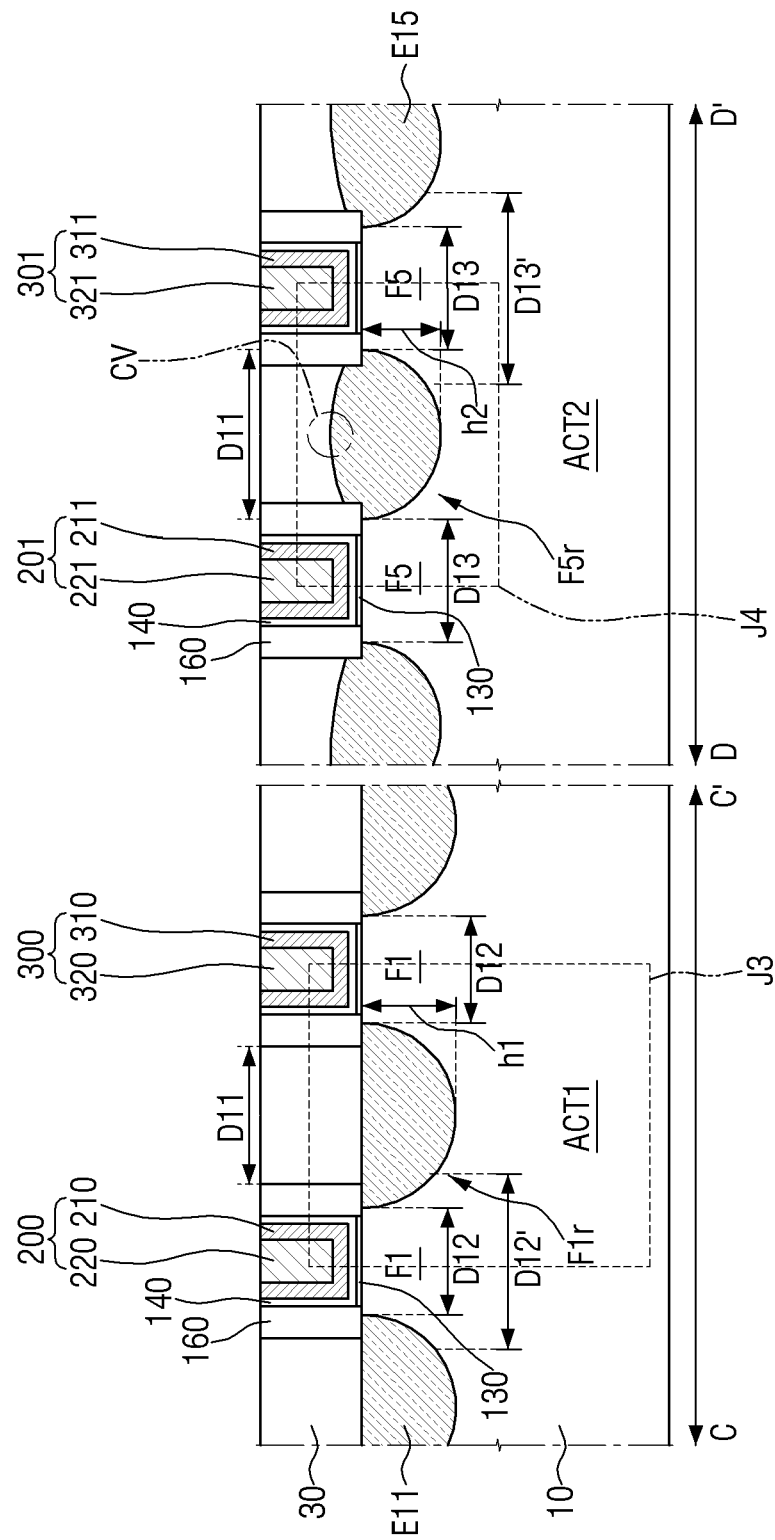
FIG. 19 is a cross sectional view for reference in describing a semiconductor device according to one or more exemplary embodiments.
Figure 20:
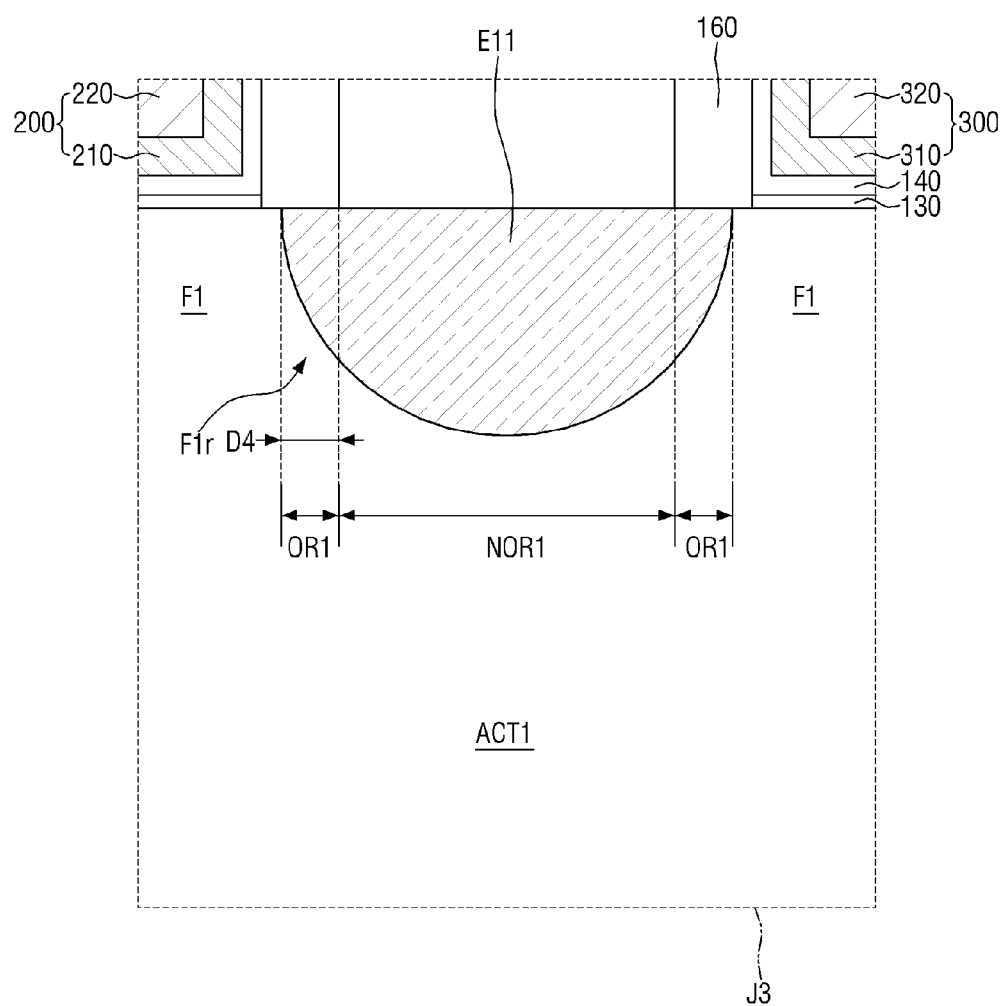
FIG. 20 is an enlarged cross sectional view for reference in describing in detail the dashed area J3 of FIG. 19.

FIG. 19 is a cross sectional view for reference in describing a semiconductor device according to one or more exemplary embodiments, and FIG. 20 is an enlarged cross sectional view for reference in describing in detail the dashed area J3 of FIG. 19. FIG. 21 is an enlarged cross sectional view for reference in describing in detail the dashed area J4 of FIG. 19.

Figure 21:
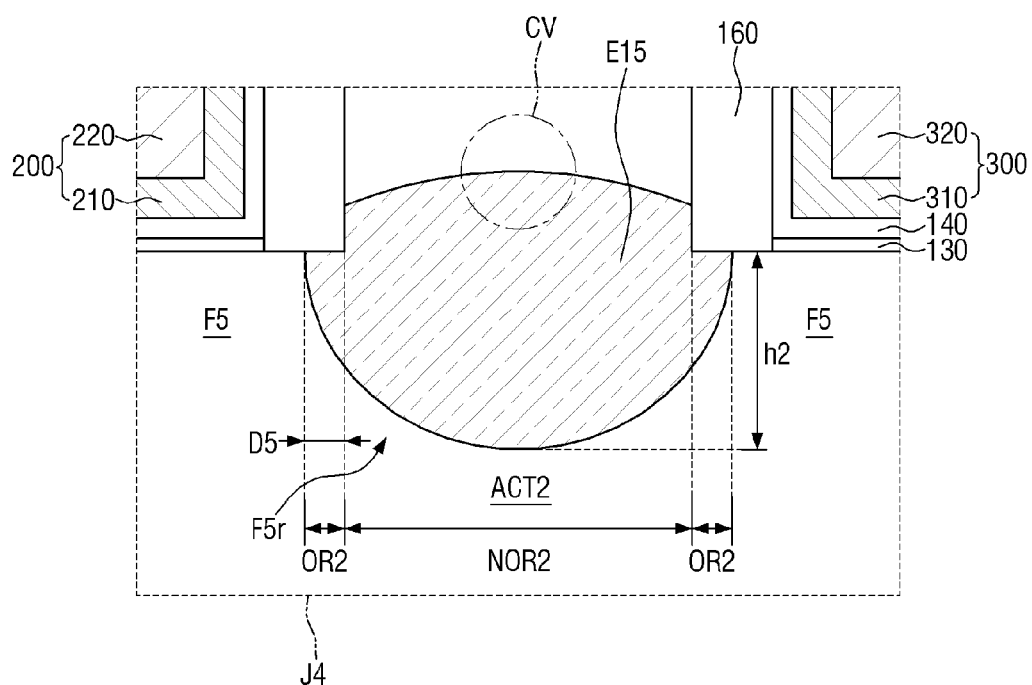
FIG. 21 is an enlarged cross sectional view for reference in describing in detail the dashed area J4 of FIG. 19.

Referring to FIGS. 19 to 21, the second source/drain E15 in the second region II of the semiconductor device according to one or more exemplary embodiments may be overlapped with a gate spacer 160.

Referring to FIG. 20, specifically, the first source/drain E11 may include a first overlap region OR1 overlapping with the gate spacer 160, and a first non-overlap region NOR1 not overlapping with the gate spacer 160.

The first overlap region OR1 may include a region overlapping with the gate spacer 160 formed on the side surface of the first gate electrode 200, and a region overlapping with the gate spacer 160 formed on the side surface of the third gate electrode 300. That is, the first overlap region OR1 may be separated into two regions. However, exemplary embodiments are not limited to the example given above. The first overlap region OR1 may be present only in at least one of the two regions.

The first non-overlap region NOR1 may be located between two first overlap regions OR1. The first non-overlap region NOR1 may be formed more deeply than the overlap region OR. This may be because a shape of the lower surface of the first source/drain E11 is a U-shape.

Referring to FIG. 21, specifically, the second source/drain E15 may include the second overlap region OR2 overlapping with a gate spacer 160, and a second non-overlap region NOR2 not overlapping with the gate spacer 160.

The second overlap region OR2 may include a region overlapping with the gate spacer 160 formed on the side surface of the first gate electrode 200, and a region overlapping with the gate spacer 160 formed on the side surface of the third gate electrode 300. That is, the second overlap region OR2 may be separated into two regions. However, exemplary embodiments are not limited to the example given above. The second overlap region OR2 may be present only in at least one of the two regions.

The second non-overlap region NOR2 may be located between two second overlap regions OR2. The second non-overlap region NOR2 may be formed more deeply than the second overlap region OR2. This may be because a shape of the lower surface of the first source/drain E11 is a U-shape.

A width D4 in the first direction X of the first overlap region OR1 in the first region I may be greater than a width D5 in the first direction X of the second overlap region OR2 in the second region II. That is, because a width of the first recess F1r where the first source/drain E11 is formed is greater than a width of the second recess F5r where the second source/drain E15 is formed, a thickness in which the first source/drain E11 is overlapped with the gate spacer 160 may be greater than a thickness in which the second source/drain E15 is overlapped with the gate spacer 160.

Hereinbelow, another region of the semiconductor device according to one or more exemplary embodiments will be described with reference to FIGS. 22 to 24. In the following description, description overlapped with the exemplary embodiments already provided above will not be described or described as brief as possible for the sake of brevity.

Figure 22:
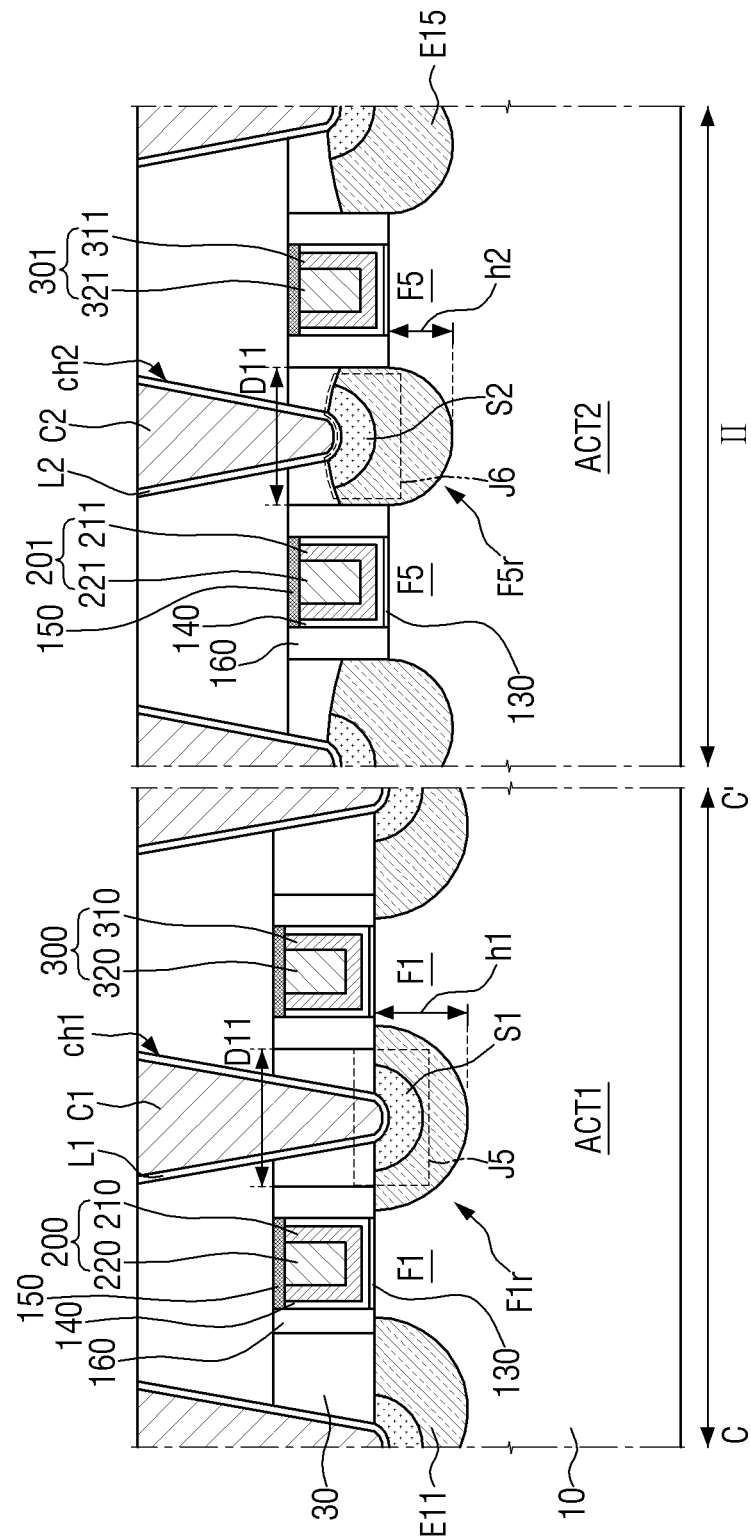
FIG. 22 is a cross sectional view for reference in describing a semiconductor device according to one or more exemplary embodiments.
Figure 23:
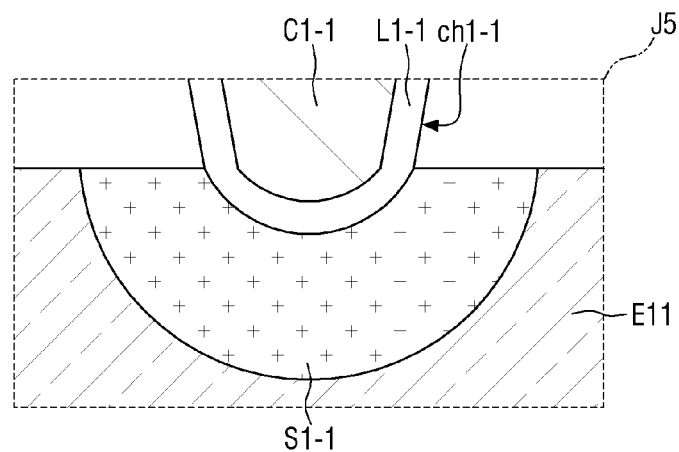
FIG. 23 is an enlarged cross sectional view of the dashed area J5 of FIG. 22.

FIG. 22 is a cross sectional view for reference in describing a semiconductor device according to one or more exemplary embodiments, and FIG. 23 is an enlarged cross sectional view of the dashed area J5 of FIG. 22. FIG. 24 is an enlarged cross sectional view of the dashed area J6 of FIG. 22. FIG. 24 is an enlarged view of the second silicide S2 of FIG. 22, in which illustration of the second contact C2 and a second barrier layer L2 is omitted for convenience.

Figure 24:
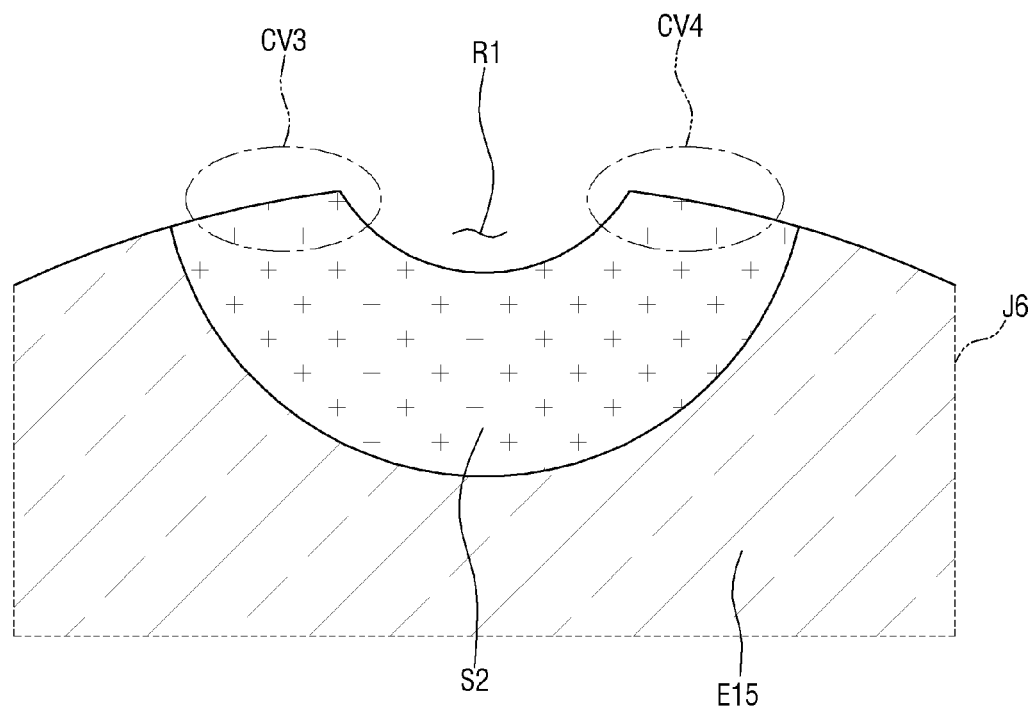
FIG. 24 is an enlarged cross sectional view of the dashed area J6 of FIG. 22.

Referring to FIGS. 22 to 24, the semiconductor device according to one or more exemplary embodiments may include a capping film 150, and the first silicide S1 and the second silicide S2 on the first source/drain E11 and the second source/drain E15, respectively.

The capping film 150 may be formed on the high-k dielectric film 140 and the first gate electrode 200. For example, the capping film 150 may include SiN. The capping film 150 may be in contact with the inner wall of the gate spacer 160. The upper surface of the capping film 150 may be on a same level as the upper surface of the gate spacer 160, but not limited thereto. The upper surface of the capping film 150 may be higher than the upper surface of the gate spacer 160.

The first and second silicides S1 and S2 may be formed on the first source/drain E11 and the second source/drain E15. The silicide may be formed, as a portion of the first source/drain E11 and the second source/drain E15 is modified. The silicide may include a metal. The metal may include at least one of, for example, Ni, Co, Pt, Ti, W, Hf, Yb, Tb, Dy, Er, Pd, and a metal alloy thereof.

The contact holes ch1 and ch2 may pass through the second interlayer insulating film 30 and the third interlayer insulating film 40 to expose at least a portion of the first and second silicides S1 and S2. The barrier layers L1 and L2 may be formed conformally along a side surface and a bottom surface of the contact holes ch1 and ch2, and the contacts C1 and C2 may be formed on the barrier layers L1 and L2 to fill the contact holes ch1 and ch2.

In this case, the first source/drain E11 and the second source/drain E15 may include a protrusion protruded further than the substrate 10, i.e., further than the surface of the first fin-type pattern F1 and the second fin-type pattern F2 to surround both sides of the first and second silicides S1 and S2.

As illustrated, the protrusion may be in such a shape that a width decreases with an increasing distance from the surface of the substrate 10.

Further, the protrusion may be in such a shape that it surrounds at least ½ of the vertical length of the first and second silicides S1 and S2. In the drawings, the protrusion is illustrated as a shape surrounding an entire side surface of the first and second silicides Si and S2, but not limited thereto.

Further, in at least a portion of the surface of the first source/drain E11 and the second source/drain E15, the first and second silicides S1 and S2 may not be formed. That is, as illustrated in FIG. 12, in regions between the first and second silicides S1 and S2 and the first to fourth gate electrodes 200, 201, 300 and 301, there may be non-silicided surfaces of the first source/drain E11 and the second source/drain E15.

The first and second silicides S1 and S2, as illustrated, may be a reversed cone type. Accordingly, a narrow tip region may be positioned downwards (towards the substrate 10), and the bottom surface may be positioned upwards (opposite direction to the substrate 10). Further, since the first and second silicides S1 and S2 have a structure in which the lower portion is narrow and becomes wider upward, the side surface may be inclined to a predetermined angle θ. The predetermined angle may be for example, 30° to 70°, but not limited thereto. More specifically, the predetermined angle may be 40° or more and 60°, but not limited thereto.

Further, tip regions of the first and second silicides S1 and S2 may be located higher than a surface of the substrate 10. By doing this, it is possible to achieve enough channel length of a transistor, and improve operating characteristic of the transistor.

The first silicide S1 may be formed on the first source/drain E11. Accordingly, the upper surface of the first silicide S1 may be flat. However, a recess may be formed by a portion in which the first contact C1 and the first barrier layer L1 are formed in the first silicide S1. That is, the upper surface of the first silicide S1 may be flat by the first source/drain E11 except a portion in which the first contact C1 and the first barrier layer L1 are formed.

A first contact hole ch1 may be formed in a part of the upper portion of the first silicide S1. That is, the recess may be formed in the part of the upper portion of the first silicide S1. The recess may be semicircular as illustrated. However, exemplary embodiments are not limited to the examples provided above, and accordingly, the recess may be quadrilateral or other shapes.

The second silicide S2 may be formed on the second source/drain E15. Accordingly, the upper surface of the second silicide S2 may be convex upward. However, a recess may be formed by a portion in which the second contact C2 and the second barrier layer L2 are formed in the second silicide S2. That is, the upper surface of the second silicide S2 may be convex upward by the second source/drain E15 except a portion in which the second contact C2 and the second barrier layer L2 are formed.

A second contact hole ch2 may be formed in a part of the upper portion of the second silicide S2. That is, the recess may be formed in the part of the upper portion of the second silicide S2. The recess may be a semicircular shape as illustrated. However, exemplary embodiments are not limited to the example given above.

Referring to FIG. 24, the second silicide S2 in the second region II may include a first silicide recess R1, a third convex portion CV3 and a fourth convex portion CV4. Since the upper surface of the second source/drain E15 be formed convexly upward, the upper surface of the second silicide S2 except the first silicide recess R1 may be a convexly upward shape.

The first silicide recess R1 may be a portion in which the second contact hole ch2 is formed. That is, the first silicide recess R1 may be a location where the second barrier layer L2 and the second contact hole C2 are formed.

That is, the third convex portion CV3 and the fourth convex portion CV4 may be formed on both sides of the first silicide recess R1. The third convex portion CV3 and the fourth convex portion CV4 may be formed by a formation of the first silicide recess R1 as the upper surface of the second source/drain E15 is convex.

Hereinbelow, another region of the semiconductor device according to one or more exemplary embodiments will be described with reference to FIGS. 22 and 25. In the following description, description overlapped with the exemplary embodiments already provided above will not be described or described as brief as possible for the sake of brevity.

Figure 25:
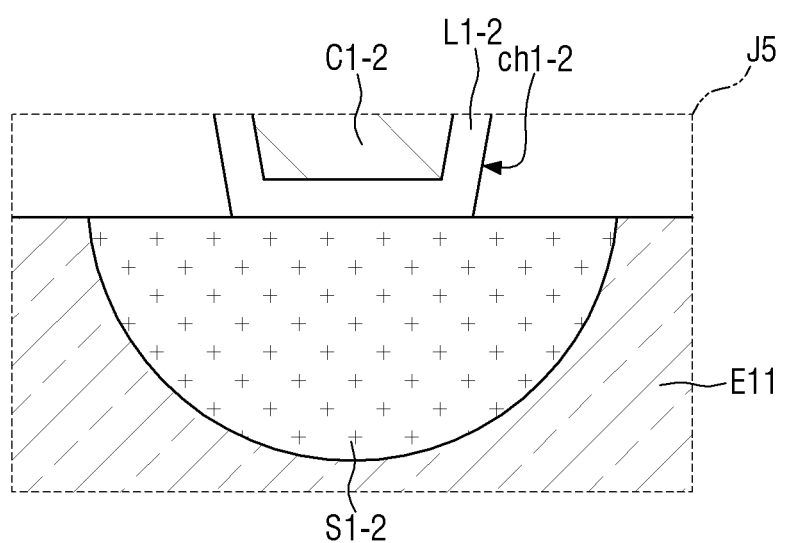
FIG. 25 is an enlarged cross sectional view for reference in describing a semiconductor device according to one or more exemplary embodiments.

FIG. 25 is an enlarged cross sectional view for reference in describing a semiconductor device according to one or more exemplary embodiments. FIG. 25 is an enlarged cross sectional view having only difference in the dashed area J5 of FIG. 22 for reference in describing exemplary embodiments.

Referring to FIGS. 22 and 25, the first silicide S1-2 may be formed on the first source/drain E11. The first silicide S1-2 may be formed by changing the upper portion of the first source/drain E11. A lower portion of the first silicide S1-2 may be in a U-shape. However, exemplary embodiments are not limited to any specific example only. Accordingly, various shapes may be contemplated depending on silicidation process. The first contact hole ch1-2 may be formed on the upper portion of the first silicide S1-2. The first contact hole ch1-2 may pass through the second interlayer insulating film 30, and expose the upper surface of the first silicide S1-2.

The upper surface of the first silicide S1-2 may not be recessed by the first contact hole ch1-2. Accordingly, the upper surface of the first silicide S1-2 may be flat. Contacting the first contact hole ch1-2 to the first silicide S1-2 may cause the first barrier layer L1-2 and the first contact C1-2 to be in contact with the first silicide S1-2. Accordingly, the upper surface of the first silicide S1-2 may maintain a flat shape.

Hereinbelow, another region of the semiconductor device according to one or more exemplary embodiments will be described with reference to FIGS. 26 and 27. In the following description, description overlapped with the exemplary embodiments already provided above will not be described or described as brief as possible for the sake of brevity.

Figure 26:
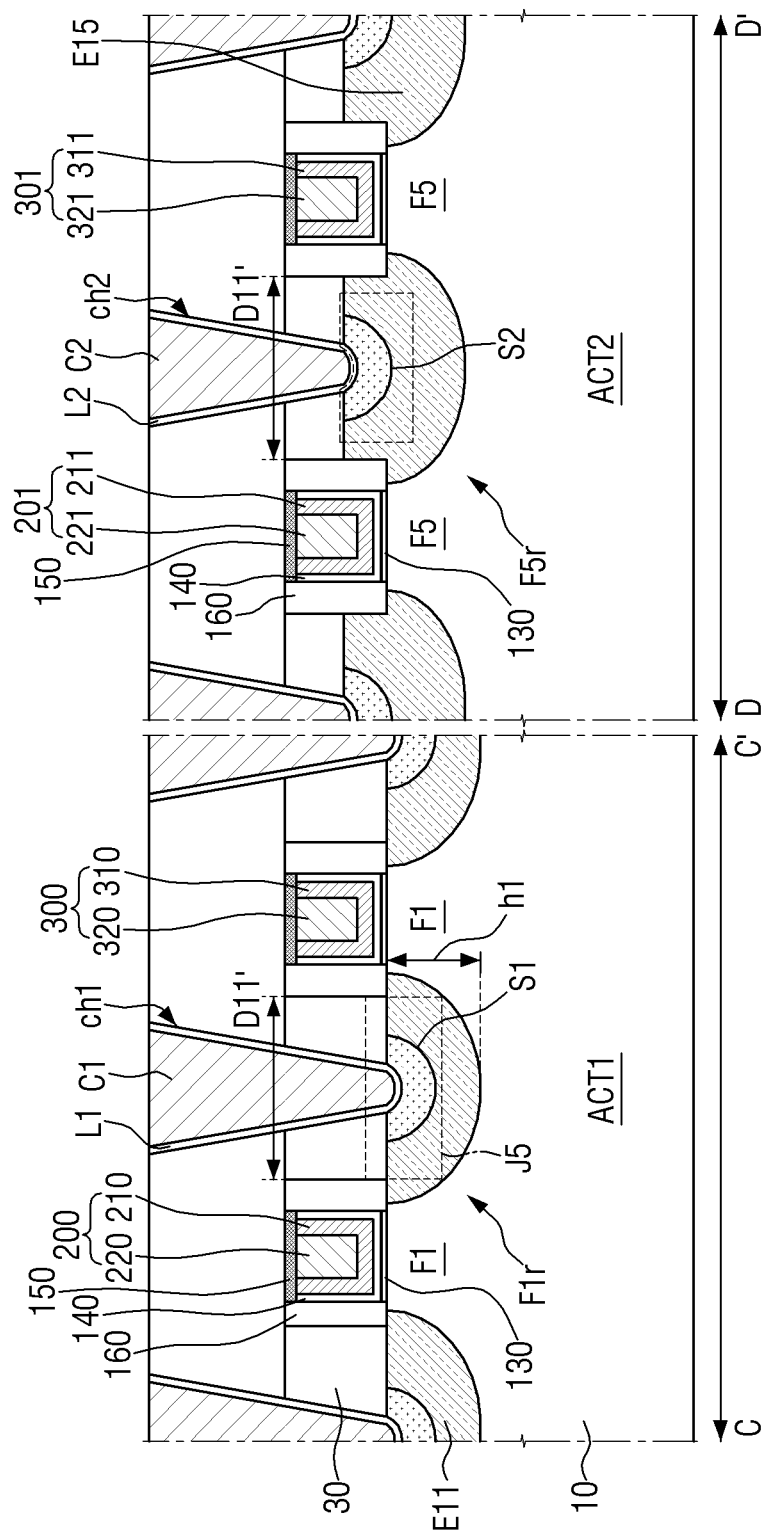
FIG. 26 is a cross sectional view for reference in describing a semiconductor device according to one or more exemplary embodiments.
Figure 27:
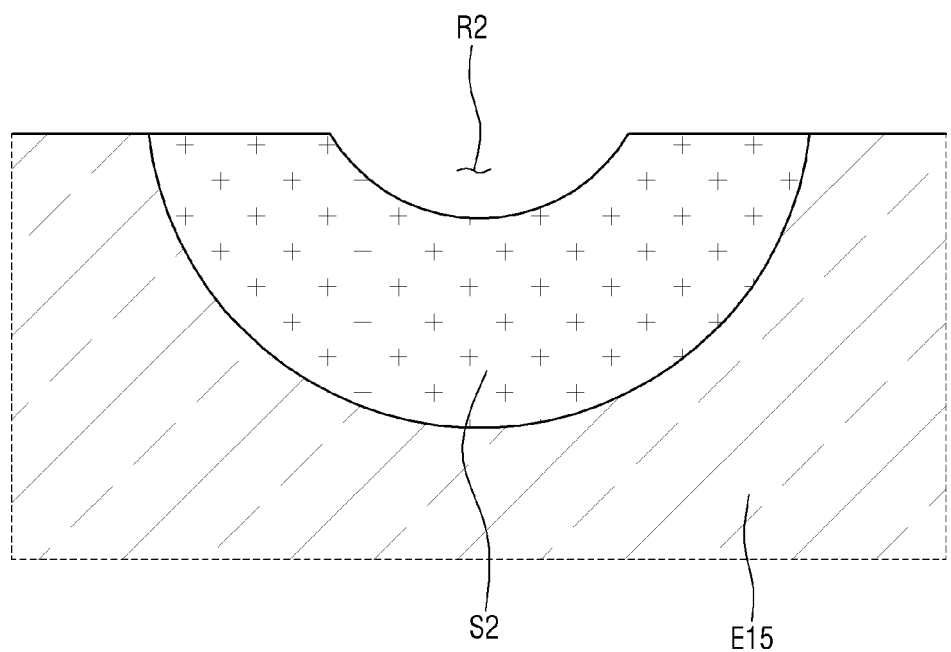
FIG. 27 is an enlarged cross sectional view for reference in describing the silicide portion in the second region of FIG. 26.

FIG. 26 is a cross sectional view for reference in describing a semiconductor device according to one or more exemplary embodiments, and FIG. 27 is an enlarged cross sectional view for reference in describing the silicide portion in the second region of FIG. 26. FIG. 27 is an enlarged view of the second silicide S2 of the FIG. 26, in which illustration of the second contact C2 and a second barrier layer L2 is omitted for convenience.

Referring to FIGS. 26 and 27, the second source/drain E15 of the semiconductor device according to one or more exemplary embodiments may include a flat upper surface overlapping with a gate spacer 160.

That is, the second silicide S2 in the second region II may include the second silicide recess R2. Since the upper surface of the second source/drain E15 be formed in flat, the upper surface of the second silicide S2 except the second silicide recess R2 may be in a flat shape.

The second silicide recess R2 may be a portion in which the second contact hole ch2 is formed. That is, the second silicide recess R2 may be a location where the second barrier layer L2 and the second contact hole C2 are formed.

Hereinbelow, another region of the semiconductor device according to one or more exemplary embodiments will be described with reference to FIGS. 28 and 29. In the following description, description overlapped with the exemplary embodiments already provided above will not be described or described as brief as possible for the sake of brevity. FIG. 29 is an enlarged view of the second silicide S2 of FIG. 28, in which illustration of the second contact C2 and a second barrier layer L2 is omitted for convenience.

Figure 28:
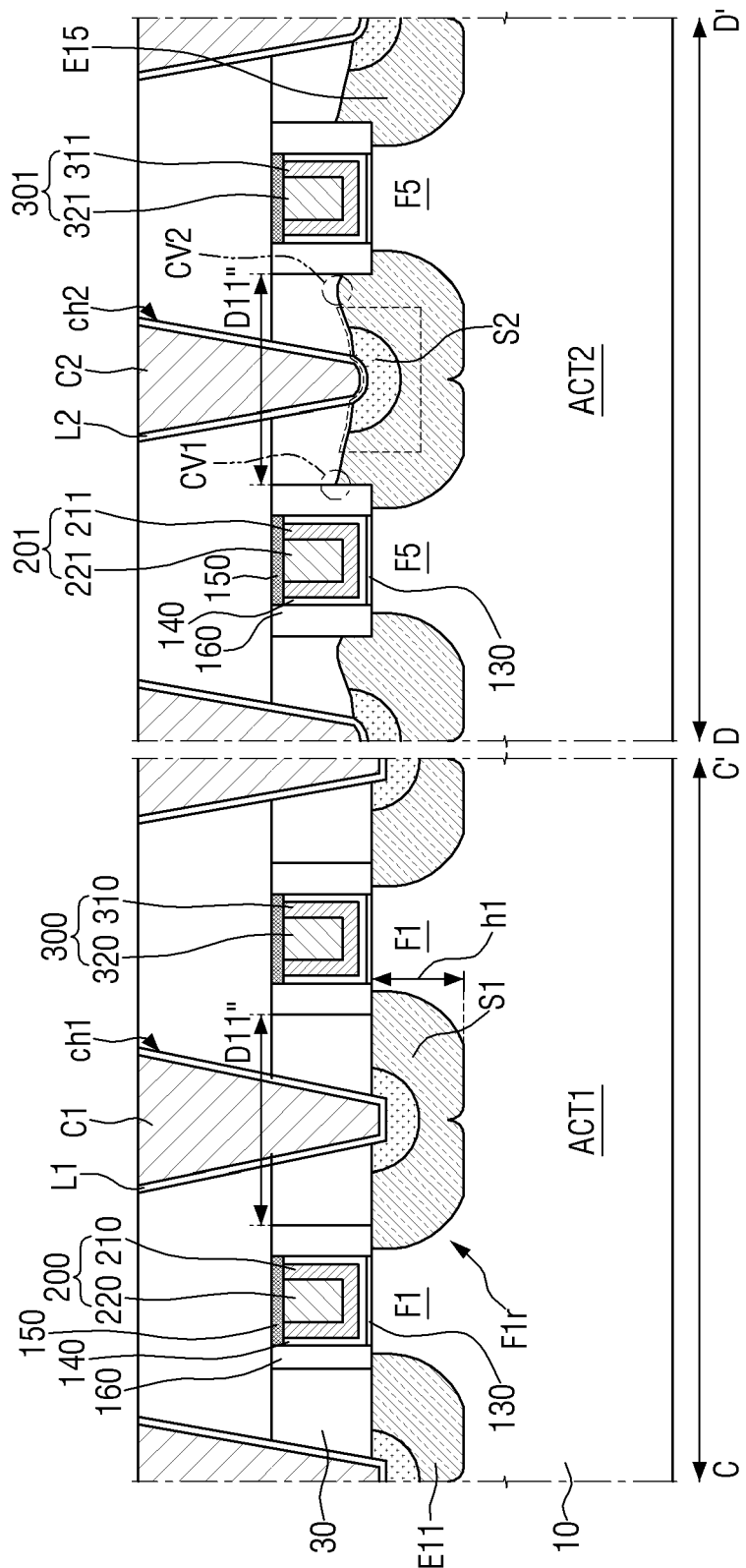
FIG. 28 is a cross sectional view for reference in describing a semiconductor device according to one or more exemplary embodiments.
Figure 29:
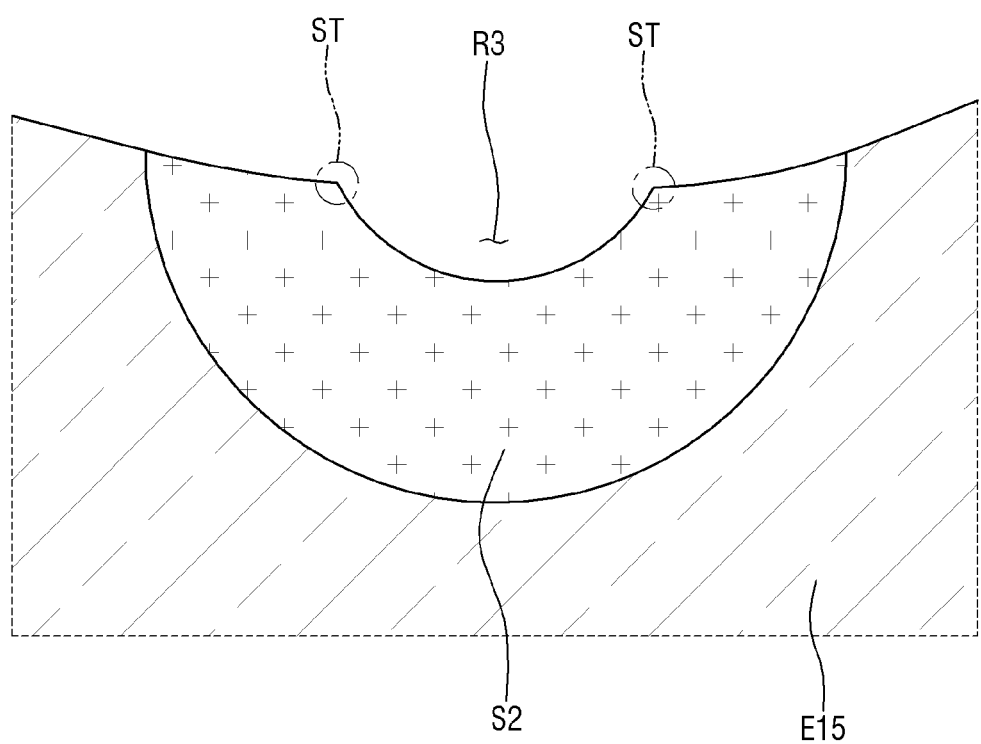
FIG. 29 is an enlarged cross sectional view for reference in describing the silicide portion in the second region of FIG. 28.

FIG. 28 is a cross sectional view for reference in describing a semiconductor device according to one or more exemplary embodiments, and FIG. 29 is an enlarged cross sectional view for reference in describing the silicide portion in the second region of FIG. 28.

Referring to FIGS. 28 and 29, the second silicide S2 in the second region II may include the third silicide recess R3 and two stepped portions ST. Since the upper surface of the second source/drain E15 be formed convexly downwards, the upper surface of the second silicide S2 including the third silicide recess R3 may be in a convexly-downward shape.

The third silicide recess R3 may be a portion in which the second contact hole ch2 is formed. That is, the third silicide recess R3 may be a location where the second barrier layer L2 and the second contact hole C2 are formed.

That is, the stepped portion ST may be formed on both sides of the third silicide recess R3. The stepped portion ST may be a portion in which a slope is sharply changed by the third silicide recess R3. That is, the upper surface of the second source/drain E15 is convex downward, but a stepped portion may be formed as a slope of the third silicide recess R3 is more sharply convex downward. However, exemplary embodiments are not limited to any specific example only. Accordingly, a second contact C2 and a second barrier layer L2 may also be formed without recess.

Hereinbelow, another region of the semiconductor device according to one or more exemplary embodiments will be described with reference to FIGS. 13, 30 and 31. In the following description, description overlapped with the exemplary embodiments already provided above will not be described or described as brief as possible for the sake of brevity.

Figure 30:
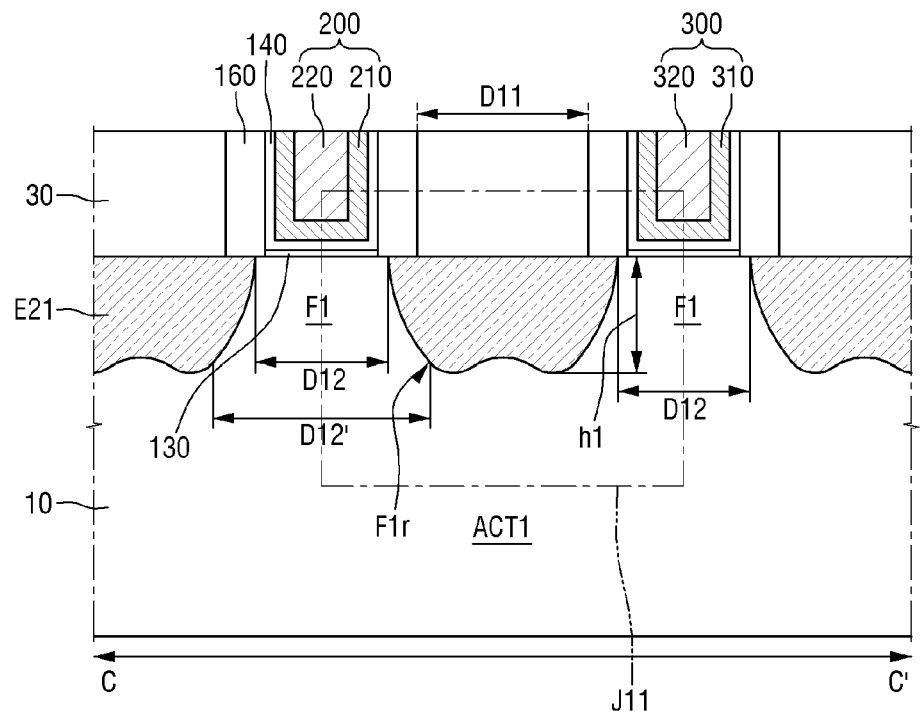
FIG. 30 is a cross sectional view for reference in describing a semiconductor device according to one or more exemplary embodiments.

FIG. 30 is a cross sectional view taken on line C-C' of FIG. 13. FIG. 31 is an enlarged cross sectional view for reference in describing in detail the dashed area J11 of FIG. 30.

Figure 31:
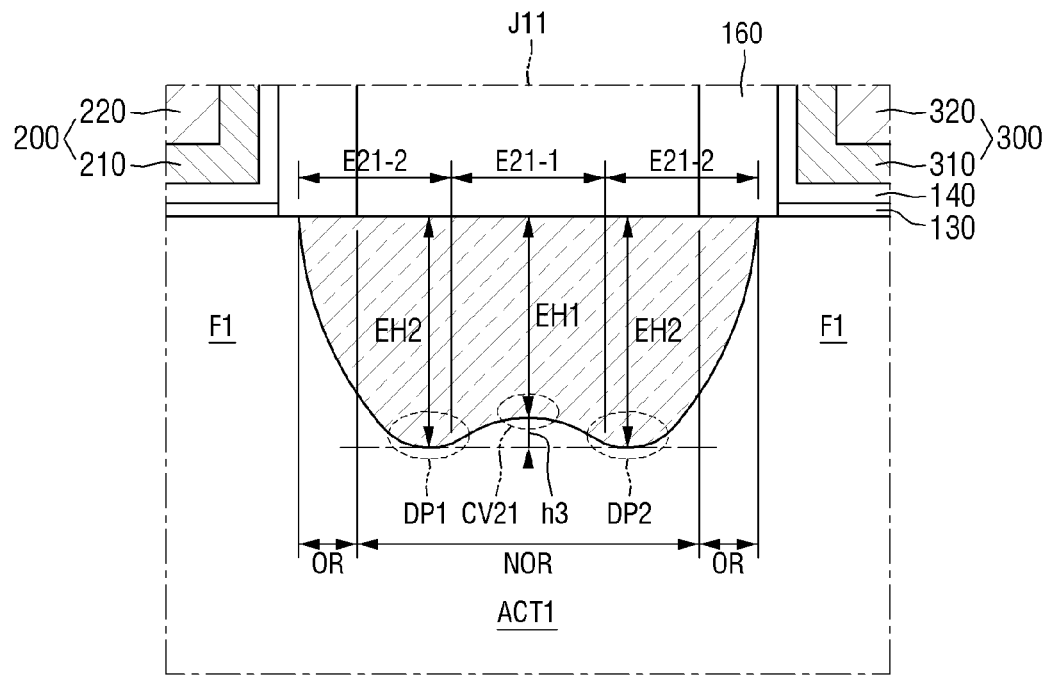
FIG. 31 is an enlarged cross sectional view for reference in describing in detail the dashed area J11 of FIG. 30.

Referring to FIGS. 13, 30 and 31, a semiconductor device according to one or more exemplary embodiments may include a first source/drain E21.

The first source/drain E21 may be formed on either side of the first gate electrode 200 and third gate electrode 300 in the first direction X, and on the first fin-type pattern F1, respectively. The first source/drain E21 may be source/drain regions of respective transistors on the first fin-type pattern F1.

The first source/drain E21 in the first region I may be formed so as to fill a first recess F1r formed on an upper surface of the first fin-type pattern F1. At this time, since a first gate electrode 200 and a third gate electrode 300 are formed in the portion in which no first recess F1r is formed on the upper surface of the first fin-type pattern F1, the first source/drain E21 may be formed between the first gate electrode 200 and the third gate electrode 300.

The first source/drain E21 may have a same upper surface as the first fin-type pattern F1. That is, a height of an upper surface of the first source/drain E21 may be equal to a height of the upper surface of the first fin-type pattern F1. The upper surface of the first source/drain E21 may be flat. A portion of the upper surface of the first source/drain E21 may be overlapped with a portion of a lower surface of the gate spacer 160.

The first source/drain E21 may include an epitaxial layer formed by epitaxy. Further, the first source/drain E21 may be a raised source/drain. The first active region ACT1 may be a PMOS region, and therefore the first source/drain E21 may be a SiGe epitaxial layer, for example. The first source/drain E21 may fill the first recess F1r of the first fin-type pattern F1. Accordingly, the first source/drain E21 may have a lower portion in a W-shape along a bottom surface of the first recess F1r. In some exemplary embodiments, the first source/drain E21 may have a lower portion of W-shape or UU-shape having a series of U-shapes according to a formation of the first recess F1r.

Likewise, the first source/drain E21 may have a width gradually decreasing in a depthwise direction. The first source/drain E21 may be formed on both sides of the first gate electrode 200 and the third gate electrode 300, and the regions between the first source/drains E21 on both sides with reference to the gate electrodes may be used as first channel regions. The lengths D12 of such first channel regions, i.e., the distances D12 between the first source/drains E21 may be equal to one another in the first active region ACT1. However, a distance between confronting side surfaces of the first source/drains E21 may gradually increase in the depthwise direction. For example, in FIG. 30, the distance D12 between the first source/drains E21 increases to a distance D12' on a depthwise direction of the substrate 10.

Referring to FIG. 31, the first source/drain E21 may be overlapped with the gate spacer 160. Specifically, the first source/drain E21 may include an overlap region OR overlapping with a gate spacer 160, and a non-overlap region NOR not overlapping with the gate spacer 160.

The overlap region OR may include a region overlapping with the gate spacer 160 formed on the side surface of the first gate electrode 200, and a region overlapping with the gate spacer 160 formed on the side surface of the third gate electrode 300. That is, the overlap region OR may be separated into two regions. However, exemplary embodiments are not limited to the example given above. The overlap region OR may be present only in at least one of the two regions.

The non-overlap region NOR may be located between two overlap regions OR. The non-overlap region NOR may be formed more deeply than the overlap region OR.

The bottom surface of the first recess F1r may include a first dimple DP1 and a second dimple DP2. The first dimple DP1 and the second dimple DP2 may be in a convexly-downward shape. The first dimple DP1 and the second dimple DP2 may include a first convex portion CV11 therebetween. That it, a first dimple DP1 and a second dimple DP2 may be formed on opposite sides of the first convex portion CV11. A height of the lowermost portion of the first dimple DP1 and the second dimple DP2 may be the same.

The first source/drain E21 may fill the first recess F1r. The first source/drain E21 may include a first region E21-1 and a second region E21-2. The first region E21-1 may be located between two second regions E21-2. That is, the second region E21-2 may be located on opposite sides of the first region E21-1.

The first region E21-1 may be a region that is overlapped with the first convex portion CV11 of the first recess F1r. The second region E21-2 may be regions that are overlapped with the first dimple DP1 and the second dimple DP2 of the first recess F1r, respectively. That is, a lower surface of the second region E21-2 may be in a U-shape. The thickness EH1 of the first region E21-1 may be thinner than the thickness EH2 of the second region E21-2. Specifically, since the upper surface of the first source/drain E21 is flat, the difference between the thickness EH1 of the first region E21-1 and the thickness EH2 of the second region E21-2 may be caused by the first dimple DP1, the second dimple DP2, and the first convex portion CV11.

A slope of the lower surface of the first source/drain E21 may be continuous. That is, the lower surface of the first source/drain E21 may be formed with only curve surface, and a corner may be not formed. That is, a slope of the surface of the first dimple DP1, the second dimple DP2 and the first convex portion CV11 may be all continuous, and respective connection portions thereof may also have a continuous slope. However, exemplary embodiments are not limited to the example given above.

Hereinbelow, a semiconductor device according to one or more exemplary embodiments will be described with reference to FIGS. 13, 32 and 33. In the following description, description overlapped with the exemplary embodiments already provided above will not be described or described as brief as possible for the sake of brevity.

Figure 32:
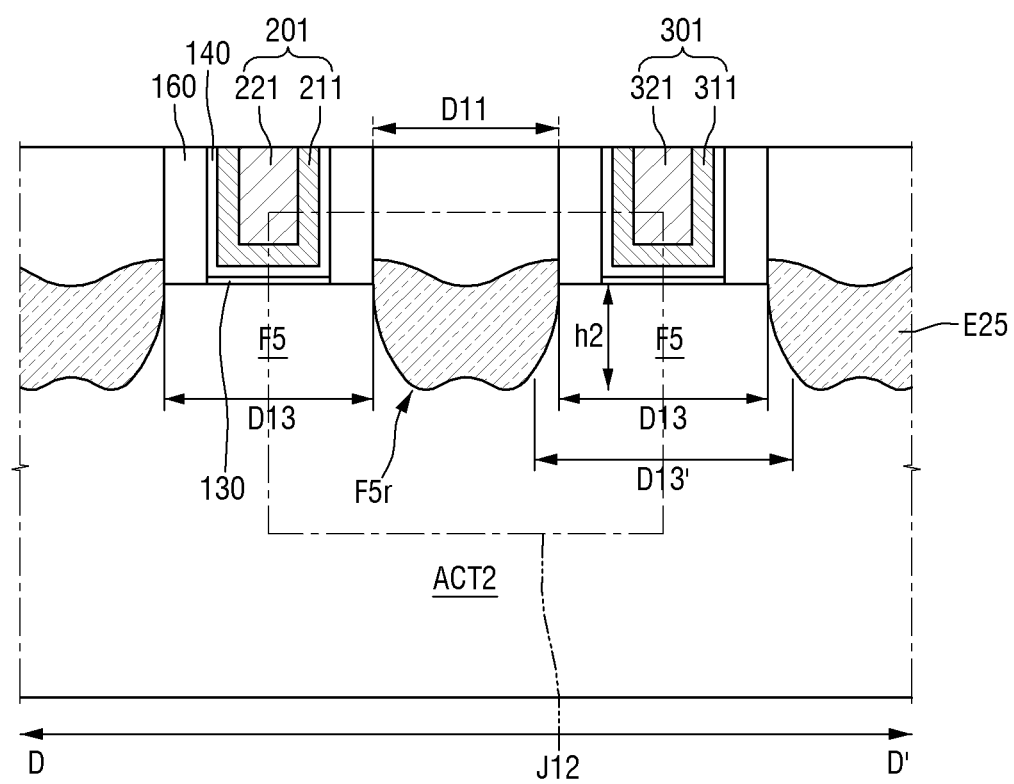
FIG. 32 is a cross sectional view for reference in describing a semiconductor device according to one or more exemplary embodiments.
Figure 33:
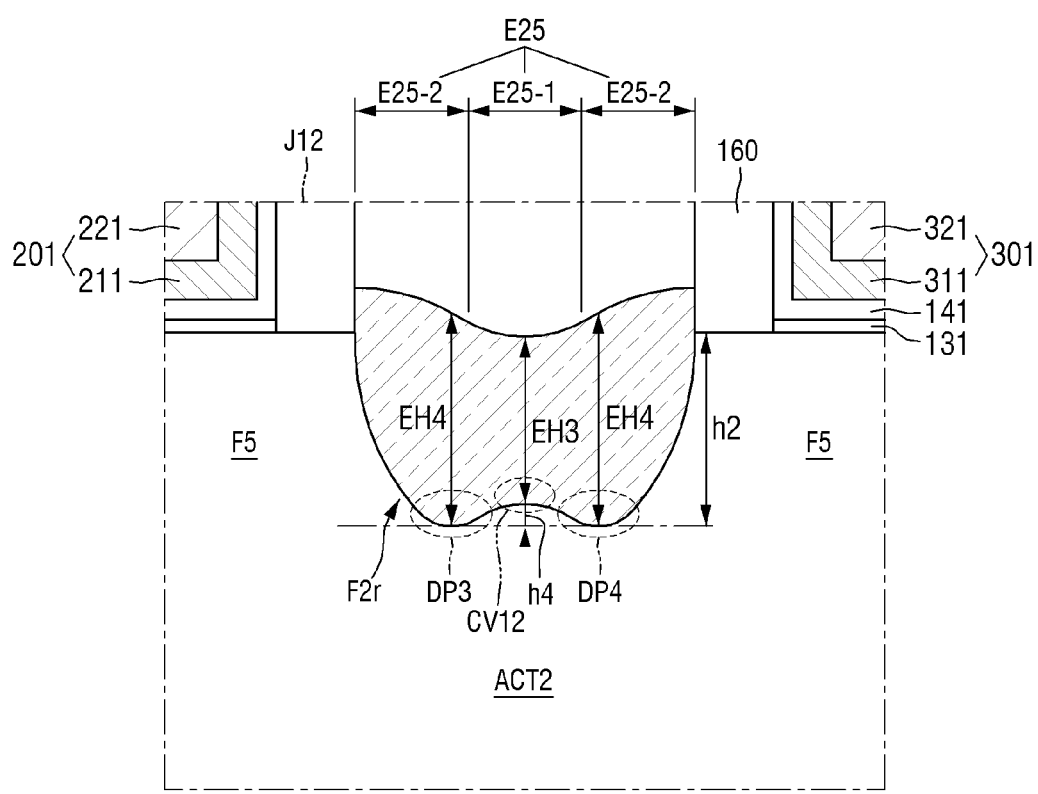
FIG. 33 is an enlarged cross sectional view for reference in describing in detail the dashed area J12 of FIG. 32.

FIG. 32 is a cross sectional view taken on line D-D' of FIG. 13, and FIG. 33 is an enlarged cross sectional view for reference in describing in detail the encircled section J12 of FIG. 32.

Referring to FIGS. 13, 32 and 33, the second source/drain E25 may be formed on both sides of the second gate electrode 201 and fourth gate electrode 301 in the first direction X, and on the second fin-type pattern F5, respectively. The second source/drain E25 may be source/drain regions of respective transistors on the second fin-type pattern F5.

The second source/drain E25 may have a higher upper surface than the second fin-type pattern F5. Accordingly, a height of an upper surface of the second source/drain E25 may be greater than that of the upper surface of the second fin-type pattern F5.

The second source/drain E25 may be formed on both sides of the second gate electrode 201 and fourth gate electrode 301 in the first direction X, and on the second fin-type pattern F5, respectively. The second source/drain E25 may be source/drain regions of respective transistors on the second fin-type pattern F5.

The second source/drain E25 may include an epitaxial layer formed by epitaxy. Further, the second source/drain E25 may be a raised source/drain. The second active region ACT2 may be an NMOS region, and therefore the second source/drain E25 may be a Si epitaxial layer. At this time, the second source/drain E25 may include SiC, Si:P highly doped with P, or SiPC.

The second source/drain E25 may fill the second recess F5r of the second fin-type pattern F5. Accordingly, the second source/drain E25 may have a lower portion in a W-shape along a bottom surface of the second recess F5r. In some exemplary embodiments, the first source/drain E21 may have a lower portion of W-shape or UU-shape having a series of U-shapes according to a formation of the first recess F1r.

Likewise, the second source/drain E25 may have a width gradually decreasing in the depthwise direction. The second source/drain E25 may be formed on both sides of the second gate electrode 201 and the fourth gate electrode 301, and the regions between the second source/drains E25 on both sides with reference to the gate electrodes may be used as second channel regions. The length D13 of such second channel region, i.e., the distances D13 between the second source/drains E25 may be equal to one another in the second region II. However, since the lower surface of the second source/drain E25 may be formed in U-shape, the distance between the second source/drains E25 may become wider in the depthwise direction. That is, the distance D13 between the second source/drains E25 may become a wider distance D13' on a deeper level.

Referring to FIG. 33, the second source/drain E25 may not be overlapped with the gate spacer 160.

The bottom surface of the second recess F5r may include a third dimple DP3 and a fourth dimple DP4. The third dimple DP3 and the fourth dimple DP4 may be in a convexly-downward shape. The third dimple DP3 and the fourth dimple DP4 may include a second convex portion CV12 therebetween. That is, a third dimple DP3 and a fourth dimple DP4 may be formed on opposite sides of the second convex portion CV12. A height of the lowermost portion of the third dimple DP3 and the fourth dimple DP4 may be the same.

The second source/drain E25 may fill the second recess F5r. The second source/drain E25 may include a first region E25-1 and a second region E25-2. The first non-overlap region E25-1 may be located between two first regions E25-2. That is, the first region E25-2 may be located on opposite sides of the first region E25-1.

The upper surface of the first region E25-1 may be convex downward. The second region may be convex upward. The upper surfaces of the first region E25-1 and first region E25-2 may be continuous. That is, the upper surface of the second source/drain may include the upper surface dimple that is convex downward, and the upper surface dimple may be formed in the first region E25-1. The first region E25-2 may be in a shape such that it E25-2 is tilted toward the first region E25-1 by the upper surface dimple of the first region E25-1.

The uppermost portion of the first region E25-2 may be formed higher than the lower surfaces of the second gate electrode 201 and the fourth gate electrode 301. A slope of the lower surface of the second source/drain E25 may be continuous. That is, the lower surface of the second source/drain E25 may be formed with only curve surface, and a corner may be not formed. In other words, a slope of the surface of the third dimple DP3, the fourth dimple DP4 and the second convex portion CV12 may be all continuous, and respective connection portions thereof may also have a continuous slope. However, exemplary embodiments are not limited to the example given above.

The first region E25-1 may be a region that is overlapped with the second convex portion CV12 of the second recess F5r. The first region E25-2 may be regions that are overlapped with the third dimple DP3 and the fourth dimple DP4 of the second recess F5r, respectively. That is, a lower surface of the first region E25-2 may be in a U-shape. The thickness EH3 of the first region E25-1 may be thinner than the thickness EH4 of the first region E25-2.

Hereinbelow, a semiconductor device according to one or more exemplary embodiments will be described with reference to FIGS. 13, and 30 to 34. In the following description, description overlapped with the exemplary embodiments already provided above will not be described or described as brief as possible for the sake of brevity.

Figure 34:
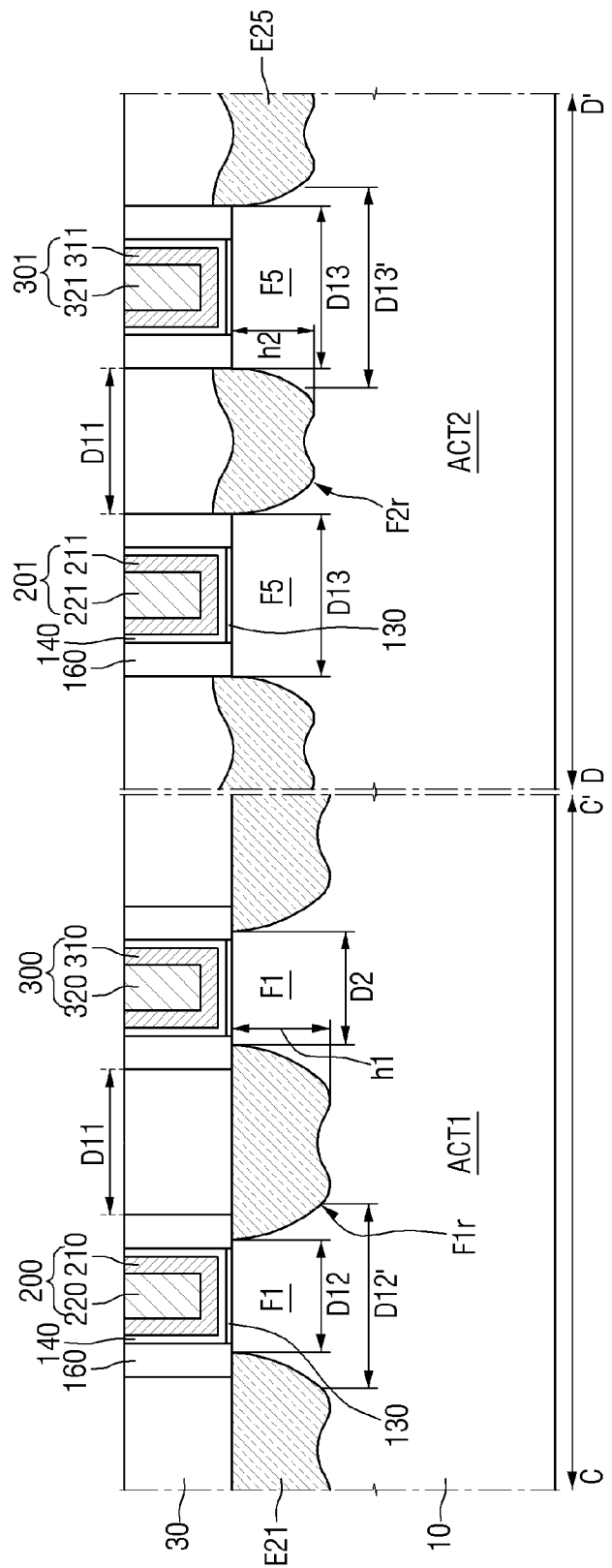
FIG. 34 is a cross sectional view for comparing FIG. 30 to FIG. 32.

FIG. 34 is a comparative cross sectional view taken on lines C-C' and D-D' of FIG. 13.

The first source/drain E21 and the second source/drain E25 may have a width gradually decreasing according to the depth, respectively. Further, the decreasing degree of width according to the depth of the first source/drain E21 may be less than the decreasing degree of width according to the depth of the second source/drain E25.

A width of the first recess F1r may be greater than a width of the second width F5r. The "width" as used herein may refer to the width in the first direction X. That is, a width of the first recess F1r in the first direction X may be greater than a width of the second recess F5r in the first direction X. Accordingly, the first recess F1r may be deeper than the second recess F5r, and the first recess F1r may be wider than the second recess F5r in the first direction X. Accordingly, the first source/drain E21 may have a greater volume than the second source/drain E25. Further, a lowermost portion of the lower surface of the first source/drain E21 may be lower than a lowermost portion of the lower surface of the second source/drain E25. Further, a width of the first source/drain E21 in the first direction X may be greater than a width of the second source/drain E25 in the first direction X.

A height of an interface in which the first source/drain E21 and the first fin-type pattern F1 meet in the first region I may be less than that of an interface in which the second source/drain E25 and the second fin-type pattern F5 meet in the second region II. That is, the lower surface of the first source/drain E21 may be lower than the lower surface of the second source/drain E25.

The upper surface of the second fin-type pattern F5 in the second region II may be higher than the upper surface of the first fin-type pattern F1 in the first region I. As such, the width of the upper surface of the second fin-type pattern F5 in the second region II may be less than that of the upper surface of the first fin-type pattern F1 in the first region I.

Referring to FIGS. 31 and 33, the height h3 of the first convex portion CV11 may be lower than the height h4 of the second convex portion CV12. That is, the height of the convex portion in the NMOS region and the PMOS region may be different from each other. In other words, the height of the first convex portion CV11 in the PMOS region may be lower than that of the second convex portion CV12 in the NMOS.

Hereinbelow, a semiconductor device according to one or more exemplary embodiments will be described with reference to FIGS. 35 and 36. In the following description, description overlapped with the exemplary embodiments already provided above will not be described or described as brief as possible for the sake of brevity.

Figure 35:
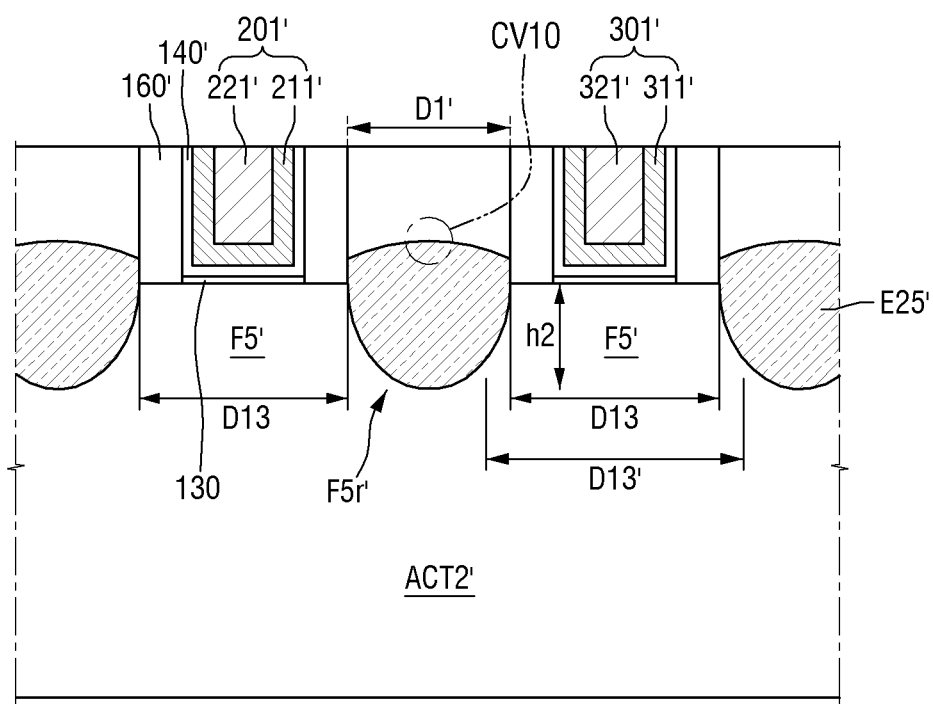
FIG. 35 is a cross sectional view for reference in describing a semiconductor device according to one or more exemplary embodiments.
Figure 36:
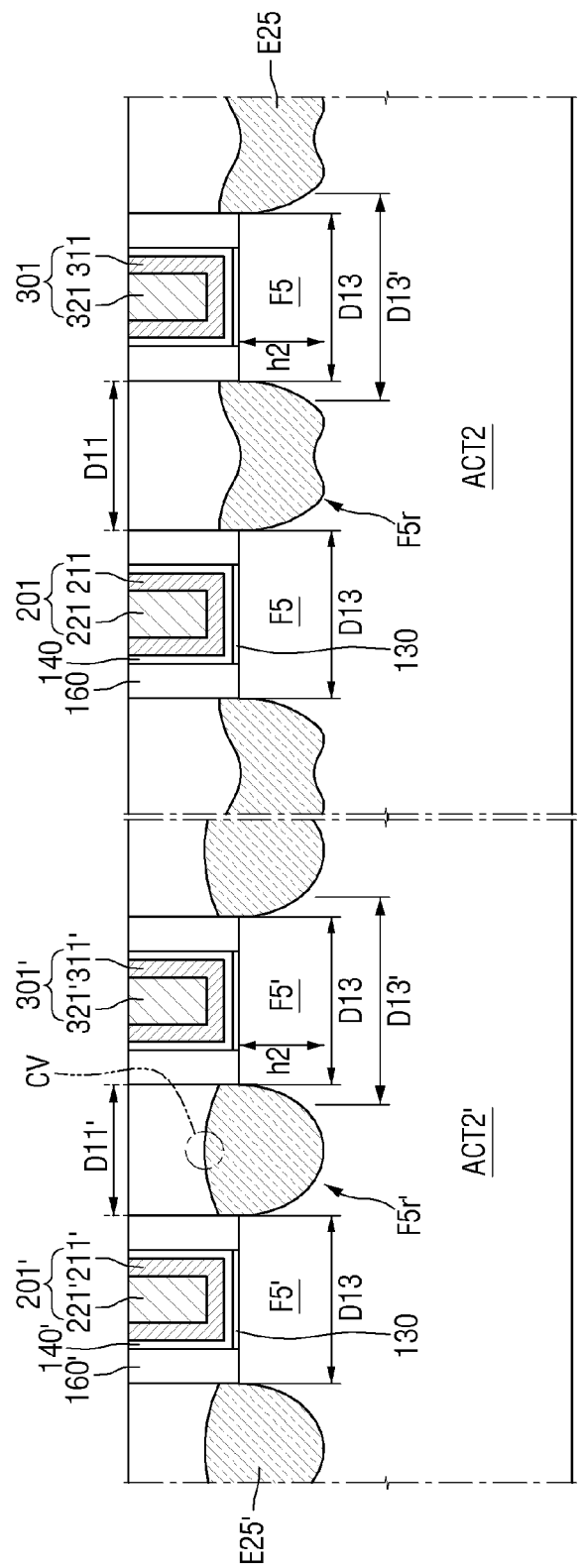
FIG. 36 is a cross sectional view for reference in describing a semiconductor device according to one or more exemplary embodiments.

FIG. 35 is a cross sectional view for reference in describing a semiconductor device according to one or more exemplary embodiments, and FIG. 36 is a cross sectional view for reference in describing a semiconductor device according to one or more exemplary embodiments.

Referring to FIG. 35, the semiconductor device according to one or more exemplary embodiments includes a third active region ACT2' that is similar to the second active region ACT2.

The third source/drain E25' in the third region ACT2' may be formed so as to fill a third recess F5r' formed on an upper surface of the third fin-type pattern F5'. At this time, since the fifth gate electrode 201' and the sixth gate electrode 301' are formed in a portion in which no third recess F5r' is formed on the upper surface of the third fin-type pattern F5', the third source/drain E25 may be formed between the fifth gate electrode 201' and the sixth gate electrode 301'.

The third source/drain E25' may have a higher upper surface than the third fin-type pattern F5'. Accordingly, a height of an upper surface of the third source/drain E25' may be greater than that of the upper surface of the third fin-type pattern F5'. The upper surface of the third source/drain E25' may have a convex portion CV10.

The convex portion CV10 of the upper surface of the third source/drain E25' may be formed convexly from the upper surface of the third fin-type pattern F5'. The third source/drain E25' may be formed on either side of the fifth gate electrode 201' and of the sixth gate electrode 301' in the first direction X, and on the third fin-type pattern F5, respectively. The second source/drain E25 may be source/drain regions of respective transistors on the second fin-type pattern F5.

The third source/drain E25' may fill the second recess F1r' of the third fin-type pattern F5'. Likewise, the third source/drain E25' may fill the third recess F5r' of the third fin-type pattern F5'. Accordingly, the third source/drain E25' may have a lower portion in a U-shape along a bottom surface of the third recess F5r'. The third recess F5r' may have a lower surface in U-shape such that their widths may gradually decrease in the depthwise direction, respectively.

Hereinbelow, a semiconductor device according to one or more exemplary embodiments will be described with reference to FIG. 37. In the following description, description overlapped with the exemplary embodiments already provided above will not be described or described as brief as possible for the sake of brevity.

Figure 37:
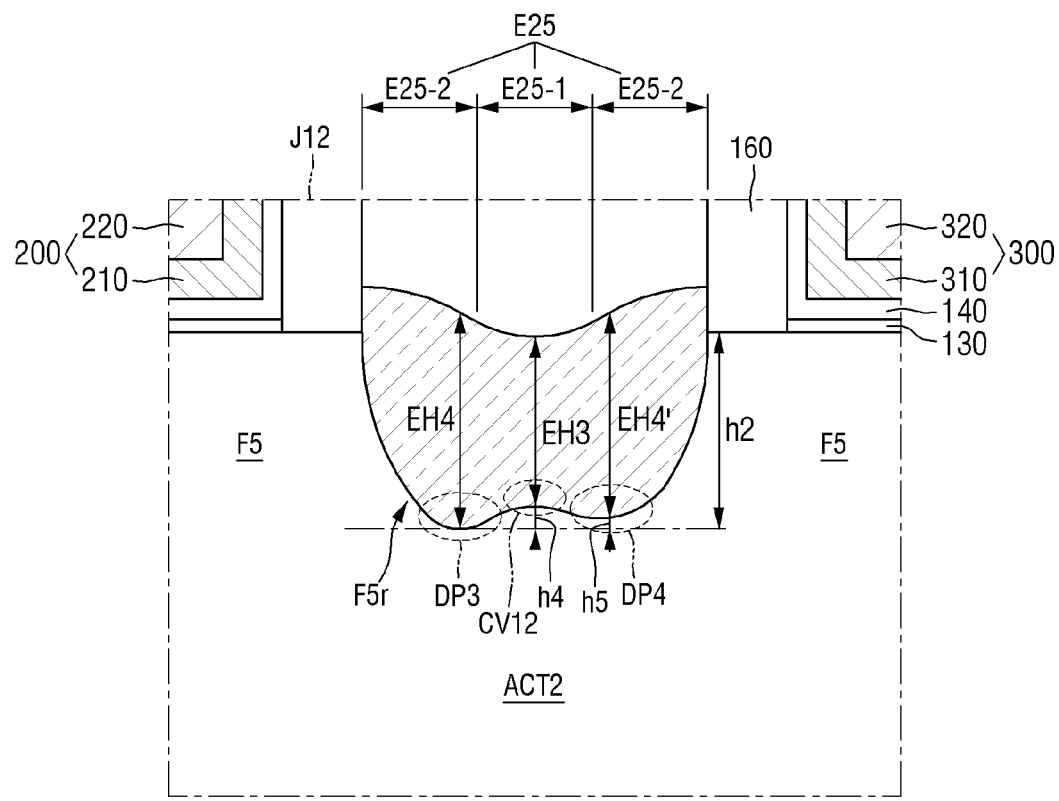
FIG. 37 is a cross sectional view for reference in describing a semiconductor device according to one or more exemplary embodiments.

FIG. 37 is a cross sectional view for reference in describing a semiconductor device according to one or more exemplary embodiments. FIG. 37 corresponds to the dashed area J12 of FIG. 32

Referring to FIG. 37, the third dimple DP3 and the fourth dimple DP4 may be in different shapes from each other. A height of a lowermost portion of the third dimple DP3 may be less than a height of the lowermost portion of the fourth dimple DP4. Accordingly, thicknesses of the second region E25-2 of the second source/drain E25 may be different from each other. Specifically, the thickness EH4 of the second region E25-2 formed on the third dimple DP3 and the thickness EH4' of the second region E25-2 formed on the fourth dimple DP4 may be different from each other.

However, the thicknesses EH4, EH4' of the second region E25-2 may be greater than the thickness EH3 of the first region E25-1.

Hereinbelow, a method for fabricating a semiconductor device according to one or more exemplary embodiments will be described with reference to FIGS. 32 and 38 to 44. In the following description, description overlapped with the exemplary embodiments already provided above will not be described or described as brief as possible for the sake of brevity.

FIGS. 38 to 44 are views illustrating intermediate stages of fabrication, for reference in describing a method for fabricating a semiconductor device according to one or more exemplary embodiments. The semiconductor device fabricated based on FIGS. 38 to 44 corresponds to the semiconductor device of FIG. 32.

Figure 38:
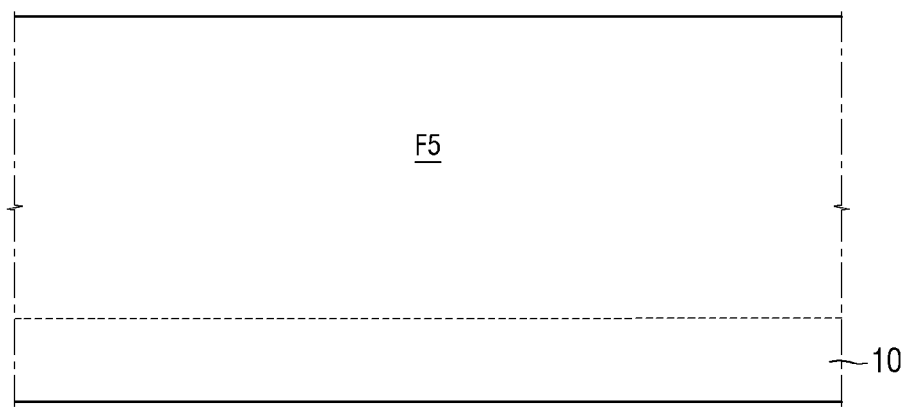
FIGS. 38, 39, 40, 41, 42, 43 and 44 are views illustrating stages of fabrication, for reference in describing a fabricating method of a semiconductor device according to one or more exemplary embodiments.

First, referring to FIG. 38, a second fin-type pattern F5 protruding from the substrate 10 is formed.

The second fin-type pattern F5 may be formed by etching a portion of the substrate 10, and may include an epitaxial layer grown on the substrate 10. The second fin-type pattern F5 may include an element semiconductor material such as silicon or germanium, for example. Further, the second fin-type pattern F5 may include a compound semiconductor such as, for example, IV-IV group compound semiconductor or III-V group compound semiconductor.

Figure 39:
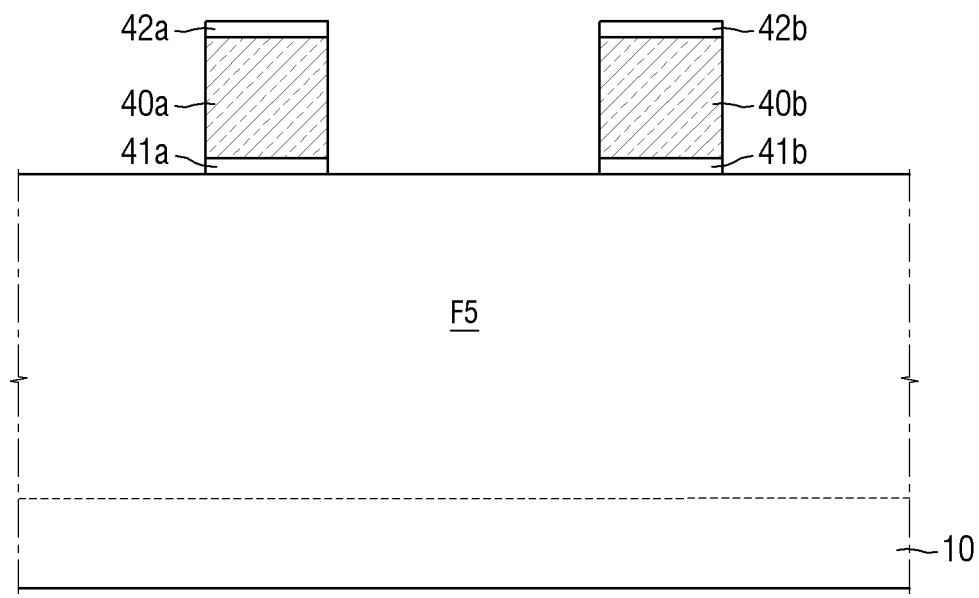

Next, referring to FIG. 39, first dummy gate structures 40a, 41a and 42a and second dummy gate structures 40b, 41b and 42b may be formed on the second fin-type pattern F5.

The first dummy gate structures 40a, 41a and 42a may include a first dummy gate insulating film 41a, a first dummy gate electrode 40a and a first gate capping film 42a.

The second dummy gate structures 40b, 41b and 42b may include the second dummy gate insulating film 41b, the second dummy gate electrode 40b and the second gate capping film 42b. The first dummy gate structures 40a, 41a and 42a may form a structure in which the first dummy gate insulating film 41a, the first dummy gate electrode 40a and the first gate capping film 42a are sequentially stacked. The second dummy gate structures 40b, 41b and 42b may form a structure in which the second dummy gate insulating film 41b, the second dummy gate electrode 40b and the second gate capping film 42b are sequentially stacked.

Figure 40:
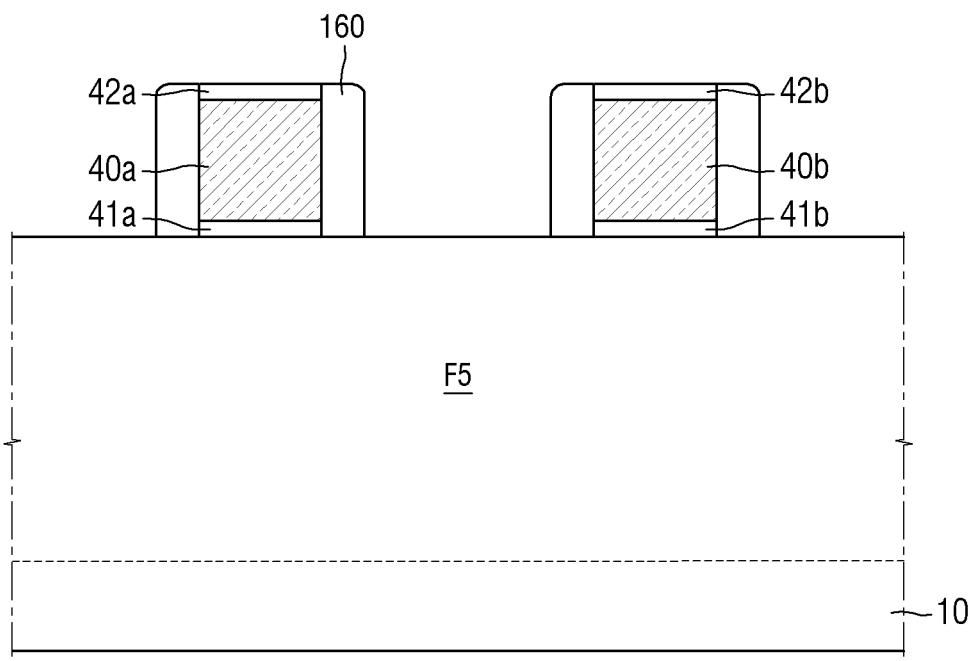

Next, referring to FIG. 40, a gate spacer 160 is formed on both sides of the first dummy gate structures 40a, 41a and 42a and the second dummy gate structures 40b, 41b and 42b.

The gate spacer 160 may be disposed on a sidewall of the first dummy gate structures 40a, 41a, 42a and second dummy gate structures 40b, 41b, 42b extending in the second direction Y.

Figure 41:
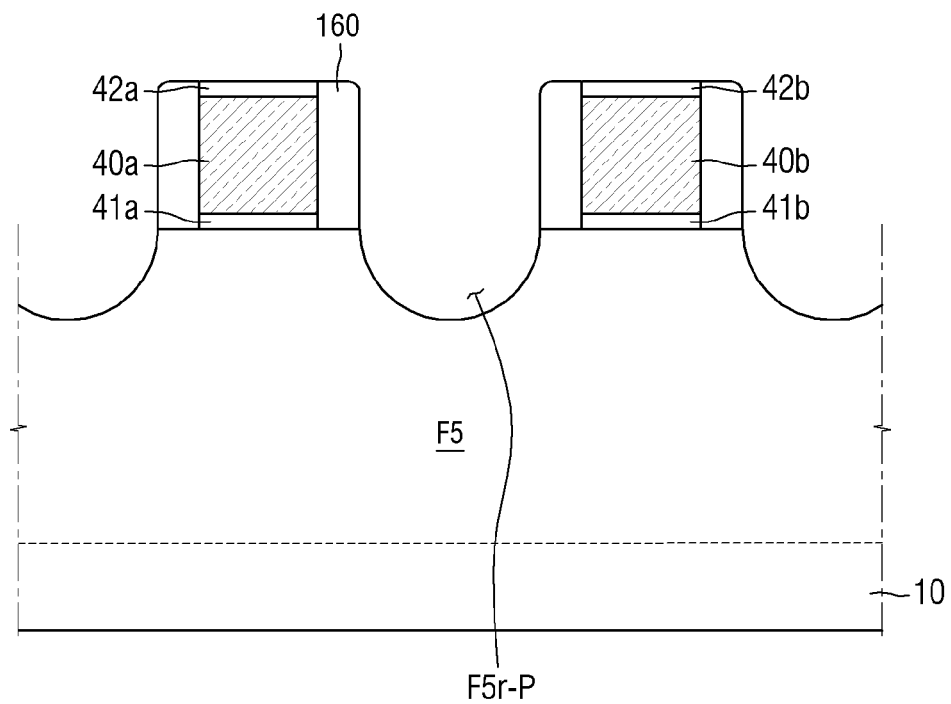

Next, referring to FIG. 41, a pre-recess F5r-P is formed using the first dummy gate structures 40a, 41a and 42a, the second dummy gate structures 40b, 41b and 42b, and the gate spacer 160 as a mask.

The pre-recess F5r-P may have a U-shaped bottom surface. The pre-recess F5r-P may not be overlapped with the gate spacer 160. The process for fabricating the pre-recess F5r-P may be performed by isotropic etching. However, exemplary embodiments are not limited to the example given above.

The pre-recess F5r-P may make approximate shape of the recess by isotropic etching, but intended size or fine shape may not be completed by this etching. Accordingly, additional etching process may be necessary.

Figure 42:
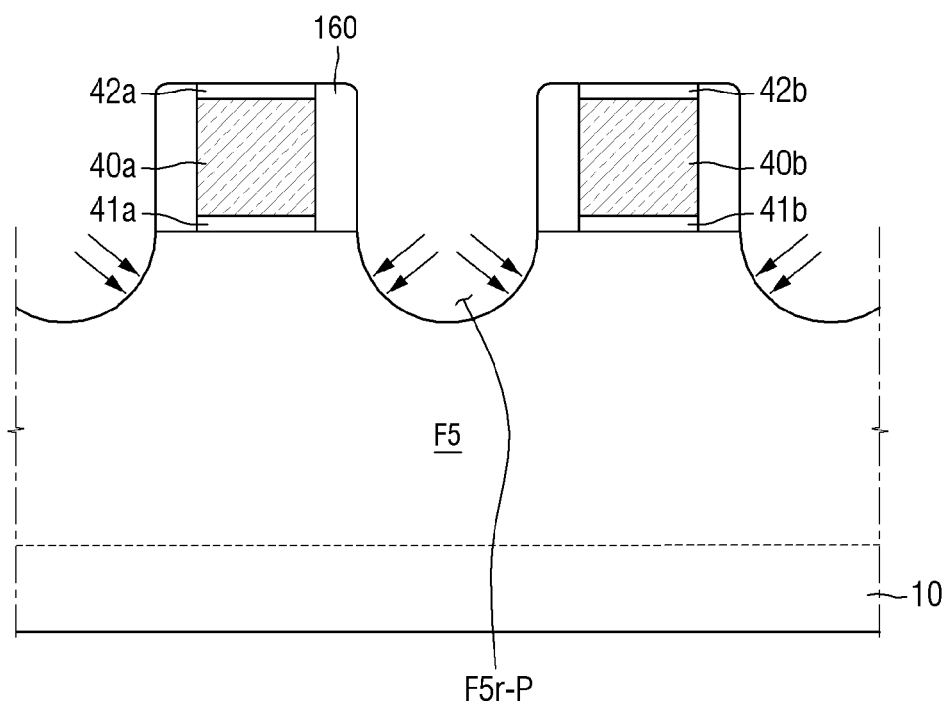
Figure 43:
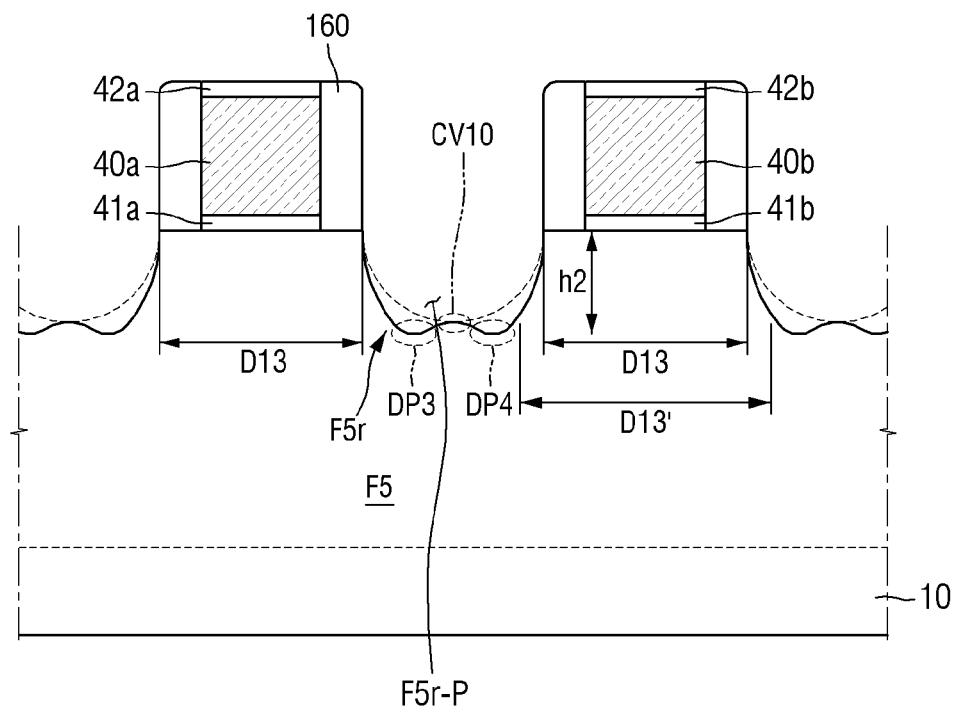

Next, referring to FIGS. 42 and 43, a third dimple DP3 and a fourth dimple DP4 may be formed by etching both side surfaces of the pre-recess F5r-P.

According to the second process following the forming of the pre-recess F5r-P, which forms the third dimple DP3 and the fourth dimple DP4, the recess filled with the source/drain may be formed in the desired size. That is, using the pre-recess F5r-P, an etching process of a large frame may be performed, and the second recess F5r may be completed by the additional second etching process.

Figure 44:
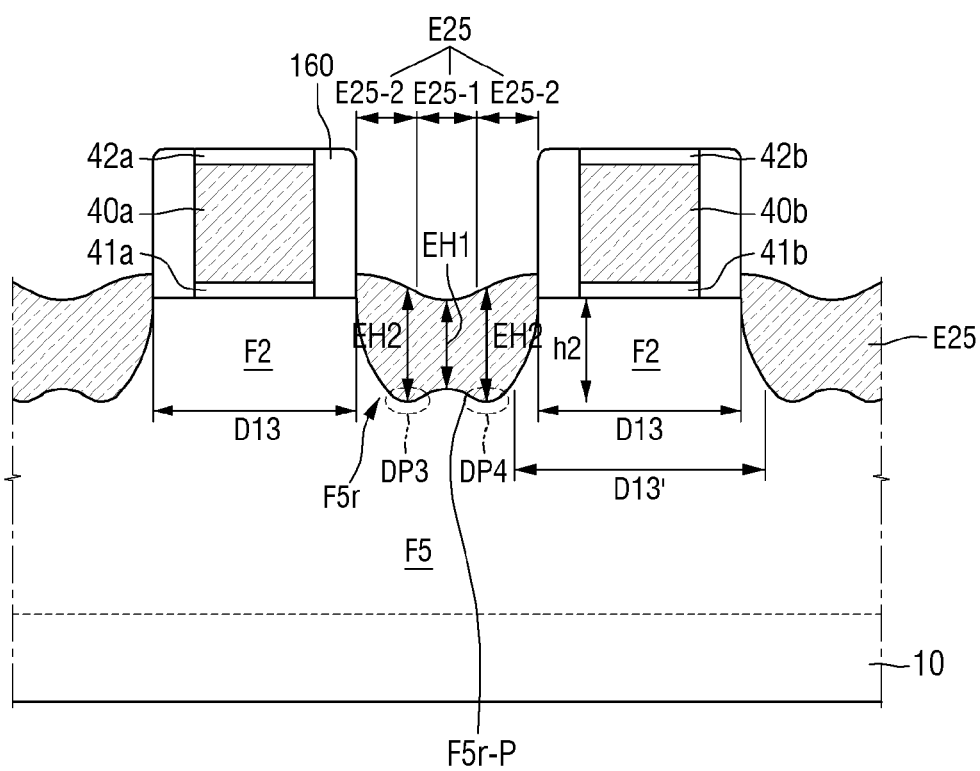

Next, referring to FIG. 44, a second source/drain E25 for filling the second recess F5r may be formed.

The second source/drain E25 may have a higher upper surface than the second fin-type pattern F5. Accordingly, a height of an upper surface of the second source/drain E25 may be greater than that of the upper surface of the second fin-type pattern F5.

The second source/drain E25 may include an epitaxial layer formed by epitaxy. Further, the second source/drain E25 may be a raised source/drain. The second active region ACT2 may be an NMOS region, and therefore the second source/drain E25 may be a Si epitaxial layer. At this time, the second source/drain E25 may include SiC, Si:P highly doped with P, or SiPC.

The second source/drain E25 may fill the second recess F5r of the second fin-type pattern F5. Accordingly, the second source/drain E25 may have a lower portion in a W-shape along a bottom surface of the second recess F5r. In some exemplary embodiments, the first source/drain E21 may have a lower portion of W-shape or UU-shape having a series of U-shapes according to a formation of the first recess F1r.

Likewise, the second source/drain E25 may have a width gradually decreasing in the depthwise direction. The second source/drain E25 may be formed on both sides of the third gate electrode 201 and the fourth gate electrode 301, and the regions between the second source/drains E25 on both sides with reference to the gate electrodes may be used as second channel regions. The length D13 of such second channel region, i.e., the distances D13 between the second source/drains E25 may be equal to one another in the second region II. However, since the lower surface of the second source/drain E25 may be formed in U-shape, the distance between the second source/drains E25 may become wider in the depthwise direction. That is, the distance D13 between the second source/drains E25 may become a wider distance D13' on a deeper level.

Next, referring to FIG. 32, the first dummy gate structures 40a, 41a and 42a, and the second dummy gate structures 40b, 41b and 42b may be removed, and a third gate electrode 201 and fourth gate insulating films 130 and 140 may be formed.

Hereinafter, a semiconductor device according to one or more exemplary embodiments will be described with reference to FIGS. 45 to 49.

Figure 45:
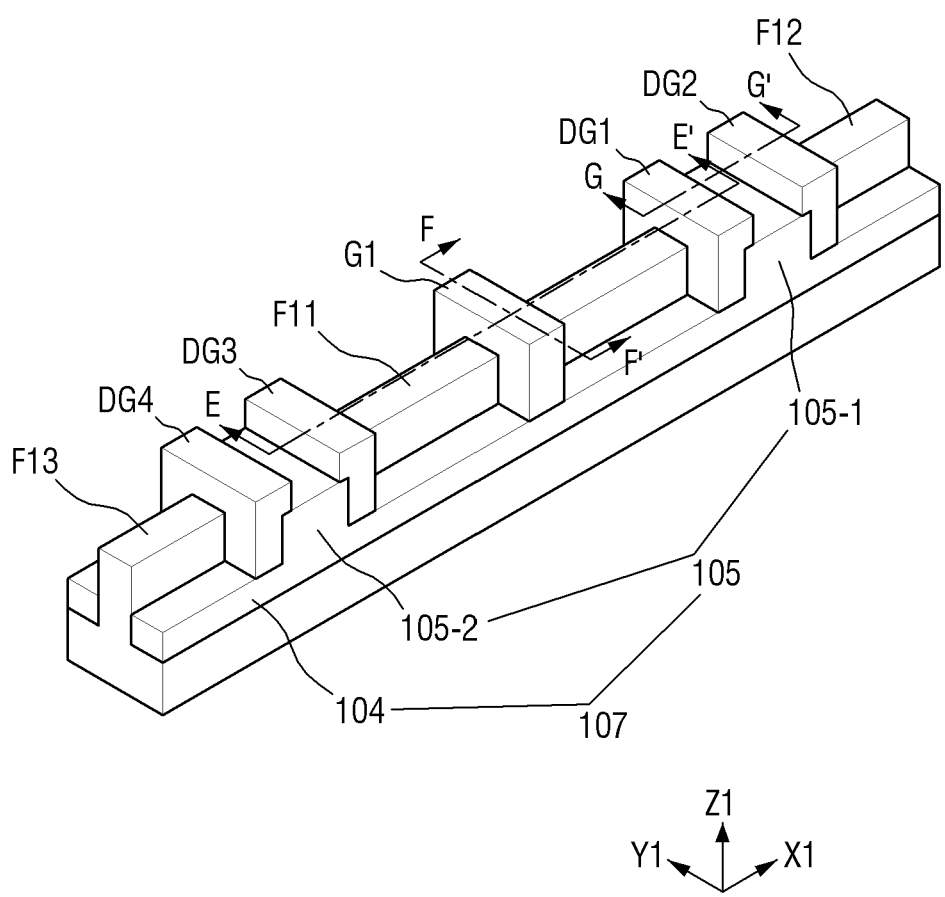
FIG. 45 is a perspective view for reference in describing a semiconductor device according to one or more exemplary embodiments.
Figure 46:
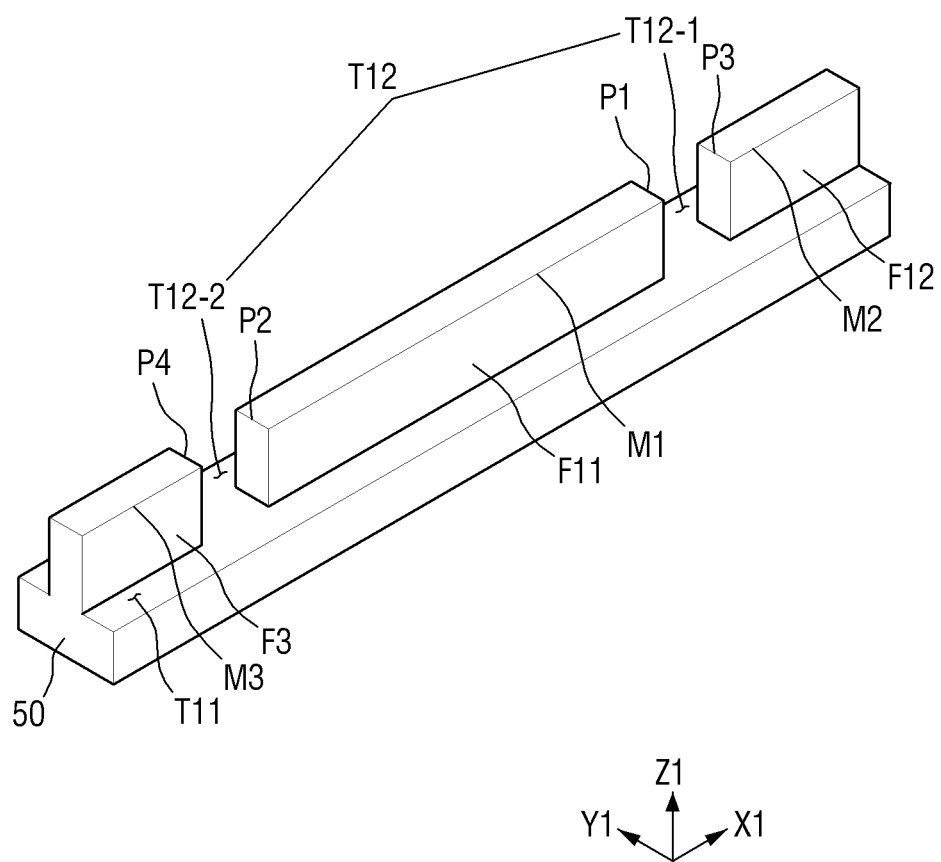
FIG. 46 is a partial perspective view for reference in describing a substrate and fin-type patterns of FIG. 45.
Figure 47:
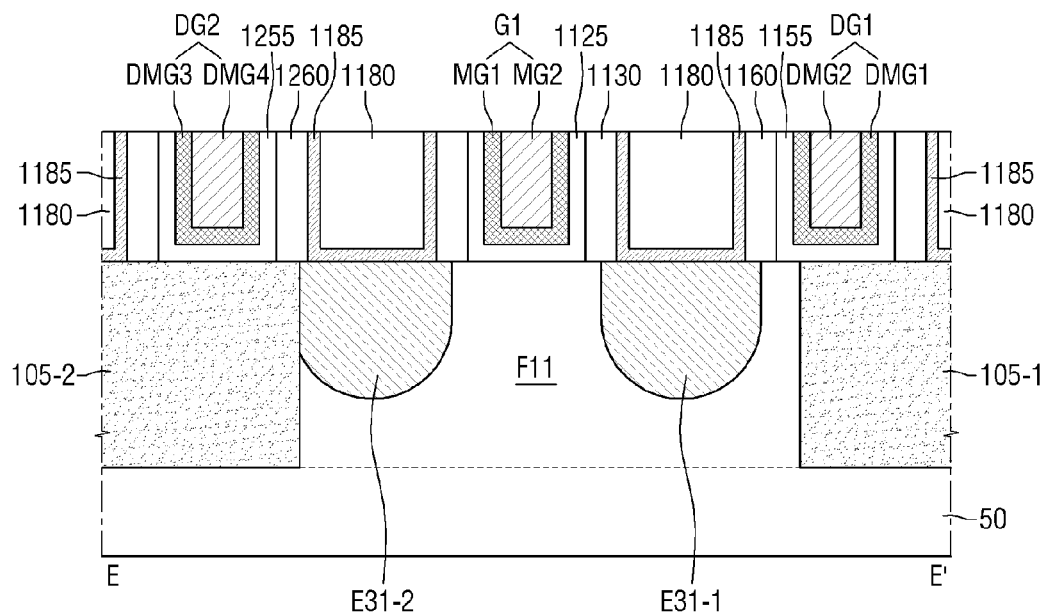
FIG. 47 is a cross sectional view taken on line E-E' of FIG. 45.
Figure 48:
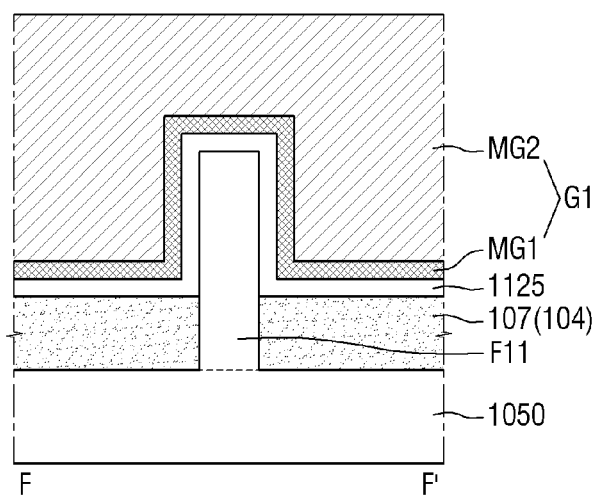
FIG. 48 is a cross sectional view taken on line F-F' of FIG. 45.
Figure 49:
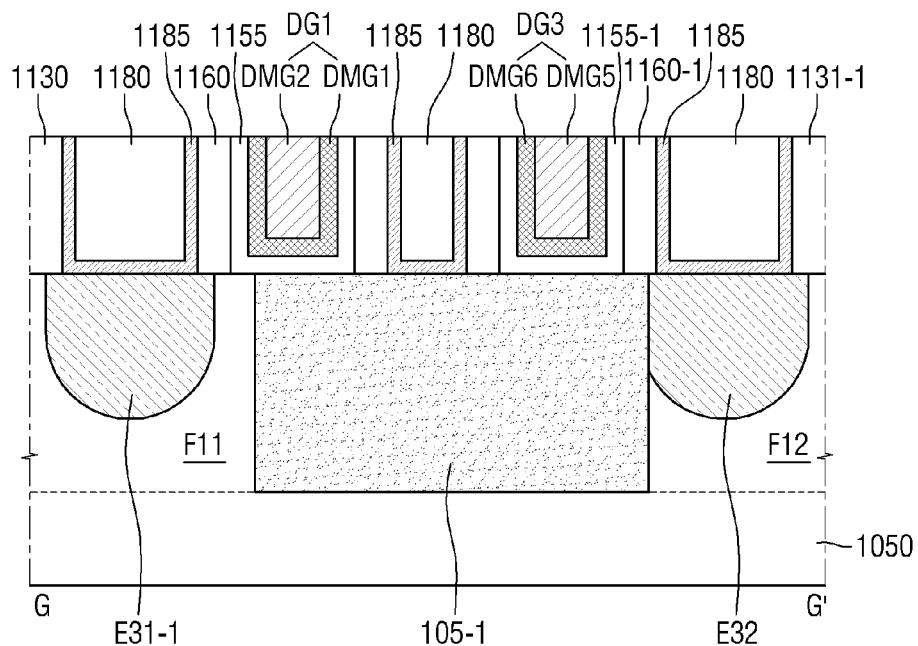
FIG. 49 is a cross sectional view taken on line G-G' of FIG. 45.

FIG. 45 is a perspective view for reference in describing a semiconductor device according to one or more exemplary embodiments, and FIG. 46 is a partial perspective view for reference in describing the substrate and fin-type patterns of FIG. 45. FIG. 47 is a cross sectional view taken on line E-E' of FIG. 45, and FIG. 48 is a cross sectional view taken on line F-F' of FIG. 45. FIG. 49 is a cross sectional view taken on line G-G' of FIG. 45.

Referring to FIGS. 45 to 49, a semiconductor device according to one or more exemplary embodiments may include a plurality of fin-type patterns F11-F13, a plurality of dummy gate electrodes DG1-DG4, a first gate electrode G1, and so on.

The plurality of fin-type patterns F11-F13 may be elongated in a first direction X1. The fin-type patterns F11-F13 may be a portion of a substrate 1050, and may include an epitaxial layer grown from the substrate 1050. As exemplified in the drawings, three fin-type patterns F11-F13 may be formed parallel to each other in a lengthwise direction, but exemplary embodiments are not limited thereto.

The first fin-type pattern F1t may include an element semiconductor material such as silicon or germanium, for example. Further, the first fin-type pattern F1t may include a compound semiconductor such as, for example, IV-IV group compound semiconductor or III-V group compound semiconductor.

In some exemplary embodiments, the first fin-type pattern F11 may be a nanowire structure having a stack of silicon and silicon germanium intersecting each other. However, in the following description, it is assumed that the first fin-type pattern F11 of a semiconductor device according to exemplary embodiments includes silicon.

As exemplified in the drawings, the fin-type patterns F11-F13 may be formed in a rectangular parallelepiped shape, but exemplary embodiments are not limited thereto. Accordingly, the fin-type patterns F11-F13 may be in a chamfered shape. That is, the fin-type patterns F11-F13 may be shaped such that the corners may be rounded. Since the fin-type patterns F11-F13 may be elongated in the first direction X1, they may include long sides M1, M2 formed in the first direction X1, and short sides P1-P4 formed in a second direction Y1. Specifically, the first fin-type pattern F1t may include a first short side P1, a second short side P2, and a first long side M1, and the second fin-type pattern F12 may include a third short side P3 and a second long side M2. The third fin-type pattern F13 may include a fourth short side P4 and a third long side M3.

As illustrated, the fin-type patterns F11-F13 may be formed such that the first short side P1 and the third short side P2 and the second short side P2 and the fourth short side P4 face each other. A person skilled in the art will be obviously able to distinguish the long sides M1-M3 and the short sides P1-P4 even when the first to third fin-type patterns F11-F13 have rounded corners.

The fin-type patterns F11-F13 refers to an active pattern used in a multi-gate transistor. Accordingly, the channels may be connected with each other along three surfaces of the fin-type patterns F11-F13, or alternatively, the channels may be formed on two facing surfaces of the fin-type patterns F11-F13.

Further, as illustrated in FIG. 47, the first trench T11 may be formed in contact with the long sides M1-M3 of the fin-type patterns F11-F13. The second trench T12 may be formed in contact with the short sides P1-P4 of the fin-type patterns F11-F13. Specifically, the first trench T11 may be formed on side surfaces of the first to third fin-type patterns F11-F13. Further, the second trench T12 may be disposed between the short side P1 of the first fin-type pattern F11 and the short side P3 of the second fin-type pattern F12 that face each other, and between the short side P2 of the first fin-type pattern F11 and the short side P4 of the third fin-type pattern F13 that face each other.

In this case, the depth of the first trench T11 and the depth of the second trench T12 may be the same, but not limited thereto. This is because the first trench T11 and the second trench T12 are formed at the same time. However, in the case where the first trench T11 and the second trench T12 are formed separately, each may have a different depth from the other.

Meanwhile, as illustrated in FIG. 45, a field insulating film 107 may be formed on the substrate 1050, and may surround at least a portion of the plurality of fin-type patterns F11-F13. The field insulating film 107 may include a first portion 104 and a second portion 105.

The first portion 104 may be elongated in the first direction X1, and the second portion 105 may be elongated in the second direction Y1. For example, such field insulating film 107 may be an oxide film, a nitride film, an oxynitride film or a film combining these.

The first portion 104 is formed in at least a portion of the first trench T11, and the second portion 105 is formed in at least a portion of the second trench T12. In other words, the first portion 104 may be formed in contact with the long sides M1-M3 of the fin-type patterns F11-F13, and the second portion 105 may be formed in contact with the short sides P1-P4 of the fin-type patterns F11-F13. That is, since the second portion 105 may be formed between a second trench T12-1 between the first fin-type pattern F1t and the second fin-type pattern F12 and a second trench T12-2 between the first fin-type pattern F1t and the third fin-type pattern F13, it 105 may be in direct contact with the sidewalls of the fin-type patterns F11-F13.

The first portion 104 may be formed in only a portion of the first trench T11. Further, the second portion 105 may entirely fill the second trench T12. As a result, an upper surface of the first portion 104 may be lower than an upper surface of the second portion 105. Specifically, the second portion 105 may include a portion 105-1 filling the second trench T12-1 and a portion 105-2 filling the second trench T12-2.

Further, a width of the second portion 105 may be wider than that of the first and second dummy gate electrodes DG1-DG4. In this case, the width includes a width in the second direction Y1.

Meanwhile, the upper surface of the second portion 105 may be formed in the same plane as the upper surface of the adjacent fin-type patterns F11-F13. The term "formed in the same plane" as used herein has the concept that includes some errors caused by the process. Accordingly, a height of the first gate electrode G1 formed on the fin-type pattern (for example, F11) and a height of the dummy gate electrode (for example, DG1) formed on the second portion 105 and the first fin-type pattern F1t may be the same as each other. That is, the dispersion in heights of a plurality of dummy gate electrodes DG1-DG4 and the first gate electrode G1 may be significantly decreased. As described above, a plurality of dummy gate electrodes DG1-DG4 and the first gate electrode G1 may be formed using polysilicon and metal, and operation characteristics of the plurality of dummy gate electrodes DG1-DG4 and the first gate electrode G1 may vary as their heights vary. That is, when the dispersion in heights of a plurality of dummy gate electrodes DG1-DG4 and the first gate electrode G1 is small, operation characteristics may also be easily controlled in a certain range.

The plurality of dummy gate electrodes DG1-DG4 and the first gate electrode G1 may be formed on the corresponding fin-type patterns F11-F13, while intersecting with the corresponding fin-type patterns F11-F13. For example, the first dummy gate electrode DG1, the third dummy gate electrode DG3, and the first gate electrode G1 may be formed on the first fin-type pattern F11, and the second dummy gate electrode DG2 may be formed on the second fin-type pattern F12. The fourth dummy gate electrode DG4 may be formed on the third fin-type pattern F13.

Specifically, the first dummy gate electrode DG1 may be disposed to overlap on the first short side P1 of the first fin-type pattern F11 and the first and second field insulating film 107, and the second dummy gate electrode DG2 may be disposed to overlap on the third short side P3 of the second fin-type pattern F12, and the first and second field insulating films 107. The third dummy gate electrode DG3 may be disposed to overlap on the third short side P3 of the second fin-type pattern F12, and the first and second field insulating films 107. The fourth dummy gate electrode DG2 may be disposed to overlap on the fourth short side P4 of the third fin-type pattern F13, and the first and second field insulating films 107.

Further, the first gate electrode G1 may be disposed to overlap on the first fin-type pattern F11 and the first portion 104. As described above, the first dummy gate electrode DG1 and the third dummy gate electrode DG3 are formed on the field insulating film 107 and the first fin-type pattern F11, and the second dummy gate electrode DG2 is formed on the field insulating film 107 and the second fin-type pattern F12. Further, the fourth dummy gate electrode DG4 is formed on the field insulating film 107 and the third fin-type pattern F13.

As illustrated in FIG. 47, a dummy gate spacer 1160 may be formed on both sides of the first dummy gate electrode DG1, and a dummy gate spacer 1260 may be formed on both sides of the second dummy gate electrode DG2.

Referring to FIG. 47, the substrate 1050 may be formed of one or more semiconductor materials selected from the group consisting of Si, Ge, SiGe, GaP, GaAs, SiC, SiGeC, InAs and InP. Further, a silicon on insulator (SOI) substrate may be used.

The first gate electrode G1 may include metal layers MG1, MG2. As illustrated, the first gate electrode G1 may include a stack of two or more metal layers MG1 and MG2. The first metal layer MG1 plays a role of adjusting a work function, and the second metal layer MG1 plays a role of filling a space defined by the first metal layer MG1. For example, the first metal layer MG1 may include at least one of TiN, TaN, TiC, and TaC. Further, the second metal layer MG2 may include W or Al. For example, the first gate electrode G1 described above may be formed by replacement process (or gate last process), but not limited thereto.

The first dummy gate electrode DG1 may have a similar structure as the first gate electrode G1. As illustrated, the first dummy gate electrode DG1 may include a stack of two or more metal layers DMG1 and DMG2. For example, the first dummy metal layer DMG1 may play a role of adjusting a work function, and the second metal layer DMG2 may play a role of filling a space defined by the first dummy metal layer DMG1. The first dummy gate electrode DG1 may include a material substantially the same as the first gate electrode G1.

The second dummy gate electrode DG2 may have a similar structure as the first gate electrode G1 and the first dummy gate electrode DG1. As illustrated, the second dummy gate electrode DG2 may include a stack of two or more metal layers DMG3 and DMG4. For example, the third dummy metal layer DMG3 may play a role of adjusting a work function, and the fourth dummy metal layer DMG4 may play a role of filling a space defined by the third dummy metal layer DMG3. The third dummy gate electrode DG3 may include a material substantially the same as the first gate electrode G1.

The first dummy gate electrode DG1 may be formed on the gate insulating film 1155. The second dummy gate electrode DG2 may be formed on the gate insulating film 1255. The first gate electrode G1 may be formed on the gate insulating film 1125. Further, the first dummy gate electrode DG1, the second dummy gate electrode DG2, and the first gate electrode G1 may include polysilicon and metal, but not limited thereto.

The gate insulating film 1125 may be formed between the first fin-type pattern F1*l* and the first gate electrode G1. As illustrated in FIG. 48, the gate insulating film 1125 may be formed on the upper surface and on the upper portion of the side surface of the first fin-type pattern F11. Further, the gate insulating film 1125 may be disposed between the first gate electrode G1 and the first portion 104.

The gate insulating film 1155 may be formed between the first fin-type pattern F1*t* and the first dummy gate electrode DG1, and between the second portion 105-1 of the field insulating film 107 and the first dummy gate electrode DG1.

The gate insulating film 1255 may be formed between the first fin-type pattern F1*t* and the second dummy gate electrode DG2, and between the second portion 105-2 of the field insulating film 107 and the second dummy gate electrode DG2.

The gate insulating films 1125, 1155 and 1255 may include silicon oxide film and a high-k dielectric material with a higher dielectric constant than silicon oxide film.

The first source/drain E31-1 and the second source/drain E31-2 may be formed on both sides of the first gate electrode G1. Specifically, the first source/drain E31-1 may be formed in a direction adjacent to the first short side P1 of the first fin-type pattern F11, and the second source/drain E31-2 may be formed in a direction adjacent to the second short side P2 of the first fin-type pattern F11.

When a transistor on the first fin-type pattern F11 is a pFET, the first source/drain E31-1 and the second source/drain E31-2 may include a compressive stress material. For example, the compressive stress material may be a material such as SiGe that has a higher lattice constant than Si. The compressive stress material can enhance carrier mobility in the channel region by exerting compressive stress on the first fin-type pattern F11.

The dummy gate spacers 1160 and 1260 may include any one of oxide, nitride film or oxynitride layer. Further, the dummy gate spacers 1160 and 1260 may be respectively formed on sidewalls of a plurality of dummy gate electrodes DG1-DG4.

The gate spacer 1130 may include any one of oxide, nitride film or oxynitride layer. Further, the gate spacer 1130 may be formed on a sidewall of the first gate electrode G1.

The first source/drain E31-1 may be formed in the recess that is formed on the first fin-type pattern F11. The first source/drain E31-1 may be spaced apart from the first short side P1 of the first fin-type pattern F11. That is, a lower surface and a side surface of the first source/drain E31-1 may be surrounded by the first fin-type pattern F11.

On the contrary, the second source/drain E31-2 may be in contact with the second short side P2 of the first fin-type pattern F11, although it is likewise formed in the recess formed on the first fin-type pattern F11. That is, a portion of the lower surface and the side surface of the second source/drain E31-2 may be surrounded by the first fin-type pattern F11, but a portion of the side surface of the second source/drain E31-2, that is, a portion of side surface that is not in contact with the first gate electrode G1 may be in contact with the second portion 105 of the field insulating film 107.

That is, the first source/drain E31-1 and the second source/drain E31-2 may have different shapes from each other. This phenomenon may be occurred by the mis-align of the first gate electrode G1, the first dummy gate electrode DG1 and the second dummy gate electrode DG2. That is, the first gate electrode G1, the first dummy gate electrode DG1 and the second dummy gate electrode DG2 may be formed at uniform spacing and intersect on the first to third fin-type patterns F11-F13. However, the first gate electrode G1, the first dummy gate electrode DG1 and the second dummy gate electrode DG2 may be shifted in a certain direction. FIG. 3 may represent the case that the first gate electrode G1, the first dummy gate electrode DG1 and the second dummy gate electrode DG2 are shifted in the second short side P2 direction.

Even in the above-mentioned example, the first gate electrode G1, the first source/drain E31-1, and the second source/drain E31-2 may work normally as a transistor. That is, the shifting margin may be ensured so as to improve yield in the process.

For example, the etch-stop film 1185 may include at least one of silicon nitride (SiN), silicon oxynitride (SiON), silicon oxide (SiO2), silicon oxycarbonitride (SiOCN), silicon carbonitride (SiCN), and a combination thereof.

An interlayer insulating film 1180 may be formed on the first source/drain E31-1, the second source/drain E31-2, and the etch-stop film 1185. Further, the interlayer insulating film 1180 may be formed to surround the first gate electrode G1, the first dummy gate electrode DG1 and the second dummy gate electrode DG2.

Referring to FIG. 49, two dummy gate electrodes, that is, the first dummy gate electrode DG1 and the third dummy gate electrode DG3 may be formed between the first short side P1 of the first fin-type pattern F11 and the second short side P2 of the second fin-type pattern F12 that face each other.

The third dummy gate electrode DG3 may have a similar structure as the first gate electrode G1 and the first dummy gate electrode DG1. As illustrated, the third dummy gate electrode DG3 may include a stack of two or more metal layers DMG5 and DMG6. For example, the fifth dummy metal layer DMG5 may play a role of adjusting a work function, and the sixth dummy metal layer DMG6 may play a role of filling a space defined by the fifth dummy metal layer DMG5. The third dummy gate electrode DG3 may include a material substantially the same as the first gate electrode G1.

The third dummy gate electrode DG3 may be formed on the gate insulating film 1155-1. The gate insulating film 1155-1 may be formed between the second portion 105-1 of the field insulating film 107 and the third dummy gate electrode DG3. The gate insulating film 1155-1 may include silicon oxide film and a high-k dielectric material with a higher dielectric constant than silicon oxide film.

The third source/drain E32 may be formed in the recess that is formed on the second fin-type pattern F12. The third source/drain E32 may be in contact with the third short side P3 of the second fin-type pattern F12. That is, a portion of the lower surface and the side surface of the third source/drain E32 may be surrounded by the second fin-type pattern F12, but a portion of the side surface of the third source/drain E32 may be in contact with the second portion 105-1 of the field insulating film 107.

Referring to FIGS. 47 and 49, a shape of the third source/drain E32 may be similar to that of the second source/drain E31-2. That is, though the first source/drain E31-1, the second source/drain E31-2, and the third source/drain E32 have different shapes of the source/drain formed on both ends of the fin-type patterns F11-F13 as the first gate electrode G1, the first dummy gate electrode DG1, the second dummy gate electrode DG2, and the third dummy gate electrode DG3 is overall shifted in one direction, a shape of the source/drain formed on one end of the any one of the fin-type pattern, and a shape of the source/drain formed on one end of the next fin-type pattern may be similar or identical. That is, as illustrated in FIGS. 47 and 49, the first source/drain E31-1 and the third source/drain E32 may be similar to each other, but a shape of the second source/drain E31-2 may be different from the first source/drain E31-1 and the third source/drain E32.

Hereinbelow, a semiconductor device according to one or more exemplary embodiments will be described with reference to FIGS. 45, 46, 48 and 60. In the following description, description overlapped with the exemplary embodiments already provided above will not be described or described as brief as possible for the sake of brevity.

Figure 50:
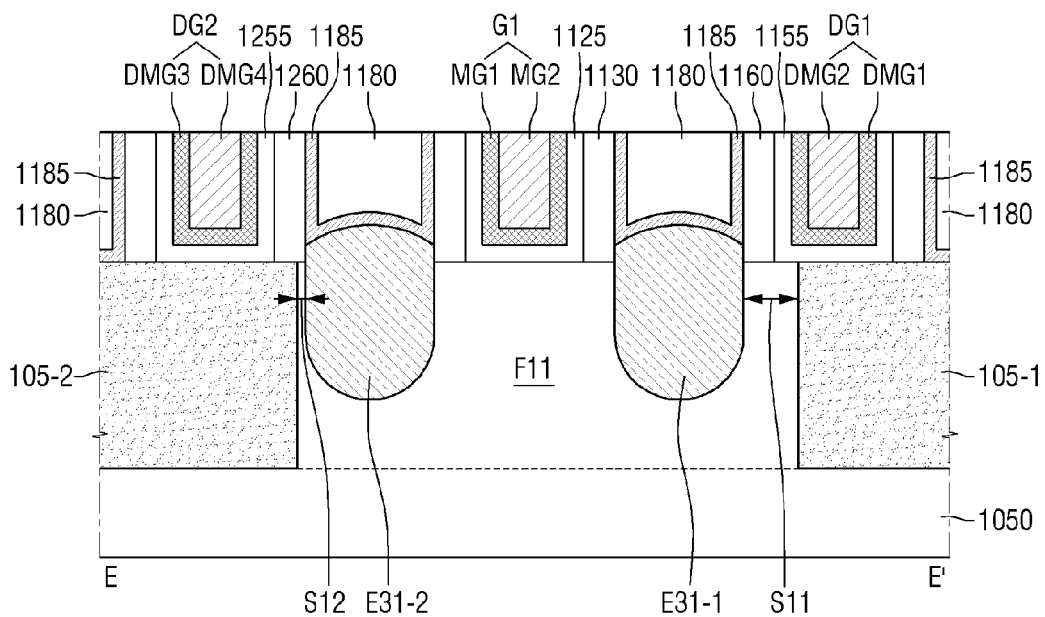
FIG. 50 is a cross sectional view for reference in describing a semiconductor device according to one or more exemplary embodiments.

FIG. 50 is a cross sectional view for reference in describing a semiconductor device according to one or more exemplary embodiments. FIG. 50 is a cross sectional view taken on line E-E' of FIG. 45.

Referring to FIG. 50, the first source/drain E31-1 may be spaced apart from the first short side P1. A lower surface and a side surface of the first source/drain E31-1 may be surrounded by the first fin-type pattern F11. Distance between the first source/drain E31-1 and the first short side P1 may include a first distance S11. Accordingly, the first source/drain E31-1 may not be in contact with the second portion 105-1 of the field insulating film 107.

The second source/drain E31-2 may be spaced apart from the second short side P2. A lower surface and a side surface of the second source/drain E31-2 may be surrounded by the first fin-type pattern F11. Distance between the second source/drain E31-2 and the second short side P2 may include a second distance S12. Accordingly, the second source/drain E31-2 may not be in contact with the second portion 105-2 of the field insulating film 107.

The first distance S11 and the second distance S12 may be different from each other. Specifically, the first distance S11 may be greater than the second distance S12. This may be because the first gate electrode G1, the first dummy gate electrode DG1 and the second dummy gate electrode DG2 are shifted in the first short side P1 direction compared to the first to third fin-type patterns F1l to F13.

When a transistor on the first fin-type pattern F11 is an nFET, the first source/drain E31-1 and the second source/drain E31-2 may be the same material as the substrate 1050 or may be a tensile stress material. For example, when the substrate 1050 is Si, the first source/drain E31-1 and the second source/drain E31-2 may be Si, or other material (e.g., SiC, Si:P, SiP) that has a lower lattice constant than Si.

The tensile stress material can enhance mobility of the carrier in the channel region by exerting tensile stress on the first fin-type pattern F11.

Hereinbelow, a semiconductor device according to one or more exemplary embodiments will be described with reference to FIGS. 51 and 52. In the following description, description overlapped with the exemplary embodiments already provided above will not be described or described as brief as possible for the sake of brevity.

Figure 51:
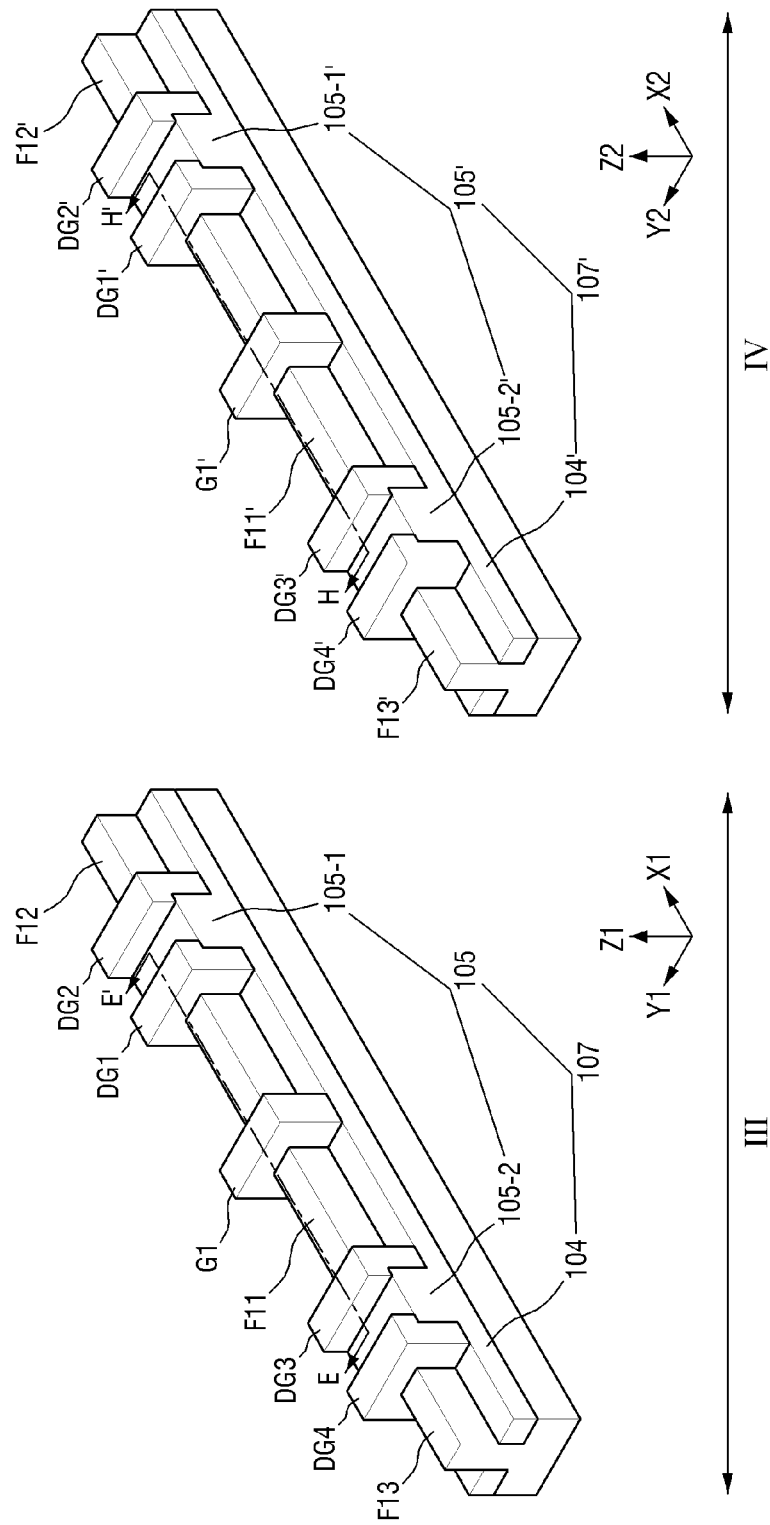
FIG. 51 is a perspective view for reference in describing a semiconductor device according to one or more exemplary embodiments.
Figure 52:
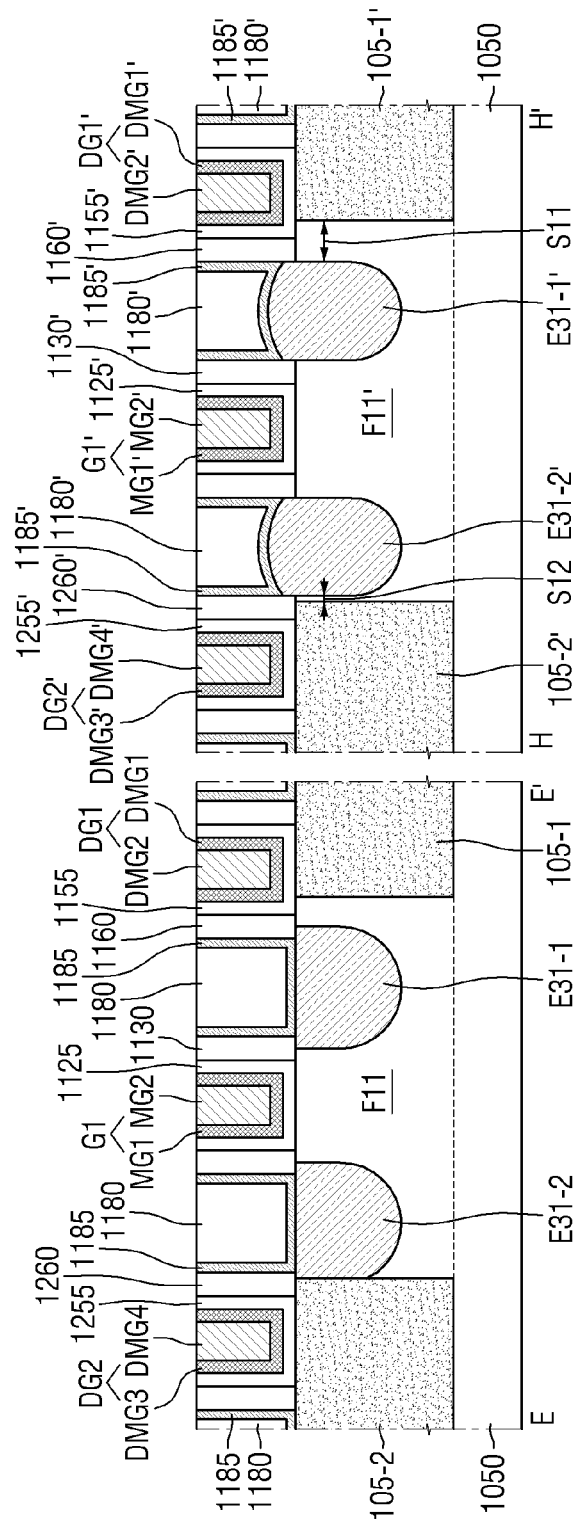
FIG. 52 shows cross sectional views taken on lines E-E' and H-H' of FIG. 51.

FIG. 51 is a perspective view for reference in describing a semiconductor device according to one or more exemplary embodiments, and FIG. 52 is a cross sectional view taken on lines E-E' and H-H' of FIG. 51.

Referring to FIGS. 51 and 52, a fourth region N may include a plurality of fin-type patterns F11'-F13', a plurality of dummy gate electrodes DG1'-DG4', a second gate electrode G1', and so on.

The plurality of fin-type patterns F11'-F13' may be elongated in a third direction X2. The fin-type patterns F11'-F13' may be a portion of a substrate 1050, and may include an epitaxial layer grown from the substrate 1050. As exemplified in the drawings, three fin-type patterns F11-F13 may be formed parallel to each other in a lengthwise direction, but exemplary embodiments are not limited thereto.

The field insulating film 107' may be formed on the substrate 1050, and may surround at least a portion of the plurality of fin-type patterns F11'-F13'. The field insulating film 107 may include a first portion 104 and a second portion 105.

The first portion 104' may be elongated in the third direction X2, and the second portion 105' may be elongated in the fourth direction Y2. For example, such field insulating film 107 may be an oxide film, a nitride film, an oxynitride film or a film combining these.

Meanwhile, the upper surface of the second portion 105' may be formed in the same plane as the upper surface of the adjacent fin-type patterns F11'-F13'. The term "formed in the same plane" as used herein has the concept that includes some errors caused by the process. Accordingly, a height of the second gate electrode G1' formed on the fin-type pattern (for example, F11) and a height of the dummy gate electrode (for example DG1') formed on the second portion 105' and the fourth fin-type pattern F11' may be the same as each other.

A lower surface and a side surface of the fourth source/drain E31-1' in the fourth region N may be surrounded by the fourth fin-type pattern F11'. Distance between the fourth source/drain E31-1' and the second portion 105-1' of the field insulating film 107' of the fourth fin-type pattern F11' may be a first distance S11. Accordingly, the fourth source/drain E31-1' may not be in contact with the second portion 105-1' of the field insulating film 107'.

The fifth source/drain E31-2' may be spaced apart from the second portion 105-2' of the field insulating film 107'. A lower surface and a side surface of the fifth source/drain E31-2' may be surrounded by the fourth fin-type pattern F11'. Distance between the fifth source/drain E31-2' and the second portion 105-1' of the field insulating film 107' may be a second distance S12. Accordingly, the fifth source/drain E31-2' may not be in contact with the second portion 105-2' of the field insulating film 107'.

The first distance S11 and the second distance S12 may be different from each other. Specifically, the first distance S11 may be greater than the second distance S12. This may be because the second gate electrode G1', the fifth dummy gate electrode DG1' and the sixth dummy gate electrode DG2' are shifted in one direction compared to the fourth to sixth fin-type patterns F11' to F13'.

When a transistor on the fourth fin-type pattern F11' is an nFET, the fourth source/drain E31-1' and the fifth source/drain E31-2' may be the same material as the substrate 1050 or may be a tensile stress material. For example, when the substrate 1050 is Si, the fourth source/drain E31-1' and the fifth source/drain E31-2' may be Si, or other material (e.g., SiC, Si:P, SiPC) that has a lower lattice constant than Si.

The tensile stress material can enhance mobility of the carrier in the channel region by exerting tensile stress on the fourth fin-type pattern F11'.

The first region I may be a region where a PMOS transistor is formed, and the fourth region IV may be a region where an NMOS transistor is formed. The first source/drain E31-1 and the second source/drain E31-2 in the third region III may be formed to overlap with the gate spacer 1130 and the dummy gate spacers 1160 and 1260.

On the contrary, the fourth source/drain E31-1' and the fifth source/drain E31-2' in the fourth region N may be not overlapped with the gate spacer 1130' and the dummy gate spacers 1160' and 1260'. That is, sidewalls of the fourth source/drain E31-1' and the fifth source/drain E31-2' may be continuous with sidewalls of the gate spacer 1130' and the dummy gate spacers 1160' and 1260'.

This is because respective recess widths may vary according to a growth control of the PMOS and the NMOS. Specifically, a width of the first source/drain E31-1 and the second source/drain E31-2 in the third region III that is a PMOS may be greater than that of the fourth source/drain E31-1' and the fifth source/drain E31-2' in the fourth region IV that is the NMOS.

The upper surfaces of the first source/drain E31-1 and the second source/drain E31-2 in the third region III may be coplanar with the upper surface of the first fin-type pattern F11. On the contrary, the fourth source/drain E31-1' and the fifth source/drain E31-2' in the fourth region IV may be formed to be higher than the upper surface of the fourth fin-type pattern F11'.

This is because, while the first source/drain E31-1 and the second source/drain E31-2 in the PMOS region comprise growth controllable SiGe to completely fill the recess, the fourth source/drain E31-1' and the fifth source/drain E31-2' in the NMOS region comprises Si:P highly doped with P such that growth control is relatively difficult. As a result, this can cause over growth of the fourth source/drain E31-1' and the fifth source/drain E31-2'.

Hereinbelow, a semiconductor device according to one or more exemplary embodiments will be described with reference to FIG. 53. In the following description, description overlapped with the exemplary embodiments already provided above will not be described or described as brief as possible for the sake of brevity.

Figure 53:
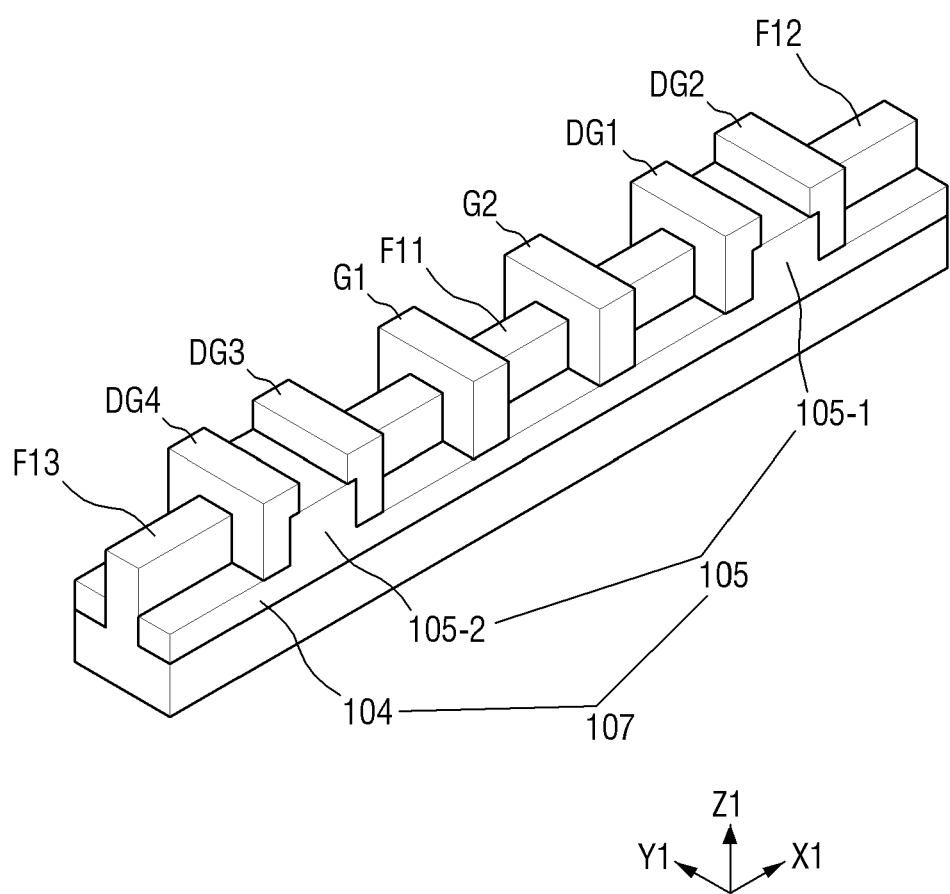
FIG. 53 is a perspective view for reference in describing a semiconductor device according to one or more exemplary embodiments.

FIG. 53 is a perspective view for reference in describing a semiconductor device according to one or more exemplary embodiments.

Referring to FIG. 53, in a semiconductor device according to one or more exemplary embodiments, two gate electrodes may be formed on the first fin-type pattern F11.

Specifically, the first gate electrode G1 and the third gate electrode G2 may be formed on the first fin-type pattern F11. Accordingly, the first gate electrode G1, the third gate electrode G2, and the first to fourth dummy gate electrodes DG1-DG4 are shifted in one direction such that shapes of the source/drains formed on both ends of the first fin-type pattern F1t may be different from each other.

Hereinbelow, a semiconductor device according to one or more exemplary embodiments will be described with reference to FIG. 54. In the following description, description overlapped with the exemplary embodiments already provided above will not be described or described as brief as possible for the sake of brevity.

Figure 54:
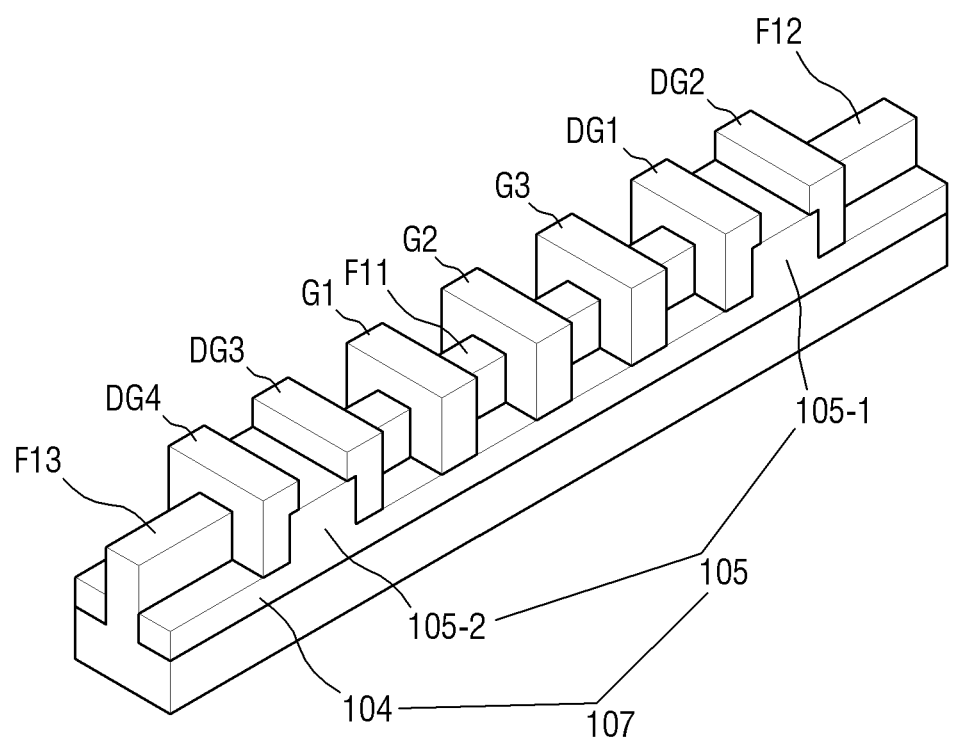
FIG. 54 is a perspective view for reference in describing a semiconductor device according to one or more exemplary embodiments.

FIG. 54 is a perspective view for reference in describing a semiconductor device according to one or more exemplary embodiments.

Referring to FIG. 54, in a semiconductor device according to one or more exemplary embodiments, three gate electrodes may be formed on the first fin-type pattern F11.

Specifically, the first gate electrode G1, the third gate electrode G2 and the fourth gate electrode G3 may be formed on the first fin-type pattern F11. Accordingly, the first gate electrode G1, the third gate electrode G2, and the first to fourth dummy gate electrodes DG1-DG4 are shifted in one direction such that shapes of the source/drains formed on both ends of the first fin-type pattern F1t may be different from each other.

Hereinbelow, a semiconductor device according to one or more exemplary embodiments will be described with reference to FIGS. 55 to 59. In the following description, description overlapped with the exemplary embodiments already provided above will not be described or described as brief as possible for the sake of brevity.

Figure 55:
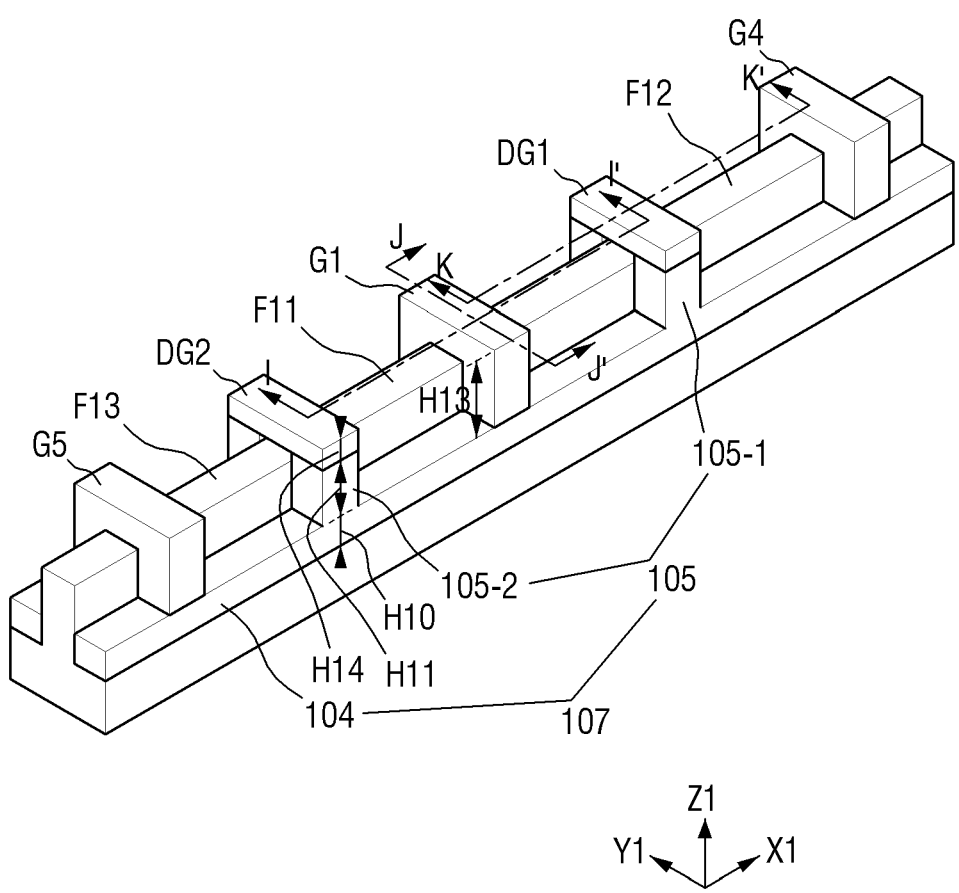
FIG. 55 is a perspective view for reference in describing a semiconductor device according to one or more exemplary embodiments.
Figure 56:
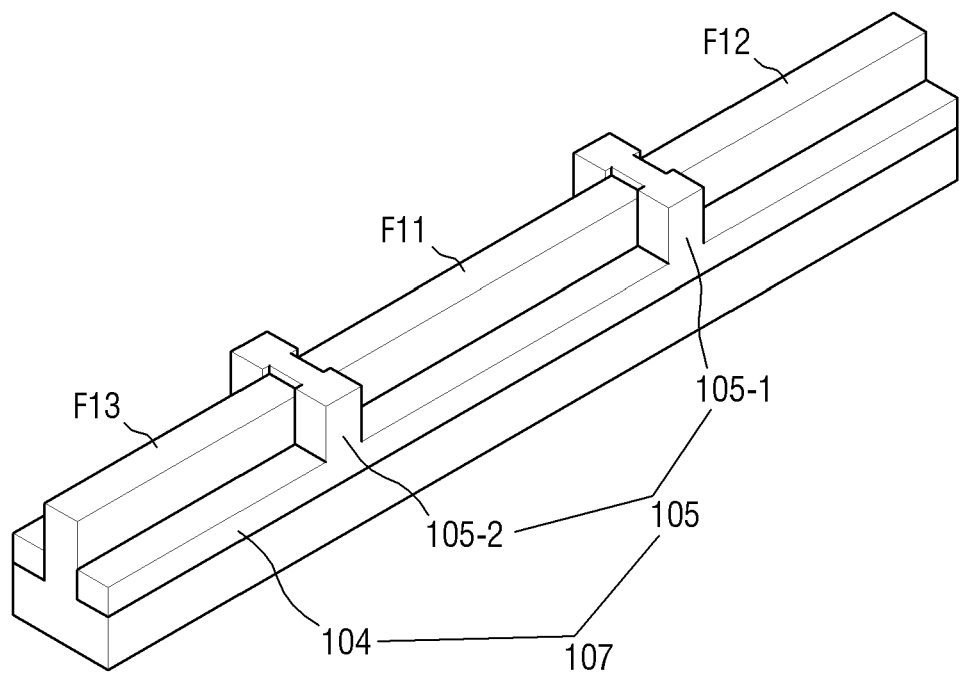
FIG. 56 is a partial perspective view for reference in describing fin-type patterns and a field insulating film of FIG. 55.
Figure 57:
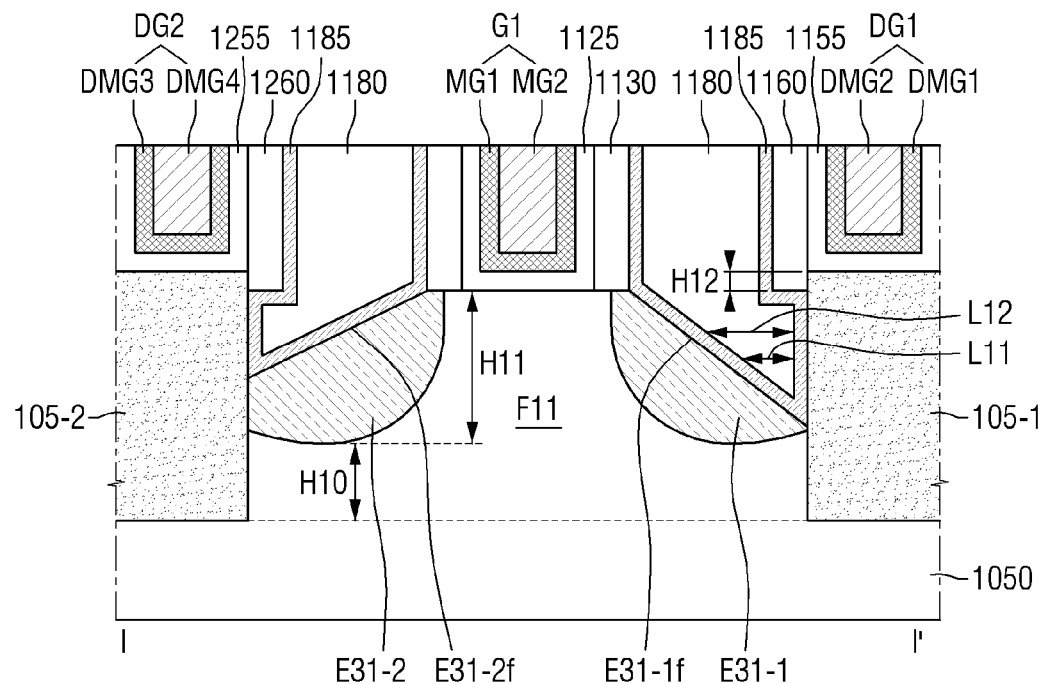
FIG. 57 is a cross sectional view taken on line I-I' of FIG. 55.
Figure 58:
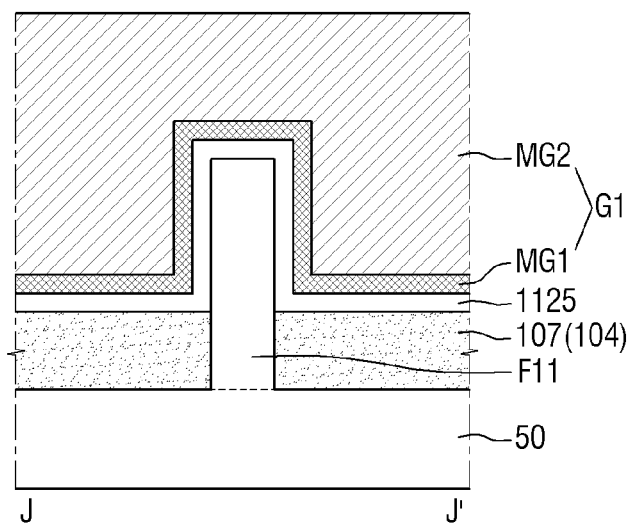
FIG. 58 is a cross sectional view taken on line J-J' of FIG. 55.
Figure 59:
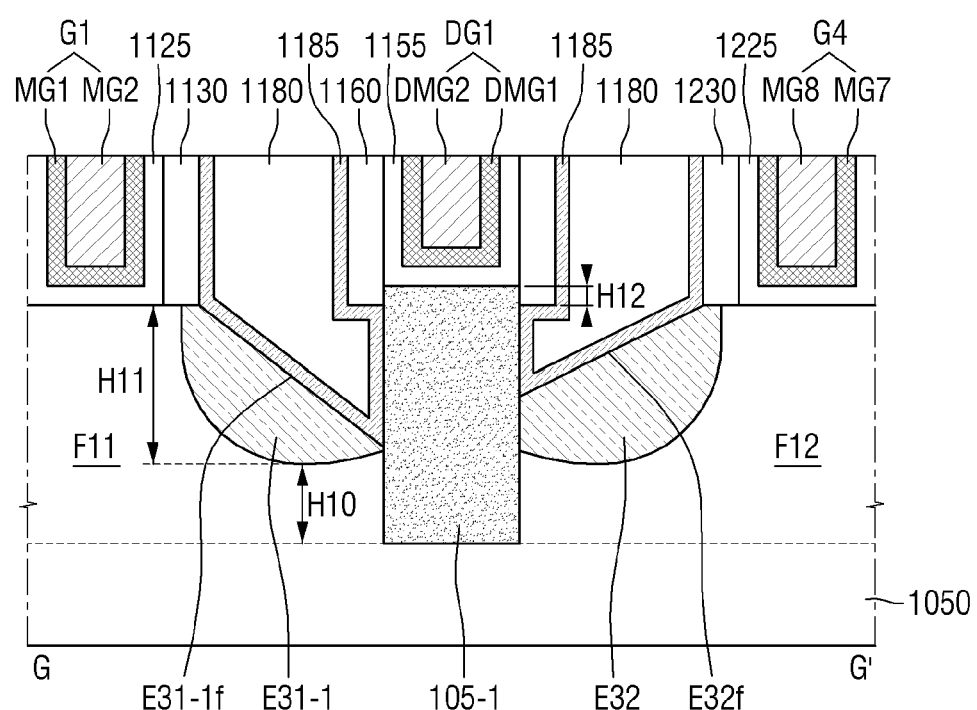
FIG. 59 is a cross sectional view taken on line K-K' of FIG. 55.

FIG. 55 is a perspective view for reference in describing a semiconductor device according to one or more exemplary embodiments, and FIG. 56 is a partial perspective view for reference in describing the fin-type patterns and the field insulating film of FIG. 55. FIG. 57 is a cross sectional view taken on line I-I' of FIG. 55, and FIG. 58 is a cross sectional view taken on line J-J' of FIG. 55. FIG. 59 is a cross sectional view taken on line K-K of FIG. 55.

Hereinbelow, referring to FIGS. 55 to 59, a semiconductor device according to one or more exemplary embodiments may include a plurality of fin-type patterns F11-F13, a plurality of dummy gate electrodes DG1, DG2, a first gate electrode G1, a fifth gate electrode G4, a six gate electrode G5, and so on.

The substrate 1050 may be, for example, a bulk silicon or a silicon-on-insulator (SOI). Alternatively, the substrate 1050 may be a silicon substrate, or may include other material such as silicon germanium, indium antimonide, lead telluride compound, indium arsenide, indium phosphide, gallium arsenide, or gallium antimonide. Alternatively, the substrate 1050 may be a base substrate having an epitaxial layer formed thereon.

The first to third fin-type patterns F11-F13 may protrude from the substrate 1050. The first to third fin-type patterns F11-F13 may be elongated in a first direction X1. As illustrated, the first to third fin-type patterns F11-F13 may be formed parallel to each other in a lengthwise direction, but exemplary embodiments are not limited thereto.

Since the first to third fin-type patterns F11-F13 may be elongated in the first direction X1, these may include long sides extended in the first direction X1, and short sides extended in a second direction Y1, respectively. A person skilled in the art will be obviously able to distinguish the long sides and the short sides even when the first to third fin-type patterns F11-F13 have rounded corners.

Further, the first to third fin-type patterns F11-F13 may be a body in a fin-type active pattern or wire-pattern shape, and the fin-type active pattern shape is illustrated in the drawings as an example.

The first to third fin-type patterns F11-F13 refers to an active pattern used in a multi-gate transistor. Accordingly, when the first to third fin-type patterns F11-F13 take a form of a fin-type active pattern, channels may be connected with each other along three surfaces of the fin or formed on two opposed surfaces of the fin. Alternatively, when the first to third fin-type patterns F11-F13 take a form of wire pattern, channel may be formed along the perimeter of the wire pattern.

The first to third fin-type patterns F11-F13 may be a portion of a substrate 1050, and may include an epitaxial layer grown from the substrate 1050. The first to third fin-type patterns F11-F13 may include, for example, an elemental semiconductor material such as silicon or germanium. Further, the first to third fin-type patterns F11-F13 may include a compound semiconductor such as IV-IV group compound semiconductor or III-V group compound semiconductor, for example.

The field insulating film 107 may be formed on the substrate 1050, and disposed around the first to third fin-type patterns F11-F13. The field insulating film 107 may be so formed as to surround a portion of the first to third fin-type patterns F11-F13. That is, the first to third fin-type patterns F11-F13 may be defined by the field insulating film 107.

Specifically, the field insulating film 107 may include a first portion 104 and a second portion 105 that have different heights from each other. The height of the first portion 104 of the field insulating film may be H10, and the height of the second portion 105 of the field insulating film may be H10+H11. That is, the upper surface of the second portion 105 of the field insulating film may protrude upward higher than an upper surface of the first portion 104 of the field insulating film. Additionally, the upper surface of the first portion 104 of the field insulating film may be lower than the upper surfaces of the first to third fin-type patterns F11 to F13.

The upper surface of the second portion 105 of the field insulating film may be higher than the upper surfaces of the first to third fin-type patterns F11 to F13. The drawings exemplify that the upper surface of the second portion 105 of the field insulating film is higher than the upper surfaces of the first to third fin-type patterns F11 to F13 by the height H12.

For example, the second portion 105 of the field insulating film may be formed in contact with the short sides of the first to third fin-type patterns F11-F13, and the first portion 104 of the field insulating may be formed in contact with the long sides of the first to third fin-type patterns F11-F13.

The second portion 105 of the field insulating film may include a second portion 105-1 of one end and a second portion 105-2 of the other end respectively formed on both sides of the first fin-type pattern F11. The second portion 105-1 of one end may be formed below the first dummy gate electrode DG1, and the second portion 105-2 of the other end may be formed below the second dummy gate electrode. The first portion 104 of the field insulating film may be formed below the first gate electrode G1. In other words, the second portion 105-1 of one end of the field insulating film may be disposed between the first fin-type pattern F11 and the second fin-type pattern F12 that face each other, and the second portion 105-2 of the other end of the field insulating film may be disposed between the first fin-type pattern F1*l* and the third fin-type pattern F13 that face each other.

Further, as illustrated in FIG. 56, the field insulating film 107 may surround ends of the first to third fin-type patterns F11-F13, but exemplary embodiments are not limited thereto. For example, the field insulating film 107 may be an oxide film, a nitride film, an oxynitride film or a film combining these.

The first dummy gate electrode DG1 extending in the second direction Y1 may be disposed on the second portion 105-1 of the corresponding field insulating film. The second dummy gate electrode DG2 extending in the second direction Y1 may be disposed on the second portion 105-2 of the corresponding field insulating film. By forming one dummy gate electrode on the second portion 105 of the field insulating film rather than forming two or more dummy gate electrodes, the layout size can be reduced.

The first portion 104 of the field insulating film and the second portion 105 of the field insulating film have different heights from each other. The height of the second portion 105 of the field insulating film may be H10+H11, and the height of the second portion 104 of the field insulating film may be H10.

The upper surface of the second portion 105 of the field insulating film may be higher than the bottom surface of the first gate electrode G1. The first gate electrode G1 may be formed along the first portion 104 of the field insulating film, and the upper surface and the sidewalls of the first fin-type pattern F11. The "bottom surface" of the first gate electrode G1 refers to the lowest portions of the bottoms of the first gate electrode G1, and referring to FIG. 11, the "bottom surface" may be the surface that is opposed to the upper surface of the first portion 104 of the field insulating film.

In other words, the height of the first dummy gate electrode DG1 and the height of the first gate electrode G1 are different from each other. The upper surface of the first dummy gate electrode DG1 and the upper surface of the first gate electrode G1 may be parallel to each other. For example, when the first dummy gate electrode DG1 and the first gate electrode G1 are fabricated through the planarization process, the upper surfaces may be in the same plane.

In a semiconductor device according to one or more exemplary embodiments, since the upper surface of the second portion 105 of the field insulating film is higher than the upper surface of the first to third fin-type patterns F11-F13, the first dummy gate electrode DG1 is formed on the second portion 105 of the field insulating film, and the first gate electrode G1 is formed on the first to third fin-type patterns F11-F13. Accordingly, in a cross sectional view, the height of the lower surface of the first dummy gate electrode DG1 is higher than the height of the first gate electrode G1.

Additionally, referring to FIG. 1, since the first gate electrode G1 is formed on the first portion 104 of the field insulating film, the first dummy gate electrode DG1 is formed on the second portion 105 of the field insulating film, and the upper surface of the second portion 105 of the field insulating film protrudes upward further than the upper surface of the first portion 104 of the field insulating film. Accordingly, the height H14 of the first dummy gate electrode DG1 is lower than the height H13 of the first gate electrode G1.

A gate spacer 1130 may be disposed on a sidewall of the first gate electrode G1 extending in the second direction Y1. For example, the gate spacer 1130 may each include at least one of silicon nitride (SiN), silicon oxynitride (SiON), silicon oxide (SiO2), silicon oxycarbonitride (SiOCN), or a combination thereof.

The first source/drain E31-1 may be disposed between the first gate electrode G1 and the second portion 105-1 of the field insulating film, and may be formed on the first fin-type pattern F11. The first source/drain E31-1 may be in contact with the second portion 105-1 of the field insulating film. The first source/drain E31-1 may include an epitaxial layer.

The first source/drain E31-1 may include a first facet E31-1f. The first facet E31-1f may be extended from the gate spacer 1130 to the second portion 105-1 of the field insulating film.

The second source/drain E31-2 may be disposed between the first gate electrode G1 and the second portion 105-2 of the field insulating film, and may be formed on the first fin-type pattern F11. The second source/drain E31-2 may be in contact with the second portion 105-2 of the field insulating film. The second source/drain E31-2 may include an epitaxial layer.

The second source/drain E31-2 may include a second facet E31-2f. The second facet E31-2f may be extended from the gate spacer 1130 to the second portion 105-2 of the field insulating film.

The slope of the first facet E31-1f may be different from the slope of the second facet E31-2f. Specifically, absolute value of the slope of the first facet E31-1f may be greater than absolute value of the slope of the second facet E31-2f. The sign of the slope of the first facet E31-1f may be different from the sign of the slope of the second facet E31-2f. That is, the first source/drain E31-1 and the second source/drain E31-2 may be asymmetrical to each other and have different shapes from each other with reference to the first gate electrode G1.

The sidewall of the second portion 105-1 of the field insulating film may include a first point that is close to the start point of the first facet E31-1f, and a second point that is farther than the first point. In this case, the distance L11 from the first point to the first facet E31-1f that is in the same level as the first point may be closer than the distance L12 from the second point to the first facet E31-1f that is in the same level as the second point.

The etch-stop film 1185 may be formed on the first source/drain E31-1 and the second source/drain E31-2. For example, the etch-stop film 1185 may be formed along the first facet E31-1f of the first source/drain, the second facet E31-2f of the second source/drain E31-2, and the sidewall of the second portion 105 of the field insulating film.

At least a portion of the bottom surface of the dummy gate spacer 1160 may be in contact with the etch-stop film 1185.

An interlayer insulating film 1180 may be formed on the first source/drain E31-1, the second source/drain E31-2, and the etch-stop film 1185. Further, the interlayer insulating film 1180 may be formed to surround the first gate electrode G1, the first dummy gate electrode DG1 and the second dummy gate electrode DG2.

Referring to FIG. 59, the first dummy gate electrode DG1 may be formed between the short side of the first fin-type pattern F1t and the short side of the second fin-type pattern F12 that face each other, and the fifth gate electrode G4 may be formed on the second fin-type pattern F12.

The fifth gate electrode G4 may include metal layers MG7 and MG8. As illustrated, the fifth gate electrode G4 may include a stack of two or more metal layers MG7 and MG8.

The seventh metal layer MG7 plays a role of adjusting a work function, and the eighth metal layer MG8 plays a role of filling a space defined by the seventh metal layer MG7.

The third source/drain E32 may be disposed between the fifth gate electrode G4 and the second portion 105-1 of the field insulating film, and may be formed on the first fin-type pattern F11. The third source/drain E32 may be in contact with the second portion 105-1 of the field insulating film. The third source/drain E32 may include an epitaxial layer.

The third source/drain E32 may include a third facet E2f. The third facet E2f may be extended from the gate spacer 1130 to the second portion 105-1 of the field insulating film.

Referring to FIGS. 57 and 59, a shape of the third source/drain E32 may be similar to that of the second source/drain E31-2. That is, though the first source/drain E31-1, the second source/drain E31-2, and the third source/drain E32 have different shapes of the source/drain formed on both ends of the fin-type patterns F11-F13 as the first gate electrode G1, the first dummy gate electrode DG1, the second dummy gate electrode DG2, and the third dummy gate electrode DG3 are overall shifted in one direction, a shape of the source/drain formed on one end of the any one of the fin-type patterns and a shape of the source/drain formed on one end of the next fin-type pattern may be similar or identical. That is, as illustrated in FIGS. 13 and 15, the first source/drain E31-1 and the third source/drain E32 may be similar to each other, but a shape of the second source/drain E31-2 may be different from the first source/drain E31-1 and the third source/drain E32.

Hereinbelow, a semiconductor device according to one or more exemplary embodiments will be described with reference to FIG. 60. In the following description, description overlapped with the exemplary embodiments already provided above will not be described or described as brief as possible for the sake of brevity.

Figure 60:
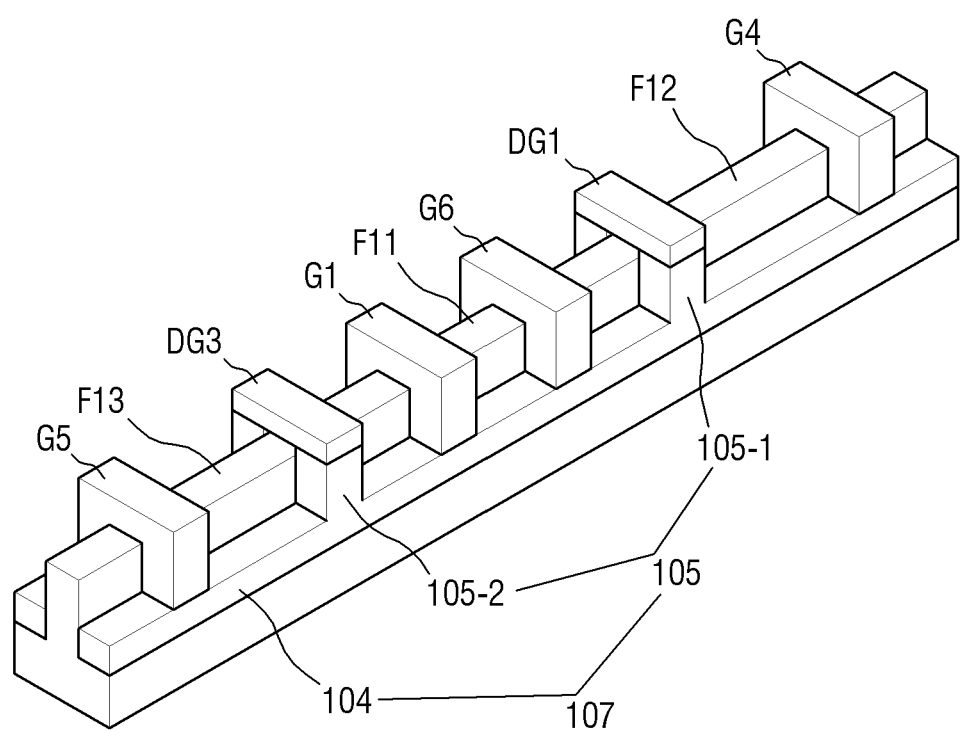
FIG. 60 is a perspective view for reference in describing a semiconductor device according to one or more exemplary embodiments.

FIG. 60 is a perspective view illustrating a semiconductor device according to one or more exemplary embodiments.

Referring to FIG. 60, in a semiconductor device according to one or more exemplary embodiments, two gate electrodes may be formed on the first fin-type pattern F11.

Specifically, the first gate electrode G1 and the seventh gate electrode G6 may be formed on the first fin-type pattern F11. Accordingly, since the first gate electrode G1, the seventh gate electrode G6, the first dummy gate electrode DG1, and the second dummy gate electrode DG2 are shifted in one direction, shapes of the source/drain formed on both ends of the first fin-type pattern F11 may be different from each other.

Hereinbelow, a semiconductor device according to one or more exemplary embodiments will be described with reference to FIG. 61. In the following description, description overlapped with the exemplary embodiments already provided above will not be described or described as brief as possible for the sake of brevity.

Figure 61:
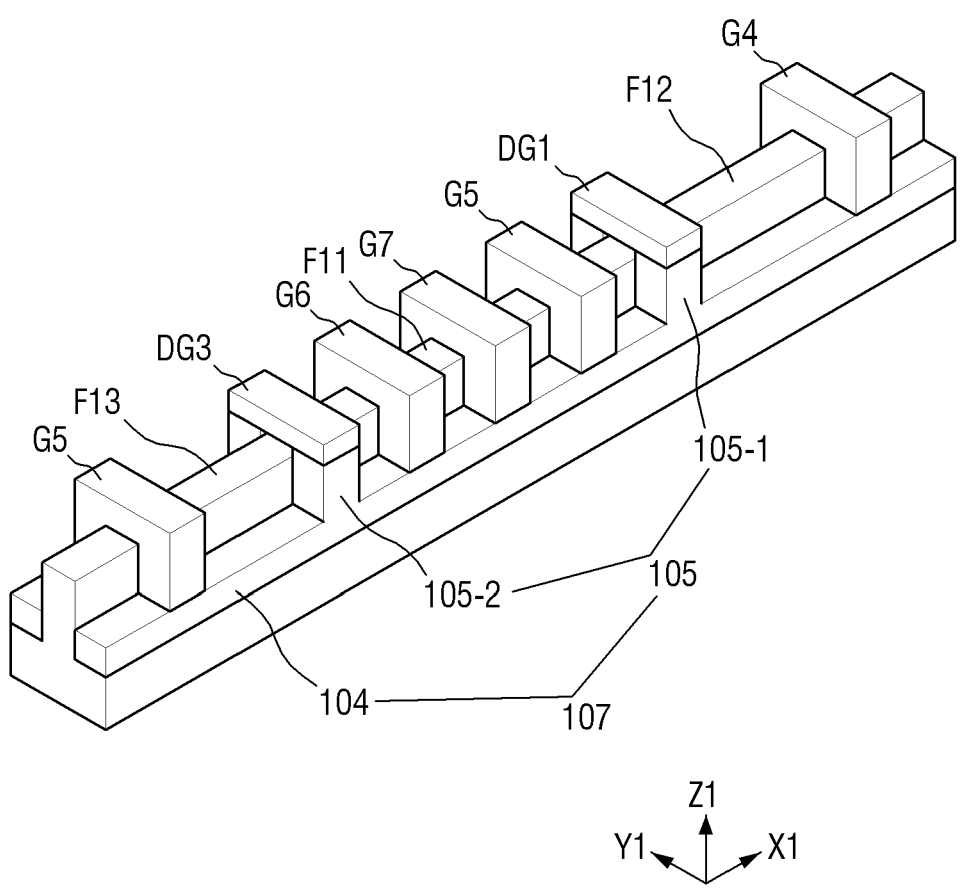
FIG. 61 is a perspective view for reference in describing a semiconductor device according to one or more exemplary embodiments.

FIG. 61 is a perspective view illustrating a semiconductor device according to one or more exemplary embodiments.

Referring to FIG. 61, in a semiconductor device according to one or more exemplary embodiments, three gate electrodes may be formed on the first fin-type pattern F11.

Specifically, the first gate electrode G1, the eighth gate electrode G7 and the seventh gate electrode G6 may be formed on the first fin-type pattern F11. Accordingly, since the first gate electrode G1, the seventh gate electrode G6, the eighth gate electrode G7, the first dummy gate electrode DG1, and the second dummy gate electrode DG2 are shifted in one direction, shapes of the source/drain formed on both ends of the first fin-type pattern F11 may be different from each other.

Hereinbelow, a semiconductor device according to one or more exemplary embodiments will be described with reference to FIG. 62. In the following description, description overlapped with the exemplary embodiments already provided above will not be described or described as brief as possible for the sake of brevity.

FIG. 62 is a perspective view illustrating a semiconductor device according to one or more exemplary embodiments.

Referring to FIG. 62, a semiconductor device according to one or more exemplary embodiments can include a third region III and a fifth region V. The third region III may be the same as the semiconductor device of the FIG. 45 described above. The fifth region V may be the same as the semiconductor device of the FIG. 55 described above.

The semiconductor device of FIG. 45 may be a double diffusion break (DDB) device in which two gate electrodes are in a gap between the fin-type patterns, and the semiconductor device of FIG. 55 may be a single diffusion break (SDB) device in which one gate electrode is in a gap between the fin-type patterns.

Figure 63:
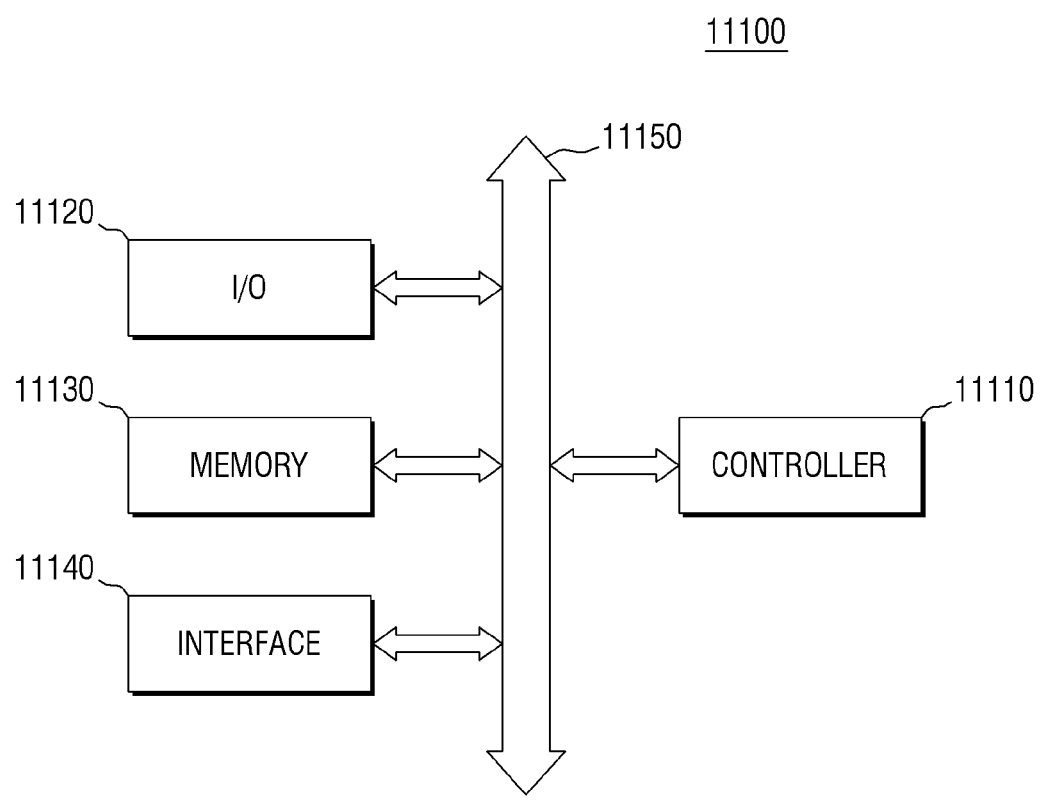
FIG. 63 is a block diagram of an electronic system comprising a semiconductor device according to one or more exemplary embodiments.

FIG. 63 is a block diagram of an electronic system comprising a semiconductor device according to one or more exemplary embodiments.

Referring to FIG. 63, the electronic system 11100 according to an exemplary embodiment may include a controller 11110, an input/output (I/O) device 11120, a memory device 11130, an interface 11140 and a bus 11150. The controller 11110, the I/O device 11120, the memory device 11130 and/or the interface 11140 may be coupled with one another via the bus 11150. The bus 11150 corresponds to a path through which data travels.

The controller 11110 may include at least one of microprocessor, digital signal processor, micro controller, or logic devices capable of performing functions similar to the functions of those mentioned above. The I/O device 11120 may include a keypad, a keyboard, a display device and so on. The memory device 11130 may store data and/or commands. The interface 11140 may perform a function of transmitting or receiving data to or from communication networks. The interface 11140 may be wired or wireless. For example, the interface 11140 may include an antenna or a wired/wireless transceiver.

Although not illustrated, the electronic system 11100 may additionally include an operation memory configured to enhance operation of the controller 11110, such as a high-speed dynamic random-access memory (DRAM) and/or a static random access memory (SRAM).

According to the exemplary embodiments described above, the semiconductor device may be provided within the memory device 11130, or provided as a part of the controller 11110, the I/O device 11120, and so on.

The electronic system 11100 is applicable to a personal digital assistant (PDA) portable computer, a web tablet, a wireless phone, a mobile phone, a digital music player, a memory card, or almost all electronic products capable of transmitting and/or receiving data in wireless environment.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device, comprising:
   a substrate comprising first and second regions;
   a first fin-type pattern and a second fin-type pattern formed in the first region, protruding from the substrate, and extending in a first direction;
   a first source/drain on the first fin-type pattern, the first source/drain having a cross section in a second direction intersecting the first direction that defines a first convex polygonal shape;
   a second source/drain on the second fin-type pattern, the second source/drain having a cross section in the second direction that defines a second convex polygonal shape that is the same as the first convex polygonal shape;
   a third fin-type pattern and a fourth fin-type pattern formed in the second region, protruding from the substrate, and extending in a third direction;
   a third source/drain on the third fin-type pattern, the third source/drain having a cross section in a fourth direction intersecting the third direction that defines a third convex polygonal shape; and
   a fourth source/drain on the fourth fin-type pattern, the fourth source/drain having a cross section in the fourth direction that defines a fourth convex polygonal shape that is different than the third convex polygonal shape.

2. The semiconductor device of claim 1, wherein the first convex polygonal shape and the second convex polygonal shape are pentagonal.

3. The semiconductor device of claim 1, wherein the first convex polygonal shape and the second convex polygonal shape are bilaterally symmetrical.

4. The semiconductor device of claim 1, wherein a set of internal angles of the third convex polygonal shape is different than a set of internal angles of the fourth convex polygonal shape.

5. The semiconductor device of claim 1, wherein lower surfaces of the first and second source/drains are lower than lower surfaces of the third and fourth source/drains.

6. The semiconductor device of claim 1, further comprising:
   a first gate electrode on the first fin-type pattern, the first gate electrode extending in the second direction, wherein the first source/drain is formed on both sides of the first gate electrode; and
   a second gate electrode on the third fin-type pattern, the second gate electrode extending in the fourth direction, wherein the third source/drain is formed on both sides of the second gate electrode,
   wherein the semiconductor device includes a plurality of first source/drains respectively on a plurality of first fin-type patterns, and a plurality of third source/drains respectively on a plurality of third fin-type patterns, and
   wherein a distance between the first source/drains is less than a distance between the third source/drains.

7. The semiconductor device of claim 6, wherein each first source/drain has a decreasing width in the first direction in a depthwise direction of the substrate,
   wherein the third source/drain has a decreasing width in the third direction in the depthwise direction of the substrate, and
   wherein a rate at which the width in the first direction of the first source/drain decrease relative to a depth of the first source/drain is different than a rate at which the width in the third direction of the third source/drain decreases relative to a depth of the third source/drain.

8. The semiconductor device of claim 7, wherein the rate at which the width in the first direction of the first source/drain decreases relative to the depth of the first source/drain is less than the rate at which the width in the third direction of the third source/drain decreases relative to the depth of the third source/drain.

9. The semiconductor device of claim 1, further comprising:
first to fourth recesses formed on the first to fourth fin-type patterns, wherein the first to fourth source/drains are formed on the first to fourth recesses, respectively,
wherein the third and fourth recesses comprise first and second dimples that are convex downward in the cross section in the first direction, respectively.

10. The semiconductor device of claim 9, comprising a convex portion that is convex upward between the first dimple and the second dimple.

11. The semiconductor device of claim 1, wherein the first and second source/drains include SiG, and the third and fourth source/drains include Si:P.

12. A semiconductor device, comprising:
a substrate comprising first and second regions;
a first fin-type pattern and a second fin-type pattern in the first region, each protruding from the substrate and extending in a first direction;
a third fin-type pattern and a fourth fin-type pattern in the second region, each protruding from the substrate and extending in a second direction;
a first gate electrode on the first and second fin-type patterns, the first gate electrode extending in a third direction intersecting the first direction;
a second gate electrode on the third and the fourth fin-type patterns, the second gate electrode extending in a fourth direction intersecting the second direction;
first source/drains formed on both sides of the first gate electrode and spaced apart from each other by a first distance;
second source/drains formed on both sides of the second gate electrode and spaced apart from each other by the first distance;
third source/drains formed on both sides of the third gate electrode and spaced apart from each other by a second distance that is different from the first distance; and
fourth source/drains formed on both sides of the fourth gate electrode and spaced apart from each other by the second distance,
wherein cross sections in the second direction of the first and second source/drains define regular shapes, and cross sections in the fourth direction of the third and fourth source/drains define irregular shapes.

13. The semiconductor device of claim 12, further comprising:
a third gate electrode on the first and second fin-type patterns, the third gate electrode extending in the third direction, and being spaced apart from the first gate electrode in the first direction; and
a fourth gate electrode on the third and fourth fin-type patterns, the fourth gate electrode extending in the fourth direction, and being spaced apart from the second gate electrode in the third direction,
wherein a distance between the first and third gate electrodes is a first distance that is equal to a distance between the second and fourth gate electrodes.

14. The semiconductor device of claim 13, wherein the substrate further comprises third and fourth regions, and the semiconductor device further comprises:
a fifth fin-type pattern in the third region, the fifth fin-type pattern protruding from the substrate and extending in a fifth direction;
a sixth fin-type pattern in the fourth region, the sixth fin-type pattern protruding from the substrate and extending in a sixth direction;
fifth and sixth gate electrodes on the fifth fin-type pattern, the fifth and sixth gate electrodes extending in a seventh direction intersecting the fifth direction, and being spaced apart from each other in the fifth direction by a second distance that is greater than the first distance,
seventh and eighth gate electrodes on the sixth fin-type pattern, the seventh and eighth gate electrodes extending in an eighth direction intersecting the sixth direction, and being spaced apart from each other by the second distance in the sixth direction,
a fifth source/drain formed between the fifth and sixth gate electrodes, and
a sixth source/drain formed between the seventh and eighth gate electrodes.

15. The semiconductor device of claim 14, wherein a difference between a height of an upper surface of the first source/drain and a height of an upper surface of the fifth source/drain is less than a difference between a height of an upper surface of the second source/drain and a height of an upper surface of the sixth source/drain.

16. A semiconductor device, comprising:
a first fin-type pattern protruding from a substrate, and comprising a first short side and a second short side in opposite directions;
a first gate electrode on the first fin-type pattern, the first gate electrode intersecting the first fin-type pattern, and comprising first and second side surfaces that are opposite each other;
a first recess formed in the first side surface of the first gate electrode, and located adjacent to the first short side of the first fin-type pattern;
a second recess formed in the second side surface of the first gate electrode, located adjacent to the second short side of the first fin-type pattern, and having a different shape than a shape of the first recess;
a first source/drain filling the first recess; and
a second source/drain filling the second recess,
wherein the first fin-type pattern, and the upper surfaces of the first and second source/drains all have the same heights as each other or different heights from each other.

17. The semiconductor device of claim 16, wherein heights of the upper surfaces of the first and second source/drains are equal to a height of an upper surface of the first fin-type pattern, and
wherein the first and second source/drains include SiGe.

18. The semiconductor device of claim 16, wherein heights of the upper surfaces of the first and second source/drains are different from a height of an upper surface of the first fin-type pattern, respectively, and
wherein the first and second source/drains include Si:P.

19. The semiconductor device of claim 16, wherein the upper surface of the first source/drain comprises a first facet, and
the upper surface of the second source/drain comprises a second facet having a different slope than a slope of the first facet.

20. The semiconductor device of claim 19, wherein signs of the slope of the first facet and the slope of the second facet are opposite to each other relative to a surface of the substrate.

* * * * *